(12) United States Patent
Nam

(10) Patent No.: US 9,053,978 B2
(45) Date of Patent: Jun. 9, 2015

(54) ERASE SYSTEM AND METHOD OF NONVOLATILE MEMORY DEVICE

(75) Inventor: Sang-Wan Nam, Hwaseong-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 348 days.

(21) Appl. No.: 13/478,569

(22) Filed: May 23, 2012

(65) Prior Publication Data

US 2013/0016561 A1  Jan. 17, 2013

(30) Foreign Application Priority Data

Jul. 12, 2011  (KR) .................. 10-2011-0068825

(51) Int. Cl.
*G11C 16/04* (2006.01)
*H01L 27/115* (2006.01)
*G11C 16/16* (2006.01)
*G11C 16/34* (2006.01)

(52) U.S. Cl.
CPC .......... *H01L 27/11582* (2013.01); *G11C 16/16* (2013.01); *G11C 16/3445* (2013.01); *H01L 27/11524* (2013.01); *H01L 27/11556* (2013.01); *H01L 27/1157* (2013.01)

(58) Field of Classification Search
CPC ..... G11C 16/16; G11C 16/3445; G11C 16/28
USPC ............. 365/185.29, 185.18, 189.15, 185.22, 365/185.17
See application file for complete search history.

(56) References Cited

U.S. PATENT DOCUMENTS

| 5,978,270 | A | * | 11/1999 | Tanaka et al. ............ 365/185.22 |
| 6,064,593 | A | * | 5/2000 | Matsubara et al. ...... 365/185.11 |
| 7,224,618 | B2 | * | 5/2007 | Matsuoka ................ 365/185.29 |
| 7,558,122 | B2 | * | 7/2009 | Kim et al. ................ 365/185.33 |
| 2009/0040832 | A1 | * | 2/2009 | Park ......................... 365/185.19 |
| 2010/0306582 | A1 | | 12/2010 | Han et al. |
| 2012/0051138 | A1 | * | 3/2012 | Kim et al. ................ 365/185.17 |
| 2012/0195123 | A1 | * | 8/2012 | Lee .......................... 365/185.12 |
| 2014/0226407 | A1 | * | 8/2014 | Izumi ....................... 365/185.17 |
| 2014/0269079 | A1 | * | 9/2014 | Kamigaichi ............. 365/185.17 |

FOREIGN PATENT DOCUMENTS

| JP | 2007-066386 | 3/2007 |
| KR | 10-0296324 | 9/2001 |
| KR | 10-1015655 | 2/2011 |

* cited by examiner

*Primary Examiner* — Tuan T Nguyen
(74) *Attorney, Agent, or Firm* — Ellsworth IP Group PLLC

(57) ABSTRACT

An erase system and method of a nonvolatile memory device includes supplying an erase voltage to a plurality of memory cells of a nonvolatile memory, performing a read operation with a read voltage to word lines of the plurality of memory cells, and performing an erase verification operation with an erase verification voltage to at least one of the word lines of the plurality of memory cells, the erase verification voltage lower than the read voltage.

15 Claims, 64 Drawing Sheets

| | S111 | S113 | S115 |
|---|---|---|---|
| BL | Float | VBL1(VCC) | Normal; VBL2(VCC) |
| | | | Off; VBL3(VSS) |
| Selected SSL | Float or VSSL1 | VSSL2(On) | VSSL4(On) |
| Unselected SSL | | VSSL3(Off) | VSSL5(Off) |
| WL | Vwe1(VSS) | VH1(Vread) | VFY1 |
| GSL | Float or VGSL1 | VGSL2(On) | VGSL3(On) |
| CSL | Float | VCSL1(VSS) | VCSL2(VSS) |
| Substrate | Vers1 | VSUB1(VSS) | VSUB2(VSS) |

Fig. 21

|  | S411 | S413 |
|---|---|---|
| BL | Float | VBL4(VCC) |
| Selected SSL | Float or VSSL6 | VSSL7(On) |
| Unselected SSL |  | VSSL8(Off) |
| WL | Vwe2(VSS) | VFY2 |
| GSL | Float or VGSL4 | VGSL5(On) |
| CSL | Float | VCSL3(VSS) |
| Substrate | Vers2 | VSUB3(VSS) |

Fig. 29

|  | S111 | S113 | S115 |
|---|---|---|---|
| BL | Float | VBL1(VCC) | Normal; VBL2(VCC) |
|  |  |  | Off; VBL3(VSS) |
| Selected SSL | Float or VSSL1 | VSSL2(On) | VSSL4(On) |
| Unselected SSL |  | VSSL3(Off) | VSSL5(Off) |
| Selected WL | Vwe1(VSS) | VH1(Vread) | VFY1 |
| DWL | Float or VDWL1 | VDWL2 | VDWL3 |
| Unselected WL | Float or VWL1 | VH1(Vread) | VH2(Vread) |
| GSL | Float or VGSL1 | VGSL2(On) | VGSL3(On) |
| CSL | Float | VCSL1(VSS) | VCSL2(VSS) |
| Substrate | Vers1 | VSUB1(VSS) | VSUB2(VSS) |

Fig. 30

|  | S411 | S413 |
|---|---|---|
| BL | Float | VBL4(VCC) |
| Selected SSL | Float or VSSL6 | VSSL7(On) |
| Unselected SSL | | VSSL8(Off) |
| Selected WL | Vwe2(VSS) | VFY2 |
| DWL | Float or VDWL4 | VDWL5 |
| Unselected WL | Float or VWL2 | VWL3(Vread) |
| GSL | Float or VGSL4 | VGSL5(On) |
| CSL | Float | VCSL3(VSS) |
| Substrate | Vers2 | VSUB3(VSS) |

Fig. 47
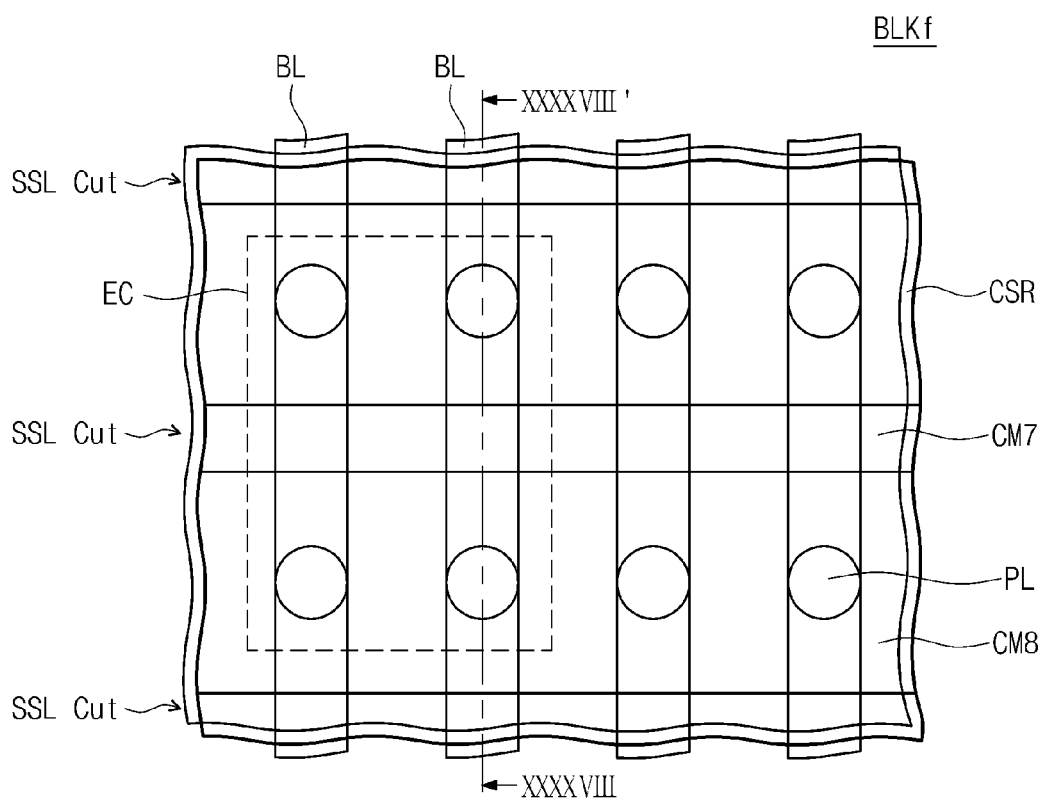
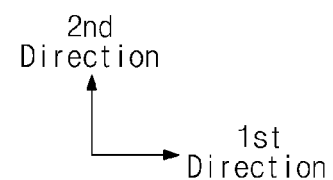

ERASE SYSTEM AND METHOD OF NONVOLATILE MEMORY DEVICE

CROSS-REFERENCE TO RELATED APPLICATIONS

This application claims the benefits of priority, under 35 U.S.C §119, from Korean Patent Application No. 10-2011-0068825 filed Jul. 12, 2011, the entirety of which is incorporated by reference herein.

BACKGROUND

1. Field

Exemplary embodiments relate to a semiconductor memory device, and more particularly, relate to a nonvolatile memory device, an erase method thereof, an operating method thereof, a memory system including the nonvolatile memory device, and an operating method of the memory system.

2. Description of the Related Art

A semiconductor memory device is a memory device which is fabricated using semiconductors such as silicon (Si), germanium (Ge), gallium arsenide (GaAs), indium phosphide (InP), and the like. Semiconductor memory devices are classified into volatile memory devices and nonvolatile memory devices.

The volatile memory devices may lose stored contents at power-off. The volatile memory devices include a static RAM (SRAM), a dynamic RAM (DRAM), a synchronous DRAM (SDRAM), and the like. The nonvolatile memory devices may retain stored contents even at power-off. The nonvolatile memory devices include a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), and the like. The flash memory device is roughly divided into a NOR type and a NAND type.

In recent, a semiconductor memory device with a three-dimensional array structure has been developed to improve the integrity of the semiconductor memory device.

SUMMARY

The present general inventive concept provides a nonvolatile memory device, an erase method thereof, a memory system including the nonvolatile memory device, an electronic apparatus having the nonvolatile memory device, and an operating method of the memory system and the electronic apparatus having the nonvolatile memory device.

Additional aspects and advantages of the present general inventive concept will be set forth in part in the description which follows and, in part, will be obvious from the description, or may be learned by practice of the general inventive concept.

The foregoing and/or other features and utilities of the present general inventive concept may be achieved by providing an erase method of a nonvolatile memory device, the erase method including supplying an erase voltage to a plurality of memory cells, performing a read operation with a read voltage to word lines of the plurality of memory cells, and performing an erase verification operation with an erase verification voltage to at least one of the word lines of the plurality of memory cells, the erase verification voltage lower than the read voltage.

The read voltage may include one or more levels of voltages to be applied to the respective word lines.

The read voltage may include a single level of a voltage to be applied to the word lines.

The erase verification voltage may be variable with respect to a corresponding one of the word lines of the plurality of memory cells, and the variable erase verification voltage may be lower than the read voltage.

The read voltage may be higher than a voltage of a threshold voltage of a program state of the plurality of memory cells.

The plurality of memory cells may include at least one dummy cell and one or more regular memory cells. The at least one dummy cell may be supplied with a voltage different from an operating voltage which is supplied to the regular memory cells, in the reading operation and the erase verification operation.

The foregoing and/or other features and utilities of the present general inventive concept may also be achieved by providing an erase method of a nonvolatile memory device, the erase method including supplying an erase voltage to a plurality of strings each having a plurality of memory cells, performing a read operation with a read voltage to word lines of the plurality of memory cells, determining one or more stings as an off string according to the preformed read operation, processing an erase verification pass on the off string, and performing an erase verification operation with an erase verification voltage to the word lines of the plurality of strings.

The erase method may further include supplying a modified erase voltage to the plurality of strings according to the performed erase verification operation.

The plurality of memory cells may be determined as an off string and a non off string according to the read operation, and the erase verification operation may include preventing a bitline pre-charging operation from being performed on the off string.

The erase method may further include supplying different voltages to bit lines of the off string and the non off string as pre-charging voltage, and supplying the erase verification voltage to the respective word lines of the plurality of memory cells in the erase verification operation.

The plurality of memory cells may include at least one dummy cell and one or more regular memory cells, and the at least one dummy cell may be supplied with a voltage different from an operating voltage which is supplied to the regular memory cells, in the reading operation and the erase verification operation.

The foregoing and/or other features and utilities of the present general inventive concept may also be achieved by providing a nonvolatile memory device, including a memory cell array having a substrate and a plurality of blocks each having a plurality of strings each having a plurality of memory cells, the plurality of strings formed on the substrate in a direction perpendicular to the substrate, a control unit to perform a read operation with a voltage to word lines of the plurality of strings, and a page buffer unit to store information on one or more off strings among the plurality strings determined by the read operation. The control unit may perform an erase verification operation with an erase verification voltage to at least one of the word lines of the plurality of memory cells, and the erase verification voltage may be lower than the read voltage.

The plurality of strings each have the plurality of memory cells having different dimensions, and the adjacent strings may be spaced apart from each other by a gap.

The control unit may determine a first off string among the strings according to the reading operation and determines a second off string according to the erase verification operation, and the control unit performs an erase operation with a modified erase voltage on the first and second off strings.

The control unit may perform the erase verification operation on a non-off string after performing an erase operation with a first erase voltage on the strings including the off string and the non-off string.

The control unit may perform another erase operation with a modified erase voltage on the off string according to the erase verification operation.

The control unit may control another erase operation to be performed on the selected string according to the performed erase verification, when the selected string is determined as an off string representing an erase failed string.

The foregoing and/or other features and utilities of the present general inventive concept may also be achieved by providing an operating method of a memory system, the method including generating a command from a controller to perform an erase operation on a nonvolatile memory device having a memory cell array having a substrate and a plurality of strings each having a plurality of memory cells, the plurality of strings formed on the substrate in a direction perpendicular to the substrate, and performing the erase operation in the nonvolatile memory device according to the generated command, the erase operation including performing an erase operation on the plurality of strings, performing a read operation with a read voltage to word lines of the plurality of memory cells, determining one or more strings as an off string according to the performed read operation, processing an erase verification pass on the off string, and performing an erase verification operation with an erase verification voltage to the word lines of the plurality of strings, the erase verification voltage lower than the read voltage.

The processing the erase verification operation may include preventing the erase verification operation from performing on the off string of the first determination.

The operating method may further include performing a second erase operation with a second erase voltage on the off strings of the first determination and the second determination.

The reading operation may not be performed between the erase operation and the erase verification operation.

The erase verification operation may not be performed on the determined off string.

The operating method may further include transmitting a first response signal on the erase operation from the nonvolatile memory device to the controller, generating a second command from the controller to control the nonvolatile memory device to perform a second erase operation, and transmitting a second response signal on the second erase operation from the nonvolatile memory device such that the controller performs an error process to determine a bad block according to the first response signal and the second response signal.

The operating method may further include transmitting information on the off string to the controller upon completion of the erase operation such that the controller updates previous information with the transmitted information.

The operating method may further include transmitting information on the off string to the controller; transmitting a read command to the nonvolatile memory device to perform a second read operation of reading data from the strings, and correcting an error according to the read data and information on the off string information.

The operating method may further include generating a command to the nonvolatile memory device to perform a pre-read operation, receiving information on a second off string from the nonvolatile memory device according to the pre-read operation, and controlling the nonvolatile memory device to store the information on the second off string in a buffer area of the nonvolatile memory device.

The operating method may further include generating a second command to the nonvolatile memory device to output the stored off string information to the controller, receiving second information of the off string according to the erasing operation, and updating information according to the second off string information and the off string information.

The operating method may further include selecting a string selection line connected a predetermined number of the strings to perform the reading operation on the predetermined number of the strings of the selected string selection line until the selected string selection line is determined as a last string selection line of the strings.

The plurality of strings may be divided into a plurality of groups so as to be connected to a plurality of string selection lines, the erase operation may include selecting a first one of the plurality of string selection lines, and the read operation and the erase verification operation are performed with respect to the strings connected with the selected string selection line.

The operating method may further include iterating the performing the read operation and the detecting the off strings until a last string selection line of a plurality of string selection lines is selected, the plurality of string selection lines each connected to the corresponding strings and being selected sequentially.

The iterating may include selecting a second string selection line of a plurality of string selection liens; performing the read operation by applying a high voltage to word lines of the strings connected to the second selection line, and determining one or more second strings as the off string according to the performed read operation.

The foregoing and/or other features and utilities of the present general inventive concept may also be achieved by providing a memory system including a nonvolatile memory device comprising a memory cell array having a substrate and a plurality of strings each having a plurality of memory cells, the plurality of strings formed on the substrate in a direction perpendicular to the substrate, and a controller to generate a command to perform an erase operation on the nonvolatile memory device, such that the nonvolatile memory device erases the plurality of strings, performs a read operation with a read voltage to word lines of the plurality of memory cells, determines one or more strings as an off string according to the performed read operation, processes an erase verification pass on the off string, and performs an erase verification operation with an erase verification voltage to word lines of the plurality of strings, the erase verification voltage lower than the read voltage.

The strings may be spaced apart from each other by a gap in which a channel film unit is formed to connect the memory cells of the string, and the channel film unit has a defect to cause the off string.

The nonvolatile memory device may include a channel film unit connected to the adjacent strings, and the off string is formed with the channel film unit which has no electrical contact with the substrate.

The nonvolatile memory device may include a drain and a channel film unit connected to the string, and the off string is formed with the channel film unit which has no electrical contact with the substrate.

The nonvolatile memory device may prevent the erase verification operation from performing on the off string of the first determination.

The foregoing and/or other features and utilities of the present general inventive concept may also be achieved by providing a memory system including a nonvolatile memory device, and a controller configured to control the nonvolatile memory device. The nonvolatile memory device may include a memory cell array including a plurality of strings, each string having a plurality of memory cells, a read/write unit configured to perform a read operation and to output a read result, in response to a command sent from the controller, the read operation being made by applying a high voltage to word lines connected with the plurality of strings, a counting unit configured to receive the output read result and to count the number of off strings read to be off at the read operation, and a data input/output circuit configured to output the read result or the count result as information associated with off strings. The controller may be configured to control the nonvolatile memory device based upon information associated with the off strings.

The nonvolatile memory device may include a substrate, and the plurality of strings may be disposed on the substrate in a direction perpendicular to the substrate and divided into a plurality of groups of strings, the groups connected to a plurality of string selection lines, the controller controls the nonvolatile memory device to perform an erase operation on the strings of the groups of the plurality of string selection lines. The controller may control the nonvolatile memory device to process one or more off strings as erase-passed and to perform an erase verification operation on other strings in the unit of each group.

The adjacent strings may be spaced apart from each other by a pillar having a channel film electrically connected to the memory cells of each string.

The pillar may have a width being wider according to distance from the substrate.

The pillar may have a width being wider according to distance from the substrate The memory cells of each string may have a length being shorter according to a distance from the substrate.

The foregoing and/or other features and utilities of the present general inventive concept may also be achieved by providing an operating method of a memory system which includes a nonvolatile memory device including a plurality of strings and a controller configured to control the nonvolatile memory device, each string including a plurality of memory cells, the operating method including sending a command to the nonvolatile memory device from the controller, performing a read operation of the nonvolatile memory device in response to the command, the read operating being made by applying a high voltage to all word lines connected with the plurality of strings, sending information associated with off strings read to be off at the read operation to the controller from the nonvolatile memory device, and storing the sent information in the controller.

The operating method may further include sending the stored information associated with the off strings and an erase command to the nonvolatile memory device from the controller, and performing an erase operation of the nonvolatile memory device in response to the stored information associated with the off strings and the erase command.

When a result of the erase operation indicates an erase fail, the sending a command, the performing a read operation, the sending information, and the storing the sent information may be performed again.

The operating method may further include sending a read command to the nonvolatile memory device from the controller, sending a read result according to the read command to the controller from the nonvolatile memory device, and correcting an error of the sent read result using the stored information associated with the off strings, the correcting being made by the controller.

The operating method may further include generating a code word using write data and the stored information associated with the off strings, the generating being made by the controller, sending the generated code word and a write command to the nonvolatile memory device from the controller, and writing the sent code word in the nonvolatile memory device in response to the write command.

The operating method may further include sending the stored information associated with the off strings and a second command to the nonvolatile memory device from the controller, and writing the sent information associated with the off strings in the nonvolatile memory device in response to the second command.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 21 is a diagram illustrating a voltage condition usable in the erase method of FIG. 20.

FIG. 29 is a diagram illustrating voltages supplied to a memory block when memory cells are erased according to a method described with reference to FIGS. 8 to 13.

FIG. 30 is a diagram illustrating voltages supplied to a memory block when memory cells are erased according to a method described with reference to FIGS. 20 and 21.

FIG. 47 is a plane view illustrating one of memory blocks of FIG. 2 according to an exemplary embodiment of the inventive concept.

DETAILED DESCRIPTION OF THE PREFERRED EMBODIMENTS

Figure 1:
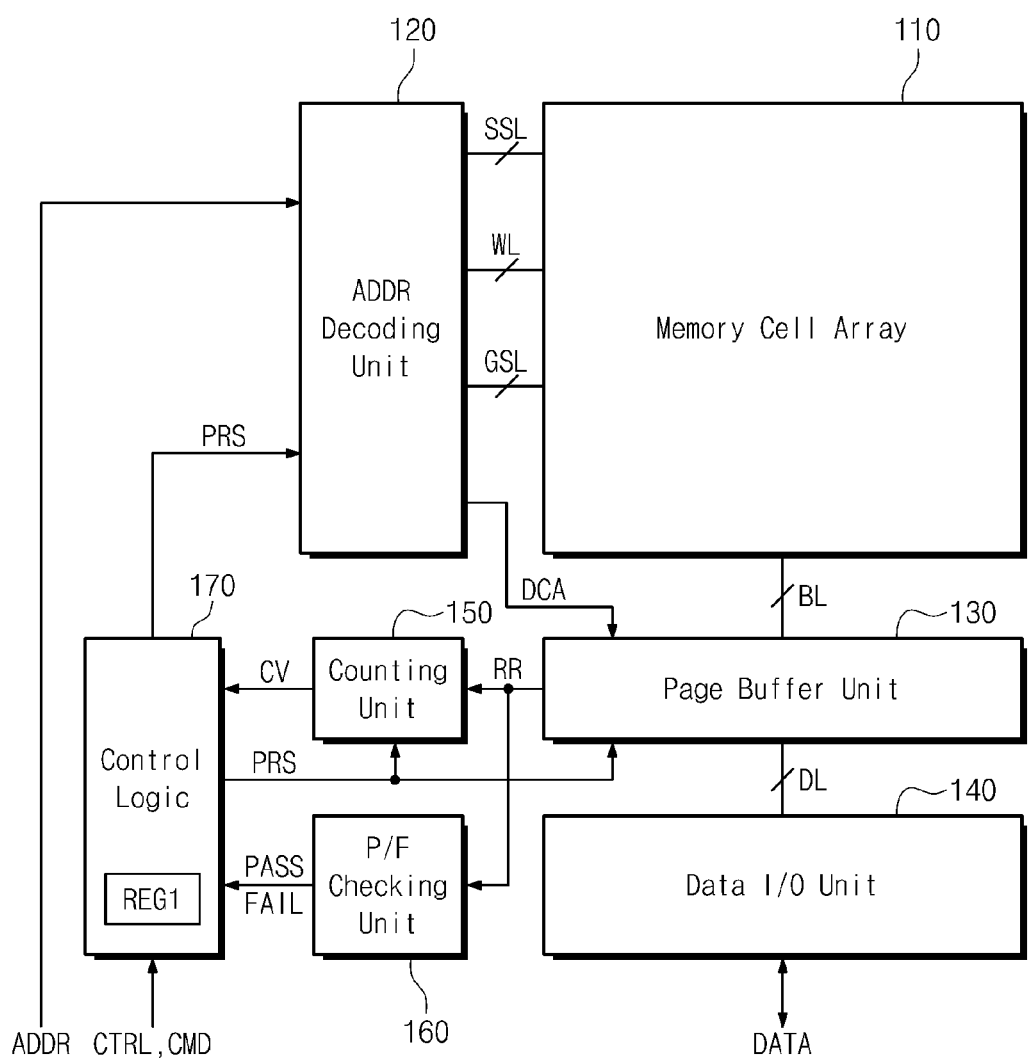
FIG. 1 is a block diagram illustrating a nonvolatile memory device according to an exemplary embodiment of the inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

The term "selected bit line" or "selected bit lines" may be used to indicate a bit line or bit lines, connected with a cell transistor to be programmed or read, among a plurality of bit lines. The term "unselected bit line" or "unselected bit lines" may be used to indicate a bit line or bit lines, connected with a cell transistor to be program-inhibited or read-inhibited, among a plurality of bit lines.

The term "selected string selection line" may be used to indicate a string selection line connected with a cell string, which includes a cell transistor to be programmed or read, among a plurality of string selection lines. The term "unselected string selection line" or "unselected string selection lines" may be used to indicate a remaining string selection line or remaining string selection lines other than the selected string selection line among a plurality of string selection lines. The term "selected string selection transistors" may be used to indicate string selection transistors connected with a selected string selection line. The term "unselected string selection transistors" may be used to indicate string selection transistors connected with an unselected string selection line or unselected string selection lines.

The term "selected ground selection line" may be used to indicate a ground selection line connected with a cell string, which includes a cell transistor to be programmed or read, among a plurality of ground selection lines. The term "unselected ground selection line" may be used to indicate a remaining ground selection line or remaining ground selection lines other than the selected ground selection line among a plurality of ground selection lines. The term "selected ground selection transistors" may be used to indicate ground selection transistors connected with a selected ground selection line. The term "unselected ground selection transistors" may be used to indicate ground selection transistors connected with an unselected ground selection line or unselected ground selection lines.

The term "unselected word line" may be used to indicate a word line, connected with a cell transistor to be programmed or read, among a plurality of word lines. The term "unselected word line" or "unselected word lines" may be used to indicate a remaining word lines or remaining word lines other than a selected word line among a plurality of word lines.

The term "selected memory cell" or "selected memory cells" may be used to designate memory cells to be programmed or read among a plurality of memory cells. The term "unselected memory cell" or "unselected memory cells" may be used to indicate a remaining memory cell or remaining memory cells other than a selected memory cell or selected memory cells among a plurality of memory cells.

Exemplary embodiments of the inventive concept will be described with reference to a NAND flash memory. However, the inventive concept is not limited thereto. The inventive concept may be applied to nonvolatile memory devices such as an Electrically Erasable and Programmable ROM (EEPROM), a NOR flash memory, a Phase-change RAM (PRAM), a Magnetic RAM (MRAM), a Resistive RAM (RRAM), a Ferroelectric RAM (FRAM), etc.

FIG. 1 is a block diagram illustrating a nonvolatile memory device 100 according to an exemplary embodiment of the inventive concept. Referring to FIG. 1, the nonvolatile memory device 100 may include a memory cell array 110, an address decoding unit 120, a page buffer unit 130, a data input/output (I/O) unit 140, a counting unit 150, a pass/fail (P/F) checking unit 160, and control logic 170. The address decoding unit 120, page buffer unit 130, data input/output unit 140, counting unit 150, pass/fail checking unit 160, and control logic 170 may be referred to as a control unit to control the memory cell array 110.

The memory cell array 100 may include a plurality of memory units having a plurality of memory cells. The plurality of memory units may be a plurality of cell strings which are arranged on a substrate in a row direction and a column direction. Each cell string may include a plurality of memory cells stacked along a direction perpendicular to the substrate. That is, memory cells may be provided on the substrate along rows and columns, and may be stacked in a direction perpendicular to the substrate to form a three-dimensional structure. The memory cell array 110 may include plural memory cells which store one or more bits of data, respectively.

The address decoding unit 120 may be coupled with the memory cell array 110 via word lines WL, string selection lines SSL, and ground selection lines GSL. The address decoding unit 120 may be configured to operate responsive to the control of the control logic 170. The address decoding unit 120 may receive an input address ADDR from an external device.

The address decoding unit 120 may be configured to decode a row address of the input address ADDR. The address decoding unit 120 may be configured to select a word line corresponding to the decoded row address among the word lines WL. The address decoding unit 120 may be configured to select a string selection line and a ground selection line corresponding to the decoded row address among the string selection lines SSL and the ground selection lines GSL.

The address decoding unit 120 may be configured to decode a column address among the input address ADDR. The address decoding unit 120 may transfer the decoded column address DCA to the page buffer unit 130.

The address decoding unit 120 may be configured to receive a pre-read signal PRS from the control logic 170. When the pre-read signal PRS is activated, the address decoding unit 120 may supply voltages for pre-reading to the string selection lines SSL, the word lines WL, and the ground selection lines GSL.

The address decoding unit 120 may supply voltages for erasing, writing, and reading to the string selection lines SSL, the word lines WL, and the ground selection lines GSL according to the control of the control logic 170.

In this embodiment, although not illustrated in FIG. 1, the address decoding unit 120 may include a row decoder configured to decode a row address, a column decoder configured to decode a column address, an address buffer configured to store the input address ADDR, and the like.

The page buffer unit 130 may be coupled with the memory cell array 110 via the bit lines BL. The page buffer unit 130 may operate responsive to the control of the control logic 170. The page buffer unit 130 may receive the decoded column address DCA from the address decoding unit 120. The page buffer unit 130 may select the bit lines BL in response to the decoded column address DCA.

The page buffer unit 130 may perform read and write operations with the address decoding unit 120. Reading and writing on the memory cell array 110 may be made by controlling the string selection lines SSL, the word lines WL, and the ground selection lines GSL via the address decoding unit 120 and controlling the bit lines BL via the page buffer unit 130.

The page buffer unit 130 may include latches (not illustrated) corresponding to the bit lines BL, respectively. Data to be written in the memory cell array 110 may be loaded onto the latches of the page buffer unit 130. Data read from the memory cell array 110 may be stored in the latches of the page buffer unit 130.

The page buffer unit 130 may receive data via data lines DL. The input data in the page buffer unit 130 may be written in the memory cell array 110. The page buffer unit 130 may read data from the memory cell array 110 to output the read data to the data input/output unit 140 via the data lines DL. The page buffer unit 130 may store data read out from a first storage area of the memory cell array 110. The data stored in the page buffer unit 130 may be written in a second storage area thereof. That is, a copy-back operation may be performed.

The page buffer unit 130 may output the read data as a read result RR. For example, the page buffer unit 130 may output the read data at an erase verification operation or read data at a write verification operation as a read result RR.

The page buffer unit 130 may be configured to receive the pre-read signal PRS from the control logic 170. When the pre-read signal PRS is activated, the page buffer unit 130 may perform pre-reading with the address decoding unit 120. Data read at the pre-reading may be output as the read result RR.

The data input/output unit 140 may be connected with the page buffer unit 130 via the data lines DL. The data input/output unit 140 may be configured to exchange data with an external device. The data input/output unit 140 may output data transferred from the page buffer unit 130 via the data lines DL to the external device. The data input/output unit 140 may transfer data input from the external device to the page buffer unit 130 via the data lines DL.

The counting unit 150 may be configured to receive the read result RR from the page buffer unit 130 and to receive the pre-read signal PRS from the control logic 170. When the pre-read signal PRS is activated, the counting unit 150 may be configured to count based on the read result RR to generate a count value CV to be sent to the control logic 170.

The pass/fail counting unit 160 may be configured to receive the read result RR from the page buffer unit 130. At the erase verification operation or the write verification operation, the pass/fail counting unit 160 may be configured to output a pass signal PASS or a fail signal FAIL based upon the read result RR.

The control logic 170 may be configured to control an overall operation of the nonvolatile memory device 100. The control logic 170 may be configured to generate the pre-read signal PRS. The control logic 170 may receive the count value CV from the counting unit 150 and the pass or fail signal PASS or FAIL from the pass/fail checking unit 160. The control logic 170 may compare the count value CV with a value stored in a register REG1 to control the erase operation according to a comparison result between the count value CV and the value stored in the register REG1. The control logic 170 may control an erase operation in response to the pass or fail signal PASS or FAIL input from the pass/fail checking unit 160.

The control logic 170 may operate according to control signals CTRL and a command CMD input from the external device.

Figure 2:
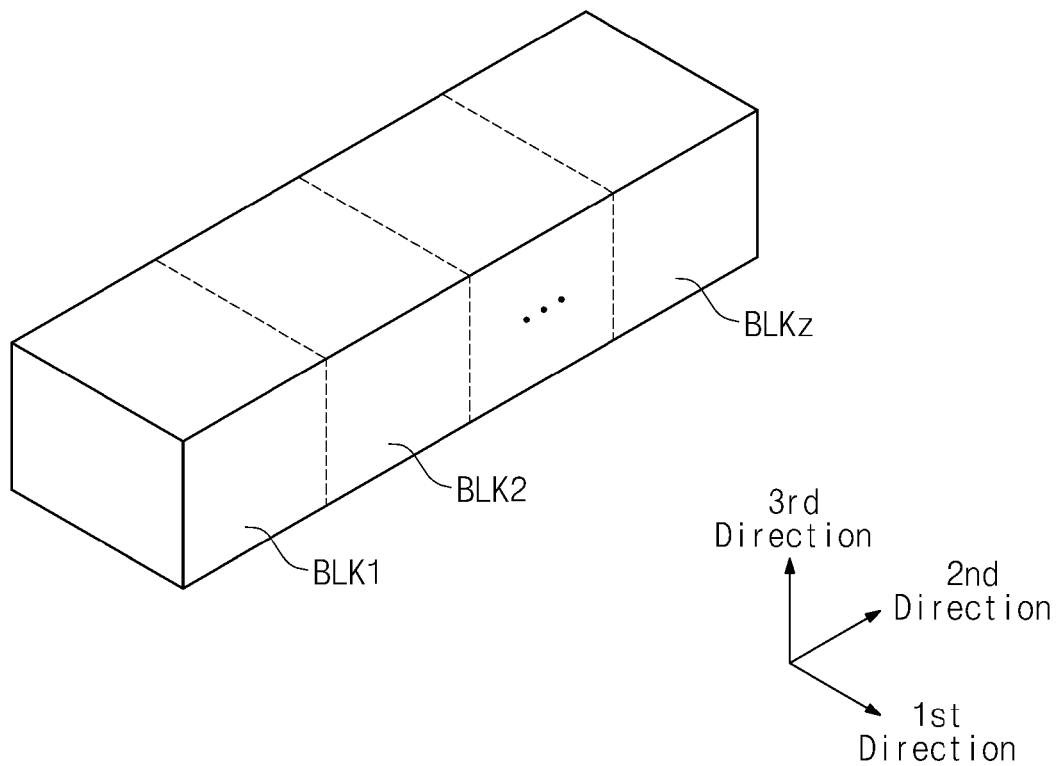
FIG. 2 is a diagram illustrating a memory cell array of the nonvolatile memory device of FIG. 1 according to an exemplary embodiment of the inventive concept.

FIG. 2 is a diagram illustrating the memory cell array 110 of FIG. 1 according to an exemplary embodiment of the inventive concept. Referring to FIGS. 1 and 2, the memory cell array 110 may include a plurality of memory blocks BLK1 to BLKz, each of which is formed to have a three-dimensional structure (or, a vertical structure). For example, each of the memory blocks BLK1 to BLKz may include structures extending along a first direction to a third direction. Although not illustrated in FIG. 2, each of the memory blocks BLK1 to BLKz may include a plurality of cell strings extending along a second direction. Although not illustrated in FIG. 2, a plurality of cell strings may be spaced apart from one other along the first and third directions.

Cell strings within one memory block may be coupled with a plurality of bit lines BL, a plurality of string selection lines SSL, a plurality of word lines WL, one or more ground selection lines GSL, and a common source line (not shown). Cell strings in the plurality of memory blocks BLK1 to BLKz may share a plurality of bit lines. For example, the plurality of bit lines may extend along the second direction so as to be shared by the plurality of memory blocks BLK1 to BLKz.

The plurality of memory blocks BLK1 to BLKz may be selected by the address decoding unit 120 of FIG. 1. For example, the address decoding unit 120 may be configured to select a memory block corresponding to an input address ADDR among the plurality of memory blocks BLK1 to BLKz. Erasing, programming, and reading may be made at a selected memory block. The plurality of memory blocks BLK1 to BLKz will be more fully described with reference to FIGS. 3 to 6.

Figure 3:
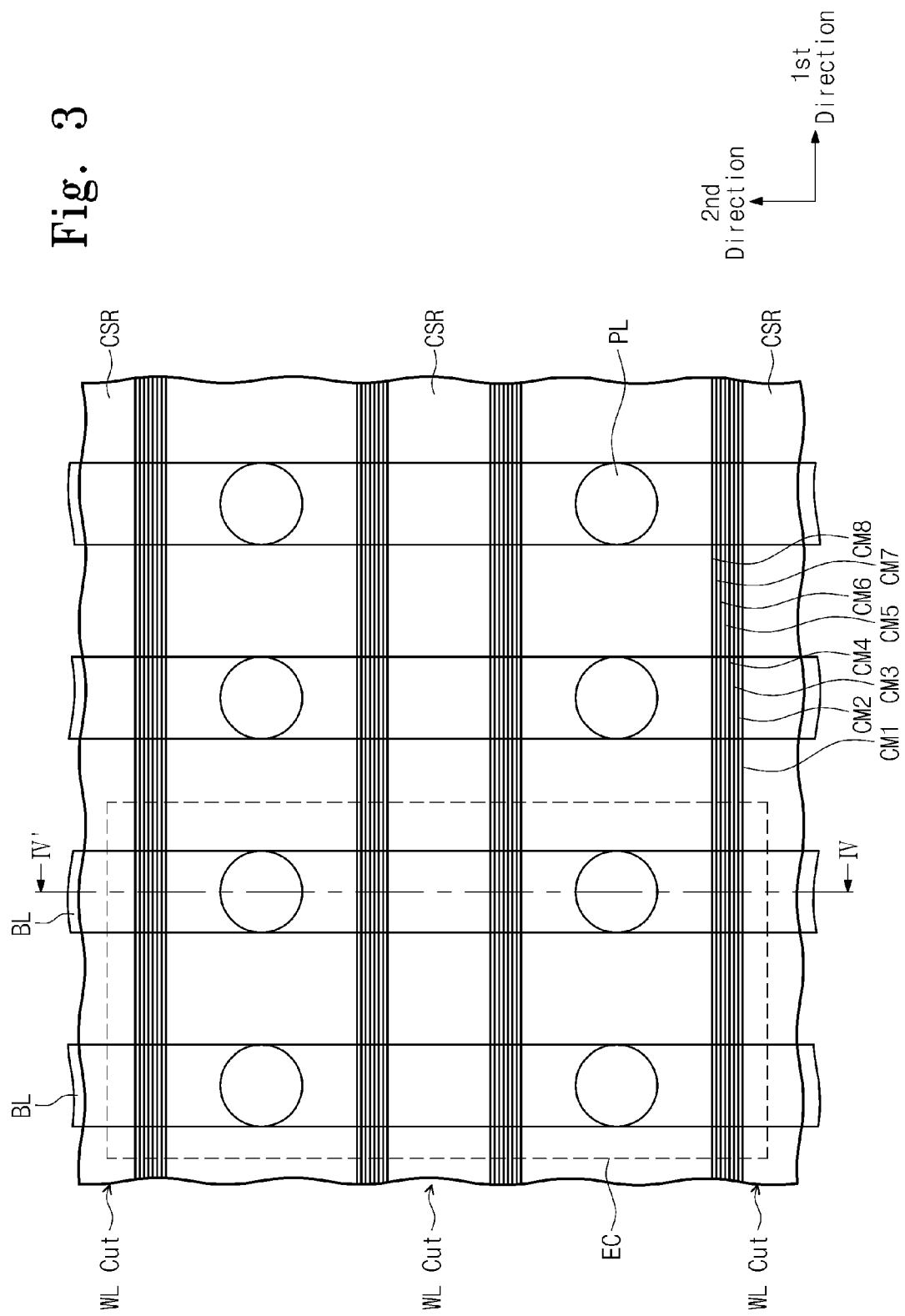
FIG. 3 is a plane diagram of one of memory blocks of the nonvolatile memory device of FIG. 1 according to an exemplary embodiment of the inventive concept.
Figure 4:
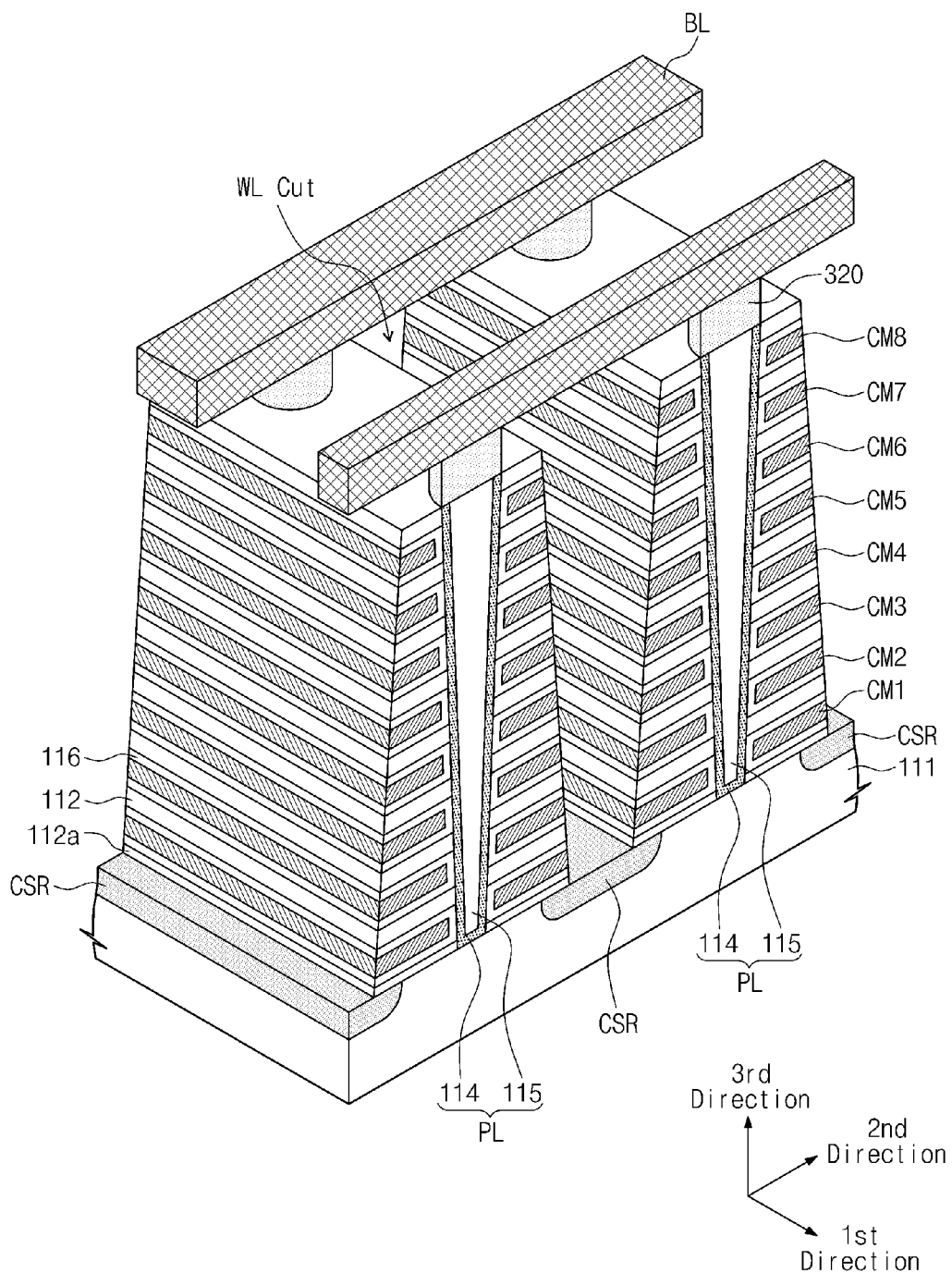
FIG. 4 is a perspective view taken along a line IV-IV' of FIG. 3 according to an exemplary embodiment of the inventive concept.
Figure 5:
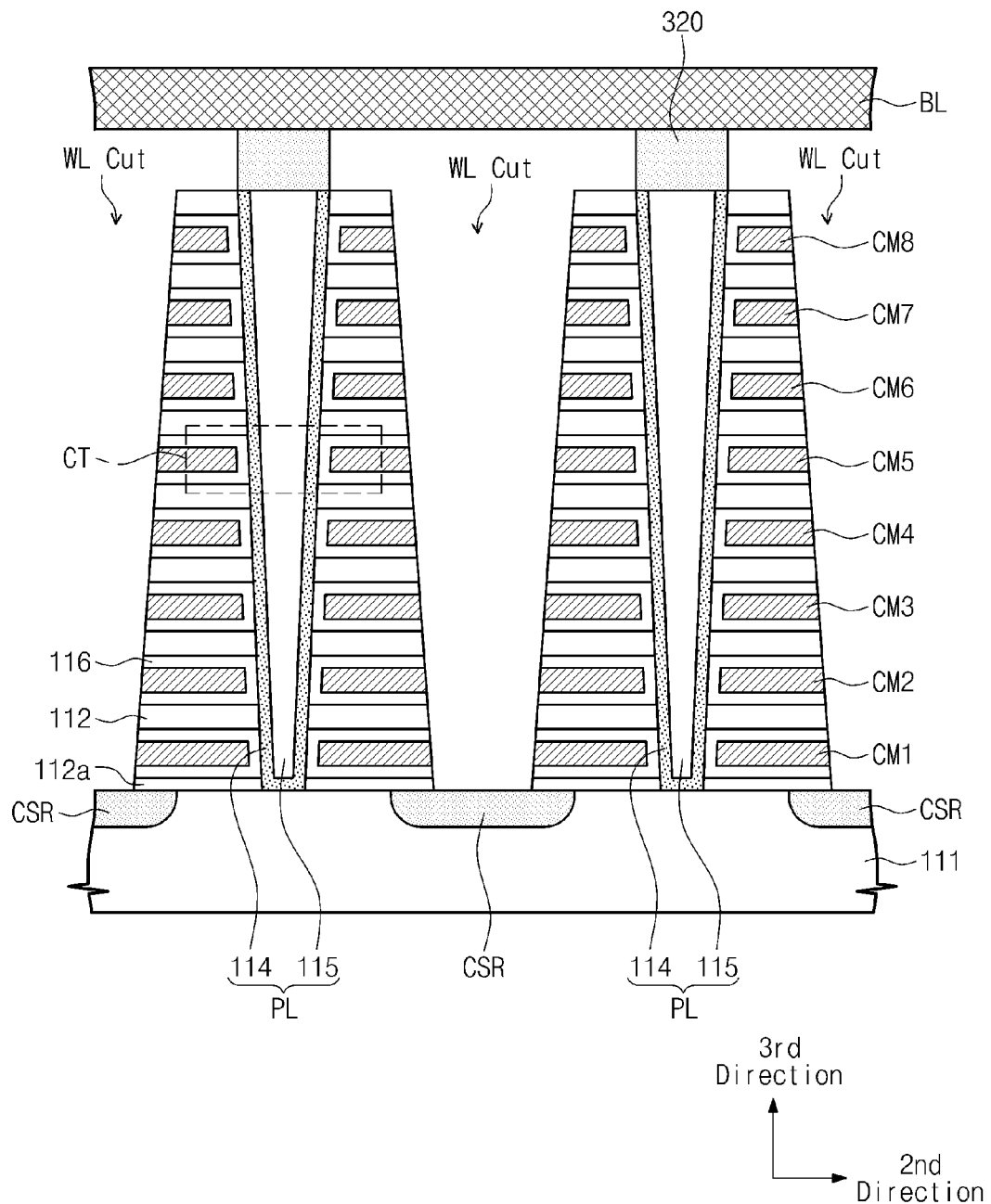
FIG. 5 is a cross-sectional view taken along a line IV-IV' of FIG. 4 according to an exemplary embodiment of the inventive concept.

FIG. 3 is a plane diagram illustrating one memory block BLKa of memory blocks of FIG. 1 according to an exemplary embodiment of the inventive concept. FIG. 4 is a perspective view taken along a line IV-IV' of FIG. 3 according to an exemplary embodiment of the inventive concept. FIG. 5 is a cross-sectional view taken along a line IV-IV' of FIG. 3 according to an exemplary embodiment of the inventive concept.

Referring to FIGS. 3 to 5, three-dimensional structures extending along the first to third directions may be provided.

A substrate 111 is provided. The substrate 111 may be a well having the first conductivity type, for example. The substrate 111 may be a p-well in which the Group III element such as boron is injected. The substrate 111 may be a pocket p-well which is provided within an n-well. Below, it is assumed that the substrate 111 is a p-well (or, a pocket p-well). However, the substrate 111 is not limited thereto. The substrate 111 may be another type substrate than a p-type substrate.

A plurality of common source regions CSR extending along the first direction may be provided in the substrate 111. The common source regions CSR may be spaced apart from one another along the second direction. The common source regions CSR may be connected in common to form a common source line.

The common source regions CSR may have the second conductivity type different from that of the substrate 111. For example, the common source regions CSR may be n-type. Below, it is assumed that the common source regions CSR are the n-type. However, the common source regions CSR are not limited thereto. The common source region CSR may be another type than the n-type.

Between two adjacent regions of the common source regions CSR, a plurality of insulation materials 112 and 112a may be provided sequentially on the substrate 111 along the third direction (i.e., a direction perpendicular to the substrate 111). The insulation materials 112 and 112a may be spaced apart along the third direction. The insulation materials 112 and 112a may extend along the first direction. For example, the insulation materials 112 and 112a may include an insulation material such as a semiconductor oxide film. A thickness of the insulation material 112a contacting with the substrate 111 may be thinner than those of other insulation materials 112.

Between two adjacent regions of the common source regions CSR, a plurality of pillars PL may be arranged sequentially along the first direction so as to penetrate the plurality of insulation materials 112 and 112a along the second direction. For example, the pillars PL may contact with the substrate 111 through the insulation materials 112 and 112a.

In an exemplary embodiment, the pillars PL between two adjacent common source regions may be spaced apart along the first direction. The pillars PL may be disposed in line along the first direction.

In an exemplary embodiment, the pillars PL may be formed of a plurality of materials, respectively. Each of the pillars PL may include a channel film 114 and an inner material 115 within the channel film 114.

The channel films 114 may include a semiconductor material (e.g., silicon) having the first conductivity type. For example, the channel films 114 may include a semiconductor material (e.g., silicon) having the same type as the substrate 111. The channel films 114 can include intrinsic semiconductor being a nonconductor.

The inner materials 115 may include an insulation material. For example, the inner materials 115 may include an insulation material such as silicon oxide. Alternatively, the inner materials 115 may include air gap.

Between two adjacent regions of the common source regions CSR, information storage films 116 may be provided on exposed surfaces of the insulation materials 112 and 112a and the pillars PL. The information storage films 116 may store information by trapping or discharging charges.

Between two adjacent common source regions and between the insulation materials 112 and 112a, conductive materials CM1 to CM8 may be provided on exposed surfaces of the information storage films 116. The conductive materials CM1 to CM8 may extend along the first direction. The conductive materials CM1 to CM8 on the common source regions CSR may be separated by word line cuts. The common source regions CSR may be exposed by the word line cuts. The word line cuts may extend along the first direction.

In an exemplary embodiment, the conductive materials CM1 to CM8 may include a metallic conductive material. The conductive materials CM1 to CM8 may include a nonmetallic conductive material such as polysilicon.

In an exemplary embodiment, information storage films 116 provided on an upper surface of an insulation material placed at the uppermost layer among the insulation materials 112 and 112a can be removed. Exemplarily, information storage films provided at sides opposite to the pillars PL among sides of the insulation materials 112 and 112a can be removed.

A plurality of drains 320 may be provided on the plurality of pillars PL, respectively. The drains 320 may include a semiconductor material (e.g., silicon) having the second conductivity type, for example. The drains 320 may include an n-type semiconductor material (e.g., silicon). Below, it is assumed that the drains 320 include n-type silicon. However, the prevent invention is not limited thereto. The drains 320 can be extended to the upside of the channel films 114 of the pillars PL.

Bit lines BL extending in the second direction may be provided on the drains 320 so as to be spaced apart from one another along the first direction. The bit lines BL may be coupled with the drains 320. In this embodiment, the drains 320 and the bit lines BL may be connected via contact plugs (not illustrated). The bit lines BL may include a metallic conductive material. Alternatively, the bit lines BL may include a nonmetallic conductive material such as polysilicon.

Below, the conductive materials CM1 to CM8 may have the first height to the eighth height according to a distance from the substrate 111.

The plurality of pillars PL may form a plurality of cell strings together with the information storage films 116 and the plurality of conductive materials CM1 to CM8. Each of the pillars PL may form a cell string with an information storage film 116 and an adjacent conductive material CMi (i being one of 1 to 8).

The pillars PL may be provided on the substrate 111 along row and column directions. The eighth conductive materials CM8 may constitute rows. Pillars connected with the same conductive material among the eighth conductive materials CM8 may constitute one row. The bit lines BL may constitute columns. Pillars connected with the same bit line among the bit lines BL may constitute a column. The pillars PL may constitute a plurality of strings arranged along row and column directions together with the information storage films 116 and the plurality of conductive materials CM1 to CM8. Each cell string may include a plurality of cell transistors CT stacked in a direction perpendicular to the substrate 111.

Figure 6:
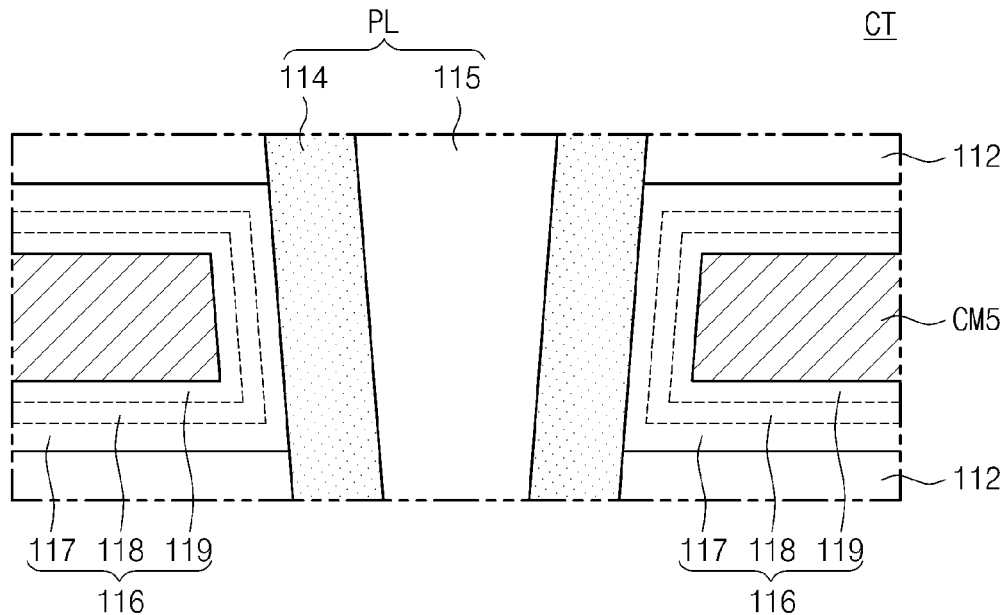
FIG. 6 is a diagram illustrating one of cell transistors of FIG. 5.

FIG. 6 is a diagram illustrating one of cell transistors CT of FIG. 5. Referring to FIGS. 3 to 6, the cell transistors CT may be formed of conductive materials CM1 to CM8, pillars PL, and information storage films 116 provided between the conductive materials CM1 to CM8 and the pillars PL.

The information storage films 116 may extend to upper surfaces and lower surfaces of the conductive materials CM1 to CM8 from regions between the conductive materials CM1 to CM8 and the pillars PL. Each of the information storage films 116 may include the first to third sub insulation films 117, 118, and 119.

In the cell transistors CT, the channel films 114 of the pillars PL may include the same p-type silicon as the substrate 111. The channel films 114 may act as bodies of cell transistors CT. The channel films 114 may be formed in a direction perpendicular to the substrate 111. The channel films 114 of the pillars PL may act as a vertical body. Vertical channels may be formed at the channel films 114.

The first sub insulation films 117 adjacent to the pillars PL may act as tunneling insulation films of the cell transistors CT. For example, the first sub insulation films 117 may include a thermal oxide film, respectively. The first sub insulation films 117 may include a silicon oxide film, respectively.

The second sub insulation films 118 may act as charge storage films of the cell transistors CT. For example, the second sub insulation films 118 may act as a charge trap film, respectively. For example, the second sub insulation films 118 may include a nitride film or a metal oxide film, respectively.

The third sub insulation films 119 adjacent to the conductive materials CM1 to CM8 may act as blocking insulation films of the cell transistors CT. In this embodiment, the third sub insulation films 119 may be formed of a single layer or multiple layers. The third sub insulation films 119 may be a high dielectric film (e.g., an aluminum oxide film, a hafnium oxide film, etc.) having a dielectric constant larger than those of the first and second sub insulation films 117 and 118. The third sub insulation films 119 may include a silicon oxide film, respectively.

In this embodiment, the first to third sub insulation films 117 to 119 may constitute ONA (oxide-nitride-aluminum-oxide) or ONO (oxide-nitride-oxide).

The plurality of conductive materials CM1 to CM8 may act as a gate (or, a control gate), respectively.

That is, the plurality of conductive materials CM1 to CM8 acting as gates (or, control gates), the third sub insulation films 119 acting as block insulation films, the second sub insulation films 118 acting as charge storage films, the first sub insulation films 117 acting as tunneling insulation films, and the channel films 114 acting as vertical bodies may constitute cell transistors CT stacked in a direction perpendicular to the substrate 111. Exemplarily, the cell transistors CT may be a charge trap type cell transistor.

The cell transistors CT can be used for different purposes according to a height thereof. For example, among the cell transistors CT, cell transistors having at least one height and placed at an upper portion may be used as string selection transistors. String selection transistors may be configured to perform switching operations between cell strings and bit lines. Among the cell transistors CT, cell transistors having at least one height and placed at a lower portion may be used as ground selection transistors. Ground selection transistors may be configured to perform switching operations between cell strings and a common source line formed of common source regions CSR. Cell transistors between cell transistors used as string and ground selection transistors may be used as memory cells and dummy memory cells.

The conductive materials CM1 to CM8 may extend along the first direction to be connected with the plurality of pillars PL. The conductive materials CM1 to CM8 may constitute conductive lines interconnecting cell transistors CT of the pillars PL. In this embodiment, the conductive materials CM1 to CM8 may be used as a string selection line, a ground selection line, a word line, or a dummy word line according to the height.

Conductive lines interconnecting cell transistors used as string selection transistors may be used as string selection lines. Conductive lines interconnecting cell transistors used as ground selection transistors may be used as ground selection lines. Conductive lines interconnecting cell transistors used as memory cells may be used as word lines. Conductive lines interconnecting cell transistors used as dummy memory cells may be used as dummy word lines.

Figure 7:
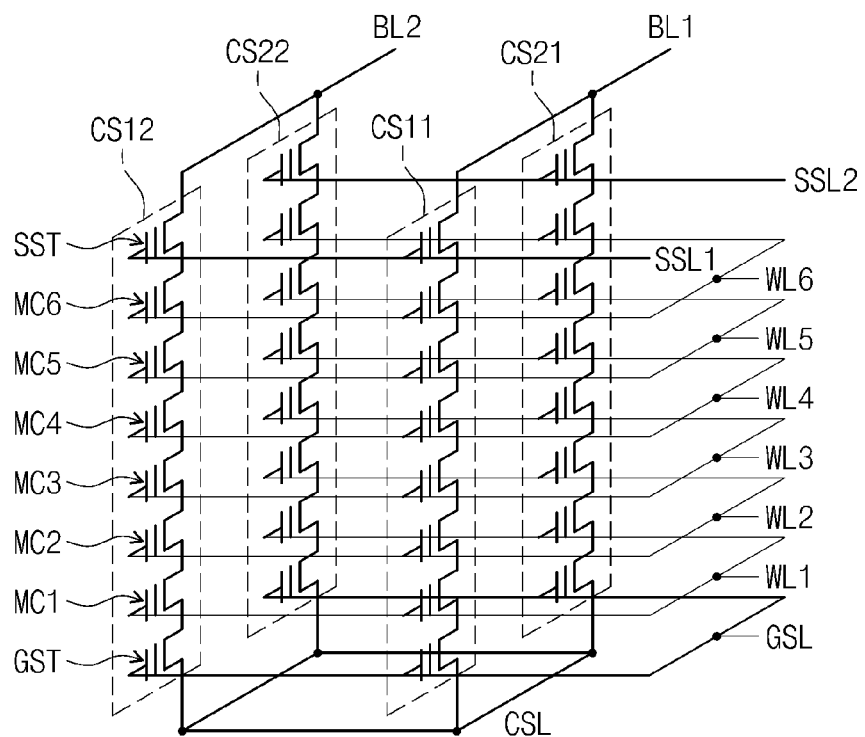
FIG. 7 is a circuit diagram illustrating an equivalent circuit of a portion EC of FIG. 3 according to an exemplary embodiment of the inventive concept.

FIG. 7 is a circuit diagram illustrating an equivalent circuit of a part EC of a plane view in FIG. 3 according to an exemplary embodiment of the inventive concept. Referring to FIGS. 3 to 7, cell strings CS11, CS12, CS21, and CS22 may be provided between bit lines BL1 and BL2 and a common source line CSL. Cell strings CS11 and CS21 may be connected between the first bit line BL1 and the common source line CSL, and cell strings CS12 and CS22 may be connected between the second bit line BL2 and the common source line CSL.

Common source regions CSR may be connected in common to form a common source line CSL.

The cell strings CS11, CS12, CS21, and CS22 may correspond to four pillars of a part EC of a plane view in FIG. 3. The four pillars may constitute four cell strings CS11, CS12, CS21, and CS22 together with conductive materials CM1 to CM8 and information storage films 116.

In this embodiment, the first conductive materials CM1 may constitute ground selection transistors GST with the information storage films 116 and the pillars PL. The first conductive materials CM1 may form a ground selection line GSL. The first conductive materials CM1 may be interconnected to form a ground selection line GSL.

The second to seventh conductive materials CM2 to CM7 may constitute the first to sixth memory cells MC1 to MC6 with the information storage films 116 and the pillars PL. The second to seventh conductive materials CM2 to CM7 may be used as the first to sixth word lines WL1 to WL6.

The second conductive material CM2 may be interconnected to form the first word line WL1. The third conductive material CM3 may be interconnected to form the second word line WL2. The fourth conductive material CM4 may be interconnected to form the third word line WL3. The fifth conductive material CM5 may be interconnected to form the fourth word line WL4. The sixth conductive material CM6 may be interconnected to form the fifth word line WL5. The seventh conductive material CM7 may be interconnected to form the sixth word line WL6.

The eighth conductive materials CM8 may constitute string selection transistors SST with the information storage films 116 and the pillars PL. The eighth conductive materials CM8 may form string selection lines SSL1 and SSL2.

Memory cells of the same height may be connected in common with one word line. Accordingly, when applied to a word line of a specific height, a voltage may be applied to all cell strings CS11, CS12, CS21, and CS22.

Cell strings in different rows may be connected with different string selection lines SSL1 and SSL2. The cell strings CS11, CS12, CS21, and CS22 may be selected or unselected by the row by selecting or unselecting the string selection lines SSL1 and SSL2. For example, cell strings (CS11 and CS12) or (CS21 and CS22) connected with an unselected string selection line SSL1 or SSL2 may be electrically separated from the bit lines BL1 and BL2. Cell strings (CS21 and CS22) or (CS11 and CS12) connected with a selected string selection line SSL2 or SSL1 may be electrically connected with the bit lines BL1 and BL2.

The cell strings CS11, CS12, CS21, and CS22 may be formed as a column to be connected with the bit lines BL1 and BL2. The cell strings CS11 and CS21 may be connected with the bit line BL1, and the cell strings CS12 and CS22 may be connected with the bit line BL2. The cell strings CS11, CS12, CS21, and CS22 may be columns to be selected and unselected by selecting and unselecting the bit lines BL1 and BL2.

It is possible that holes for pillars PL don't contact a substrate 111 due to a process error when the pillars PL are formed. That is, the holes for the pillars PL may not be formed sufficiently deep. At this time, channel films 114 may not contact with the substrate 111. That is, cell strings CS may include off strings.

It is possible that drains 320 don't contact with the channel films 114 of the pillars PL due to a process error when the drains 320 are formed. That is, cell string CS may include off strings.

If off cell strings (hereinafter, referred to as an off string) exist, erasing, reading, and writing of a memory block BLKa1 may be made erroneously. In the embodiment of the inventive concept, it is possible to prevent an abnormal operation due to the off strings using the error correction capacity supported by an error correcting code (ECC).

Figure 8:
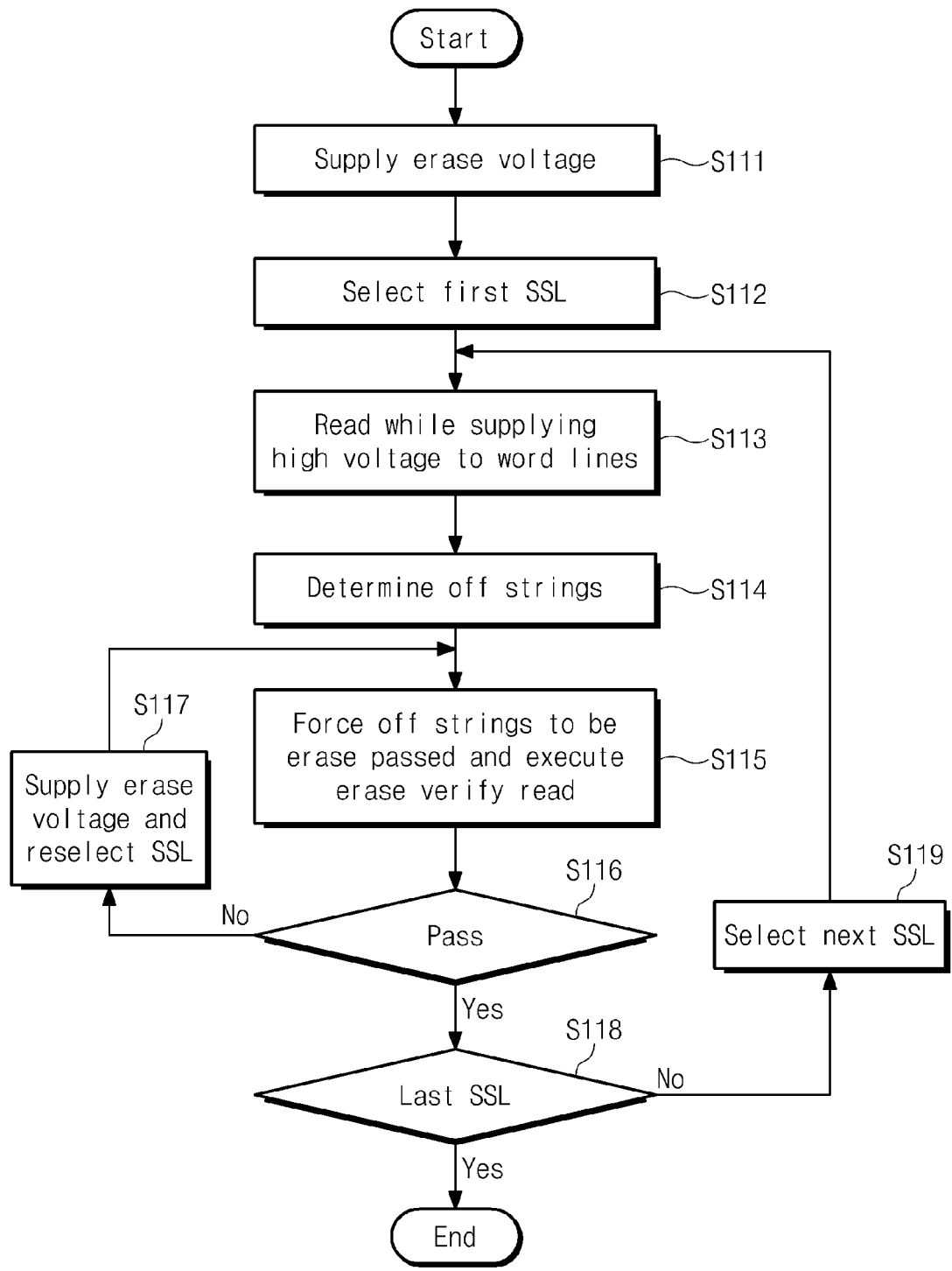
FIG. 8 is a flowchart illustrating an erase method according to an exemplary embodiment of the inventive concept.
Figures 9, 10:
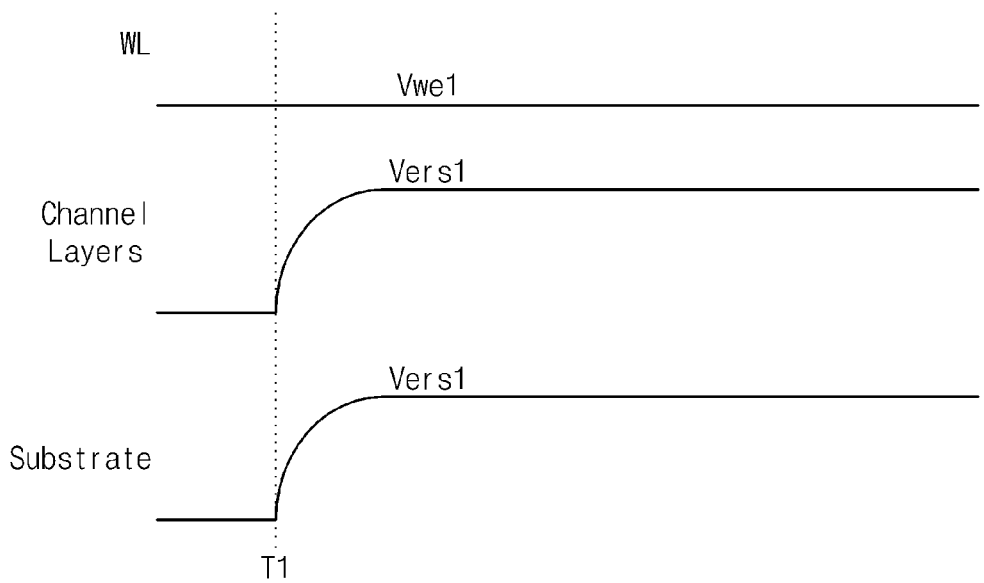
FIG. 9 is a diagram illustrating a bias condition usable in the erase method of FIG. 8.
FIG. 10 is a timing diagram illustrating voltage variations of a substrate, channel films, and word lines.

FIG. 8 is a flowchart illustrating an erase method according to an exemplary embodiment of the inventive concept. FIG. 9 is a diagram illustrating a bias condition according to the erase method of FIG. 8. Below, an erase method according to an exemplary embodiment of the inventive concept will be more fully described with reference to FIGS. 1 and 7 to 9.

In operation S111, an erase voltage may be supplied.

Bit lines BL1 and BL2 may be floated and string selection lines SSL1 and SSL2 may be floated or supplied with the first string selection line voltage VSSL1. The first word line erase voltage Vwe1 may be applied to word lines WL1 to WL6, respectively. The first word line erase voltage Vwe1 may be a ground voltage VSS or a low voltage (for example, a low positive voltage or a low negative voltage) having a similar level to the ground voltage VSS. A ground selection line GSL may be floated or supplied with the first ground selection line VGSL1. A common source line CSL may be floated. The first erase voltage Vers1 may be applied to a substrate 111. The first erase voltage Vers1 may be a high voltage. The first string selection line voltage VSSL1 and the first ground selection line voltage VGSL1 may have a level between the first erase voltage Vers1 and the ground voltage VSS. Voltage variations of the substrate 111, channel films (or, channel layers) 114, and the word lines WL1 to WL6 may be illustrated in FIG. 10.

At a time T1 of FIG. 10, the first erase voltage Vers1 supplied to the substrate 111 may be applied to the channel films 114. The channel films 114 may be charged up to the first erase voltage Vers1. Charges trapped at memory cells MC1 to MC6 may be discharged due to a voltage difference between the first word line erase voltage Vwe1 supplied to the word lines WL1 to WL6 and the first erase voltage Vers1 supplied to the channel films 114. That is, threshold voltages of the memory cells MC1 to MC6 may lower.

In operation S112, the first string selection line SSL1 may be selected. A turn-on voltage may be applied to a selected one, that is, first string selection line SSL1, and a turn-off voltage may be applied to an unselected string selection line SSL2.

In operation S113, a read operation may be made by applying the first high voltage VH1 to the word lines WL1 to WL6.

The first bit line voltage VBL1 may be provided to the bit lines BL1 and BL2.

The second string selection line voltage VSSL2 may be provided to the selected string selection line (e.g., SSL1). The second string selection line voltage VSSL2 may be a voltage sufficient to turn on the first string selection transistors SST1 (string selection transistors connected with the first string selection line SSL1). The second string selection line voltage VSSL2 may be a power supply voltage VCC or a non-selection read voltage Vread. The non-selection read voltage Vread may be a voltage supplied to unselected word lines at a read operation.

The third string selection line voltage VSSL3 may be provided to an unselected string selection line (e.g., SSL2). The third string selection line voltage VSSL3 may be a voltage sufficient to turn on the second string selection transistors SST2 (string selection transistors connected with the second string selection line SSL2). The third string selection line voltage VSSL3 may be the ground voltage VSS or a low voltage (including a positive voltage and a negative voltage) having a similar level to the ground voltage VSS.

The first high voltage VH1 may be provided to the word lines WL1 to WL6. The first high voltage VH1 may be a voltage sufficient to turn on the memory cells MC1 to MC6 regardless of logic states of the memory cells MC1 to MC6. The first high voltage VH1 may be a non-selection read voltage Vread.

The second ground selection line voltage VGSL2 may be provided to the ground selection line GSL. The second ground selection line voltage VGSL2 may be a voltage sufficient to turn on the ground selection transistors GST. The second ground selection line voltage VGSL2 may be the power supply voltage VCC or the non-selection read voltage Vread.

The first common source line voltage VCSL1 may be supplied to the common source line CSL. The first common source line voltage VCSL1 may be the ground voltage VSS or a low voltage (including a positive voltage and a negative voltage) having a similar level to the ground voltage VSS.

The first substrate voltage VSUB1 may be supplied to the substrate 111. The first substrate voltage VSUB1 may be the ground voltage VSS or a low voltage (including a positive voltage and a negative voltage) having a similar level to the ground voltage VSS.

Figure 11:
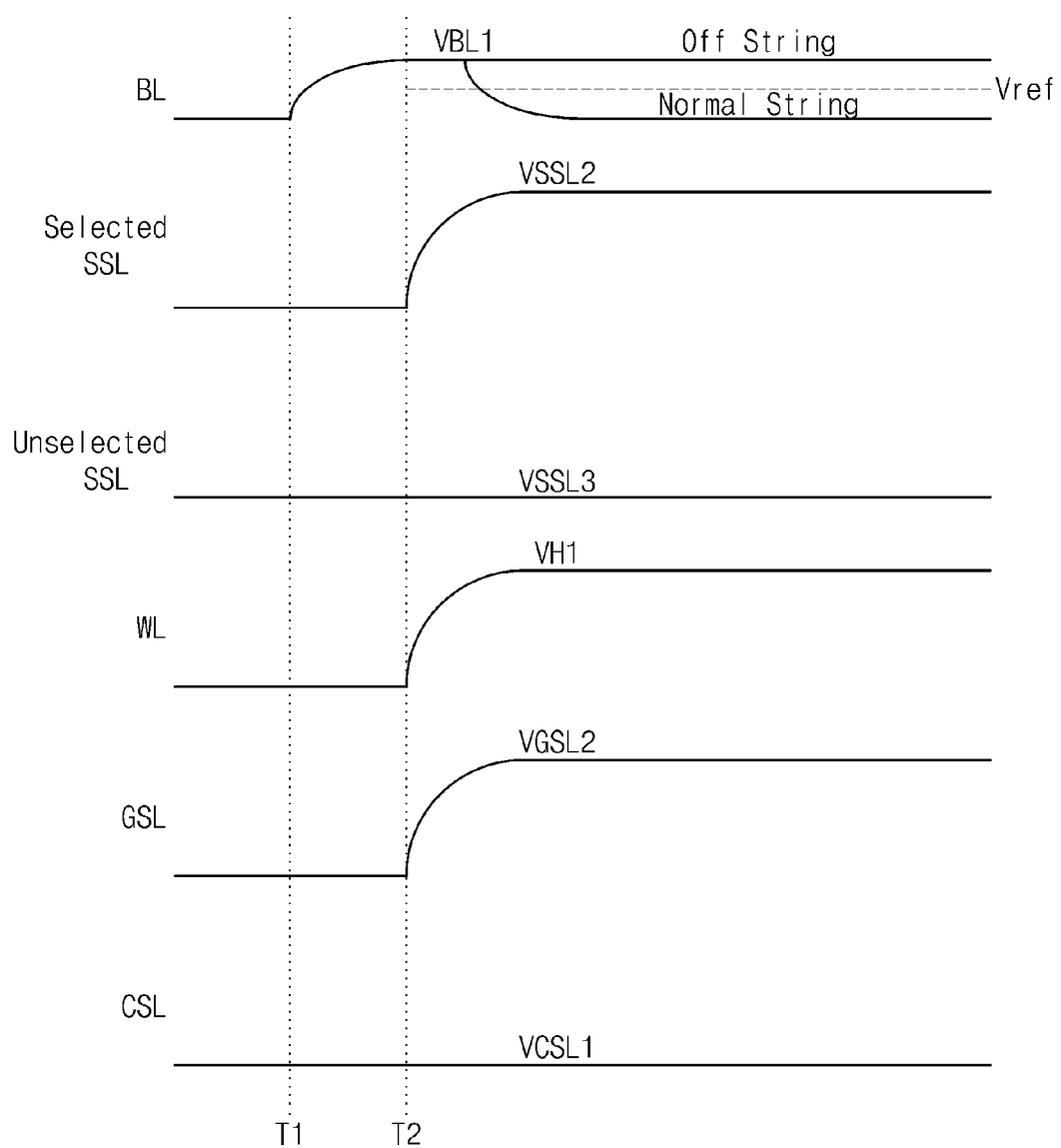
FIG. 11 is a timing diagram illustrating a voltage variation of a memory cell array at operations S113 and S114 of FIG. 8.

A voltage variation of the memory cell array 110 at operation S113 is illustrated in FIG. 11.

At the time T1, bit lines BL may be pre-charged with the first bit line voltage VBL1. At a time T2, voltages may be applied to the string selection lines SSL1 and SSL2, the word lines WL1 to WL6, the ground selection line GSL, and the common source line CSL.

The selected string selection transistors SST1 may be turned on when the second string selection line voltage VSSL2 is applied to the selected string selection line SSL1. The memory cells MC1 to MC6 may be turned on when the first high voltage VH1 is applied to the word lines WL1 to WL6. The ground selection transistors GST may be turned on when the second ground selection line voltage VGSL2 is applied to the ground selection line GSL.

When a cell string is not an off string but a normal string among cell strings CS11 and CS12 connected with the selected string selection line SSL1, a voltage of a bit line may become lower because the first bit line voltage VBL1 charged to the bit line is discharged to the common source line CSL. when a cell string is an off string among the cell strings CS11 and CS12 connected with the selected string selection line SSL1, the bit line may maintain the first bit line voltage VBL1 because the bit line and the common source line CSL are electrically isolated from each other.

When a voltage of a specific bit line is higher than a reference voltage Vref, a page buffer unit 130 may store the first logic value (e.g., a logic high level) in a latch (not illustrated) corresponding to the specific bit line. When a voltage of the specific bit line is lower than the reference voltage Vref, the page buffer unit 130 may store the second logic value (e.g., a logic low level) in the latch (not illustrated) corresponding to the specific bit line.

The second logic value may be stored in latches (not illustrated) corresponding to normal strings. The first logic value may be stored in latches (not illustrated) corresponding to off strings. That is, it is possible to detect the off strings by performing a read operation using the first high voltage VH1. An operation of detecting off strings may be referred to as a pre-read operation.

The pre-read operation may be made in response to a pre-read signal PRS. The address decoding unit 120 and the page buffer unit 130 may supply voltages to the memory cell array 110 in response to the pre-read signal PRS. The page buffer unit 130 may store a pre-read result in latches (not shown) in response to the pre-read signal PRS.

In operation S114, one or more off strings may be determined. For example, a string corresponding to a latch (not illustrated) storing the first logic value may be determined to be an off string.

In operation S115, one or more off strings may be determined to be erase passed, that is, one or more off strings are determined as the strings which have passed the erase operation as a temporarily erase passed string, and then an erase verification operation may be made.

The second bit line voltage VBL2 may be applied to cell strings detected to be normal strings at the pre-read operation. The second bit line voltage VBL2 may be the power supply voltage VCC or a voltage having a similar level to the power supply voltage VCC. The third bit line voltage VBL3 may be supplied to cell strings detected to be off strings at the pre-read operation. The third bit line voltage VBL3 may be the ground voltage VSS or a voltage (including a positive voltage and a negative voltage) having a similar level to the ground voltage VSS.

In an exemplary embodiment, at the pre-read operation, the page buffer unit 130 may supply the third bit line voltage VBL3 to bit lines connected with the off strings according to a pre-read result stored in latches (not illustrated) of the page buffer unit 130. In an embodiment, the pre-read result RR may be provided to control logic 170. The control logic 170 may control the page buffer unit 130 such that the third bit line voltage VBL3 is supplied to bit lines connected with off strings according to the pre-read result RR. A signal line to transfer the pre-read result RR to the control logic 170 may be provided between the page buffer unit 130 and the control logic 170.

The fourth string selection line voltage VSSL4 may be provided to the selected string selection line SSL1. The fourth string selection line voltage VSSL4 may be a voltage sufficient to turn on the selected string selection transistors SST1. The fourth string selection line voltage VSSL4 may be a non-selection read voltage Vread or the power supply voltage VCC.

The fifth string selection line voltage VSSL5 may be provided to the unselected string selection line SSL2. The fifth string selection line voltage VSSL5 may be a voltage sufficient to turn on the unselected string selection transistors SST2. The fifth string selection line voltage VSSL5 may be the ground voltage VSS or a low voltage (including a positive voltage and a negative voltage) having a similar level to the ground voltage VSS.

The first verification voltage VFY1 may be provided to the word lines WL1 to WL6. The first verification voltage VFY1 may be upper limit of threshold voltages of erased memory cells. The first verification voltage VFY1 may be the ground voltage VSS or a negative voltage.

The third ground selection line voltage VGSL3 may be provided to the ground selection line GSL. The third ground selection line voltage VGSL3 may be a voltage sufficient to turn on the ground selection transistors GST. The third ground selection line voltage VGSL3 may be a non-selection read voltage Vread or the power supply voltage VCC.

The second common source line voltage VCSL2 may be provided to the common source line CSL. The second common source line voltage VCSL2 may be the ground voltage VSS or a low voltage (including a positive voltage and a negative voltage) having a similar level to the ground voltage VSS.

The second substrate voltage VSUB2 may be supplied to the substrate 111. The second substrate voltage VSUB2 may be the ground voltage VSS or a low voltage (including a positive voltage and a negative voltage) having a similar level to the ground voltage VSS.

Figure 12:
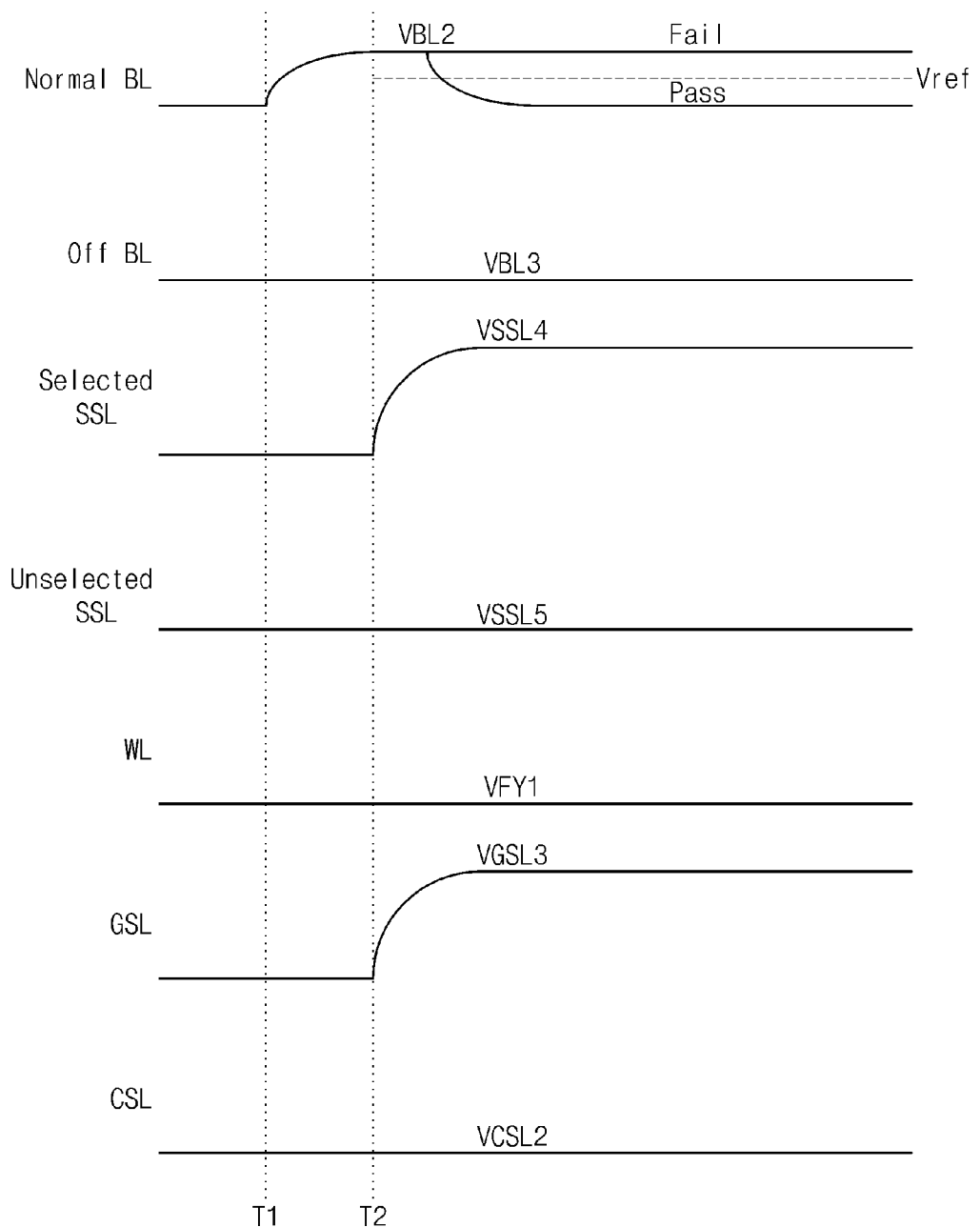
FIG. 12 is a timing diagram illustrating a voltage variation of a memory cell array at operation S115 and S116 of FIG. 8.

A voltage variation of the memory cell array 110 at operation S115 is illustrated in FIG. 12.

At the time T1, normal bit lines connected with normal strings may be pre-charged up to the second bit line voltage VBL2. The third bit line voltage VBL3 may be supplied to bit lines connected with off strings.

At the time T2, voltages may be supplied to the string selection lines SSL1 and SSL2, the word lines WL1 to WL6, the ground selection line GSL, and the common source line CSL.

The selected string selection transistors SST1 may be turned on, and unselected string selection transistors SST2 may be turned off. The ground selection transistors GST may be turned on.

Memory cells having a threshold voltage higher than a verification voltage VFY1 among the memory cells MC1 to MC6 may be turned off, and memory cells having a threshold voltage lower than the verification voltage VFY1 may be turned on. If the memory cells MC1 to MC6 in a specific cell string are turned on, a bit line and the common source line CSL may be electrically isolated from each other. A voltage of a bit line connected with the specific cell string may become lower from the second bit line voltage VBL2.

If at least one of the memory cells MC1 to MC6 in the specific cell string is turned off, a bit line and the common source line CSL may be electrically isolated from each other. This means that the bit line connected with the specific cell string maintains the second bit line voltage VBL2.

When a voltage of the specific bit line is higher than the reference voltage Vref, the page buffer unit 130 may store the first logic value in a latch (not illustrated) corresponding to the specific bit line. When a voltage of the specific bit line is lower than the reference voltage Vref, the page buffer unit 130 may store the second logic value in a latch (not illustrated) corresponding to the specific bit line.

That is, the second logic value may be stored in a latch (not illustrated) corresponding to an erase-passed cell string of normal strings. The first logic value may be stored in a latch (not illustrated) corresponding to an erase-failed cell string of the normal strings. Since the third bit line voltage VBL3 is applied to off strings, the second logic value may be stored in latches (not illustrated) corresponding to the off strings.

Data stored in latches (not illustrated) of the page buffer unit 130 may be an erase verification read result RR. The erase verification read result RR may be transferred to a pass/fail checking unit 160.

The pass/fail checking unit 160 may receive the erase verification read result RR from the page buffer unit 130. The pass/fail checking unit 160 may determine a read result indicating the second logic value to be erase passed and a read result indicating the first logic value to be erase failed. Since the erase verification read result RR of off strings has the second logic value, the off strings may be determined to be erase passed or treated as the erase passed sting. That is, if normal strings are erase passed, the first logic value may not be included in the erase verification read result RR. If the first logic value is not included in the erase verification read result RR, the pass/fail checking unit 160 may generate a pass signal PASS. If the first logic value is included in the erase verification read result RR, the pass/fail checking unit 160 may generate a fail signal FAIL.

In operation S116, it may be determined whether the pass signal PASS is activated. If no pass signal PASS is activated, that is, if the fail signal FAIL is activated, in operation S117, an erase voltage may be supplied and a previously selected string selection line SSL1 may be selected again. The erase voltage of operation S117 may be different from the previously applied voltage. The erase voltage of operation S117 may be increased from the previously applied voltage. Afterwards, the method proceeds to operation S115. If the pass signal PASS is activated, the method proceeds to operation S118.

In operation S118, it may be determined whether the selected string selection line SSL1 is a last string selection line. If the selected string selection line SSL1 is not the last string selection line in operation S119, a next string selection line (e.g., SSL2) may be selected. Afterwards, the method proceeds to operation S113. If the selected string selection line SSL1 is the last string selection line, the method may be ended.

It is possible that the memory cell or the off string which has been determined as temporarily erase passed memory cell or string and which has the previous first logic value can be determined as "erase passed" to have the second logic value through operations S117, S115 and S116. It is also possible that operations S117, S115 and S116 can be performed or repeatedly performed one or more times until the off string having the previous first logic value is determined as "erase passed" to have the second logic value.

The memory cell or off string having the previous first logic value may include the memory cell or off string determined in the off string determining operation S114 and/or the memory cell or off string determined among the normal strings in the erase verification operation S115. The above-described memory cell or off string having the previous first logic value may be subject to the operations S117, S115, and S116 until proceeding to operation S118.

As described above, erasing may be made until the memory cells MC1 to MC6 in cell strings CS11, CS12, CS21, and CS22 are erase passed. At the erase verification operation, off strings may be determined to be erase passed. Accordingly, it is possible to prevent "erase fail" which may be caused by off strings at the erase verification operation.

Data errors caused due to off strings may be corrected by an error correcting unit (not illustrated) which is provided inside or outside a nonvolatile memory device 100. Accordingly, although the memory cell array 110 includes off strings, the nonvolatile memory device 100 may operate normally without a separate process such as repairing.

There is exemplarily described the case that when one or more memory cells or one or more strings are determined as "erase passed" in operation S116, an erase voltage is supplied in operation S117 and an erase verification operation is performed in operation S115. However, when the memory cells or strings are determined as "erase passed" in operation S116, an erase voltage may be supplied in operation S112 instead of operation S117, a pre-read operation may be performed in the selected one in operation S113, off strings may be detected according to the pre-read operation in operation S114, and the off strings may be determined to be erase passed and an erase verification operation may be performed in the operation S115.

Figure 13A:
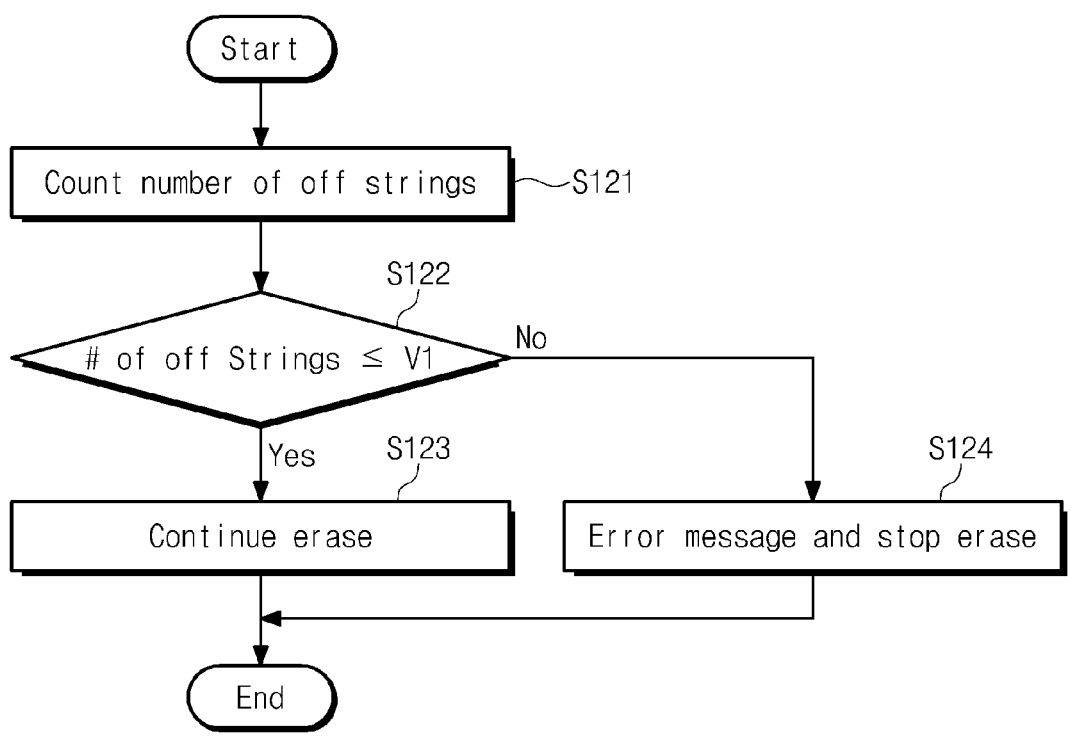
FIG. 13A is a flowchart illustrating an off string processing operation performed in the erase method of FIG. 8.

FIG. 13A is a flowchart illustrating an off string processing operation performed in the erase method of FIG. 8. Referring to FIGS. 1, 8, and 13A, in operation S121, the number of off strings may be counted. For example, the counting unit 150 may count a pre-read result RR provided from the page buffer unit 130. The counting unit 150 may count the number of the first logic values of the pre-read result RR, that is, the number of off strings. The counted value CV may be provided to control logic 170.

In operation S122, it is determined whether the number of off strings is below a first reference value V1. If the number of off strings is below the first value V1, in operation S123, an erase operation may be continuously made. If the number of off strings is over the first reference value V1, in operation S124, an error message may be generated and the erase operation may be stopped.

For example, the control logic 170 may compare the counted value CV with the first reference value V1 stored in the first register REG1. Based upon the comparison result, the control logic 170 may control the nonvolatile memory device 100 so as to continue to perform the erasing operation or stop the erasing operation.

In an exemplary embodiment, the first reference value V1 may indicate the number of bits capable of being corrected by an error correcting unit (not illustrated), which is configured to correct errors of data read from the nonvolatile memory device 100. The first reference value V1 may have a value less than a correctable error bit number of the error correcting unit (not illustrated) and may be determined according to the correctable error bit number. For example, the first reference value V1 may be determined according to a specific ratio on a correctable error bit number.

When the number of off strings is over the correctable error bit number, data read from a corresponding memory block may be uncorrectable data. Accordingly, a memory block causing an uncorrectable error may be detected via operations S121 to S124. In an exemplary embodiment, a memory block corresponding to an error message may be judged to be a bad block.

Operations S121 to S124 can be made after a pre-read operation executed in operation S113. When a specific memory block is erased, operations S121 to S124 may be executed at a time after the first pre-read operation.

Figure 13B:
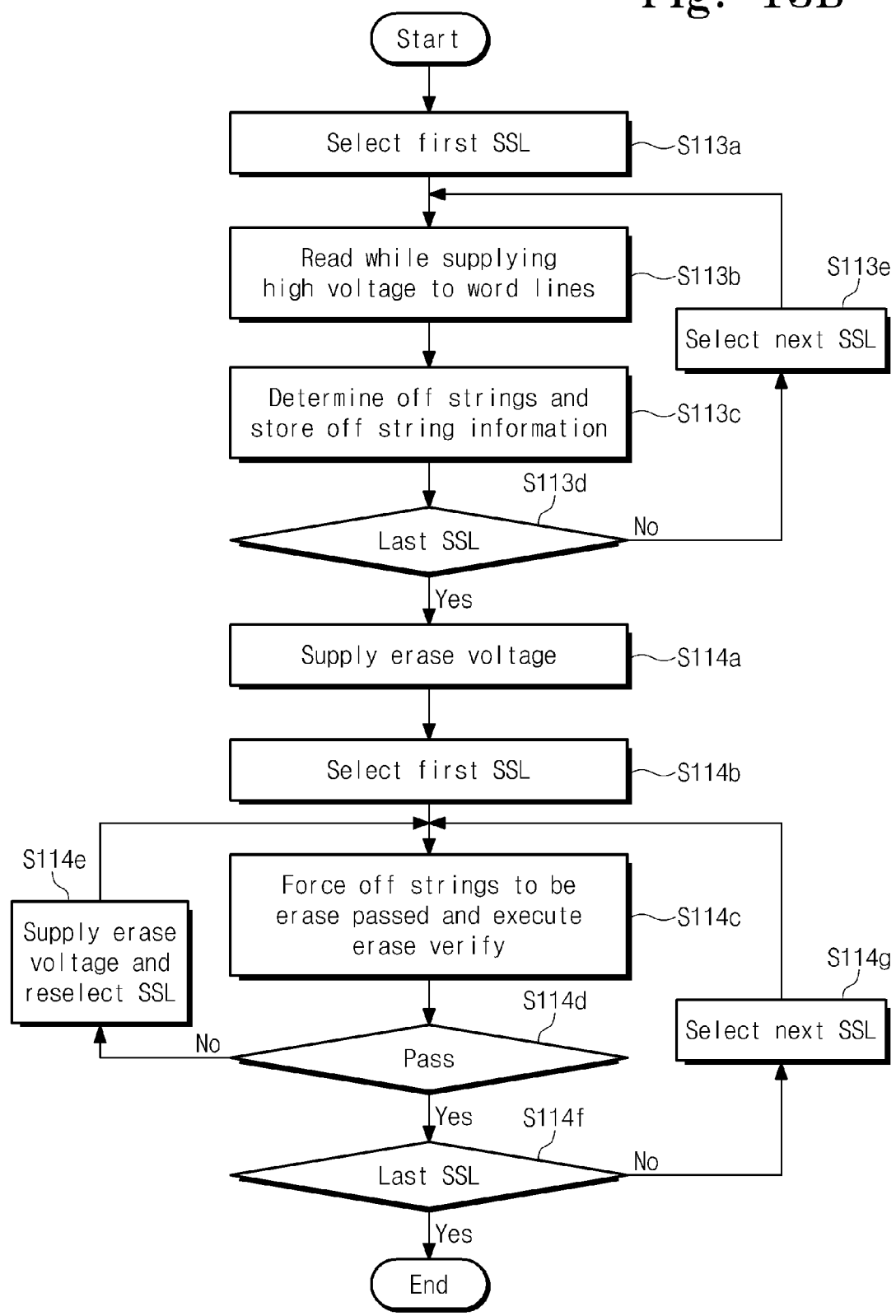
FIG. 13B is a flowchart illustrating an erase method according to an exemplary embodiment of the inventive concept.

FIG. 13B is a flowchart illustrating an erase method according to an exemplary embodiment of the inventive concept. Referring FIGS. 1, 8 and 13B, in operation S113a, the first string selection line may be selected. In operation S113b, a read operation, that is, a pre-read operation may be performed by supplying a high voltage to word lines. In operation S113c, off strings may be determined, and off string information may be stored. For example, off strings may be determined according to a pre-read result, and a pre-read result may be stored. For example, the pre-read result may be stored in the page buffer unit 130.

In operation S113d, it is determined whether the selected string selection line is a last string selection line. If the selected string selection line is not the last string selection line, in operation S113e, a next string selection line may be selected. If the selected string selection line is the last string selection line, the method proceeds to operation S114a.

In operation S114a, an erase operation may be performed by applying an erase voltage. In operation S114b, the first string selection line may be selected. In operation S114c, off strings may be treated to be erase passed, and an erase verification operation may be made. For example, operation S114c may be identical to operation S115 of FIG. 8. In operation S114c, off strings may be treated to be erase passed according to pre-read results stored in the page buffer unit 130.

In operation S114d, it is determined whether strings connected with the selected string selection line are erase passed. If strings connected with the selected string selection line are determined not to be erase passed, an erase voltage may be applied in operation S114e, and a previously selected string selection line may be selected again. Afterwards, the method may be executed from operation S114c. If strings connected with the selected string selection line are determined to be erase passed, the method proceeds to operation S114f.

In operation S114f, it is determined whether the selected string selection line is a last string selection line. If the selected string selection line is not the last string selection line, in operation S114g, a next string selection line may be selected. Afterwards, method proceeds to operation S114c. If the selected string selection line is the last string selection line, the method may be ended.

That is, in operations S113a to S113e, string selection lines SSL1 and SSL2 may be selected sequentially, and off strings may be detected. A detection result may be stored in the page buffer unit 130. In operations S114a to S114g, the string selection lines SSL1 and SSL2 may be selected sequentially, and an erase operation and an erase verification operation may be performed. Off strings may be determined as "erase passed" according to the detection result stored in the page buffer unit 130.

Figure 14:
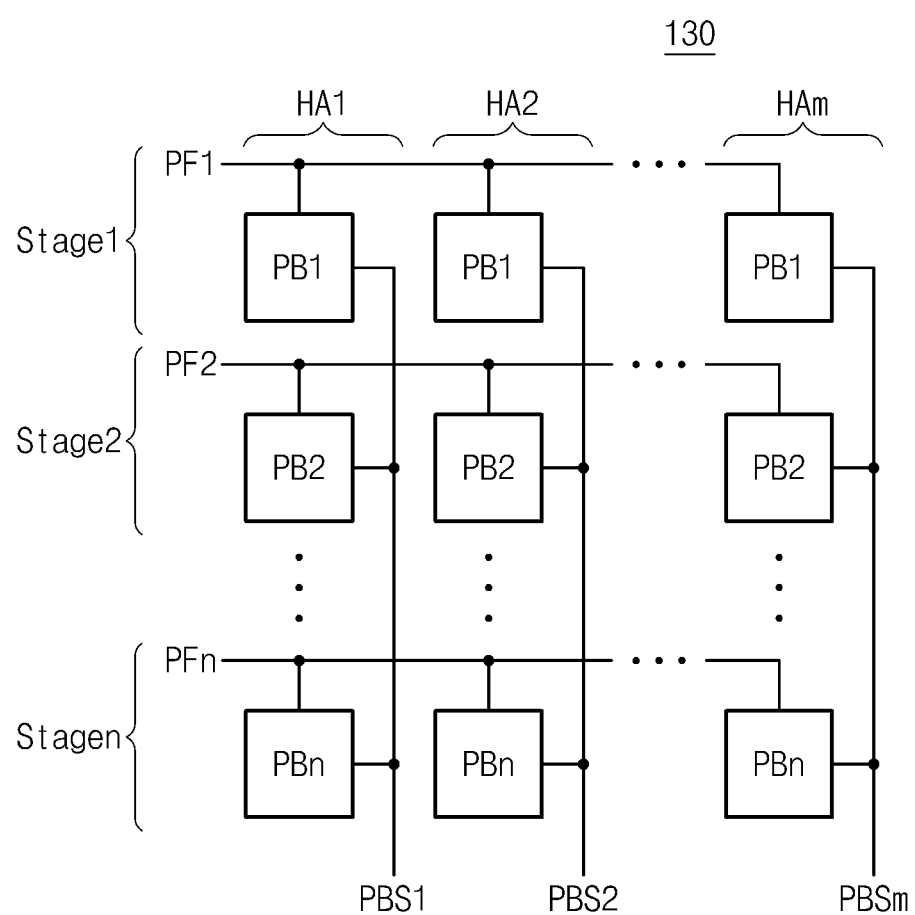
FIG. 14 is a block diagram illustrating a page buffer unit of FIG. 1 according to an exemplary embodiment of the inventive concept.

FIG. 14 is a block diagram illustrating the page buffer unit 130 of FIG. 1 according to an exemplary embodiment of the inventive concept. Referring to FIGS. 1 and 14, the page buffer unit 130 may include a plurality of page buffers PB1 to PBn. The plurality of page buffers PB1 to PBn may be configured to have a plurality of multi-stage structures HA1 to HAm.

The first page buffers PB1 may constitute a first stage Stage1. The second page buffers PB2 may constitute a second stage Stage2. The nth page buffers PBn may constitute an nth stage Stagen.

In each multi-stage structure HA, page buffers may be interconnected. For example, in the first multi-stage structure HA1, the page buffers PB1 to PBn may be connected with the first page buffer signal line PBS1 in a wired-OR manner. In the second multi-stage structure HA2, the page buffers PB1 to PBn may be connected with the second page buffer signal line PBS2 in a wired-OR manner. In the mth multi-stage structure HAm, the page buffers PB1 to PBn may be connected with the mth page buffer signal line PBSm in a wired-OR manner.

Each of the page buffers PB1 to PBn may include a plurality of latches. One of latches in each page buffer may be used to store a pre-read result.

Page buffers in each stage may be connected in common with a transfer signal line PF. When the first transfer signal line PF1 is activated, page buffers in the first stage Stage1 may output stored data to the page buffer signal lines PBS1 to PBSm. When the second transfer signal line PF2 is activated, page buffers in the second stage Stage2 may output stored data to the page buffer signal lines PBS1 to PBSm. When the nth transfer signal line PFn is activated, page buffers in the nth stage Stagen may output stored data to the page buffer signal lines PBS1 to PBSm.

The transfer signals PF1 to PFn may be activated sequentially. As the transfer signals PF1 to PFn are activated sequentially, a read result (including a pre-read result and an erase verification result) may be output sequentially. In an exemplary embodiment, the read result (including a pre-read result and an erase verification result) may be divided into groups corresponding to stages Stage1 to Stagen, and the divided groups may output the read result sequentially.

As the read result (including a pre-read result and an erase verification result) is output sequentially, the counting unit 150 may count the read result sequentially. The counting unit 150 may make pass/fail determinations sequentially.

Figure 15:
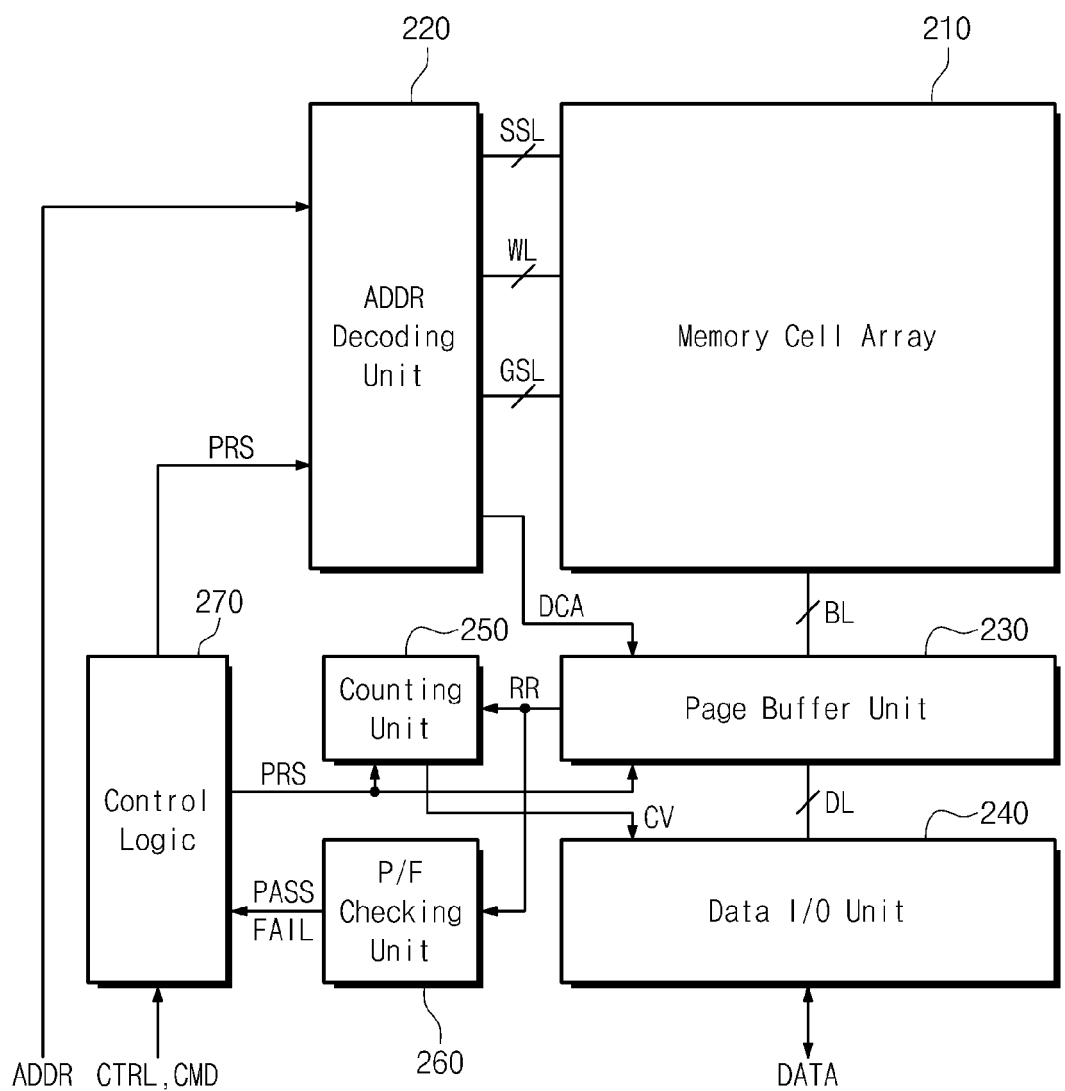
FIG. 15 is a block diagram illustrating a nonvolatile memory device according to an exemplary embodiment of the inventive concept.

FIG. 15 is a block diagram illustrating a nonvolatile memory device 200 according to an exemplary embodiment of the inventive concept. Referring to FIG. 15, the nonvolatile memory device 200 may include a memory cell array 210, an address decoding unit 220, a page buffer unit 230, a data input/output unit 240, a counting unit 250, a pass/fail checking unit 260, and a control logic 270.

The nonvolatile memory device 200 of FIG. 15 may be identical to that of FIG. 1 except that a count value CV is provided to the data input/output unit 240 and a register REG1 is removed from the control logic 270.

Figure 16:
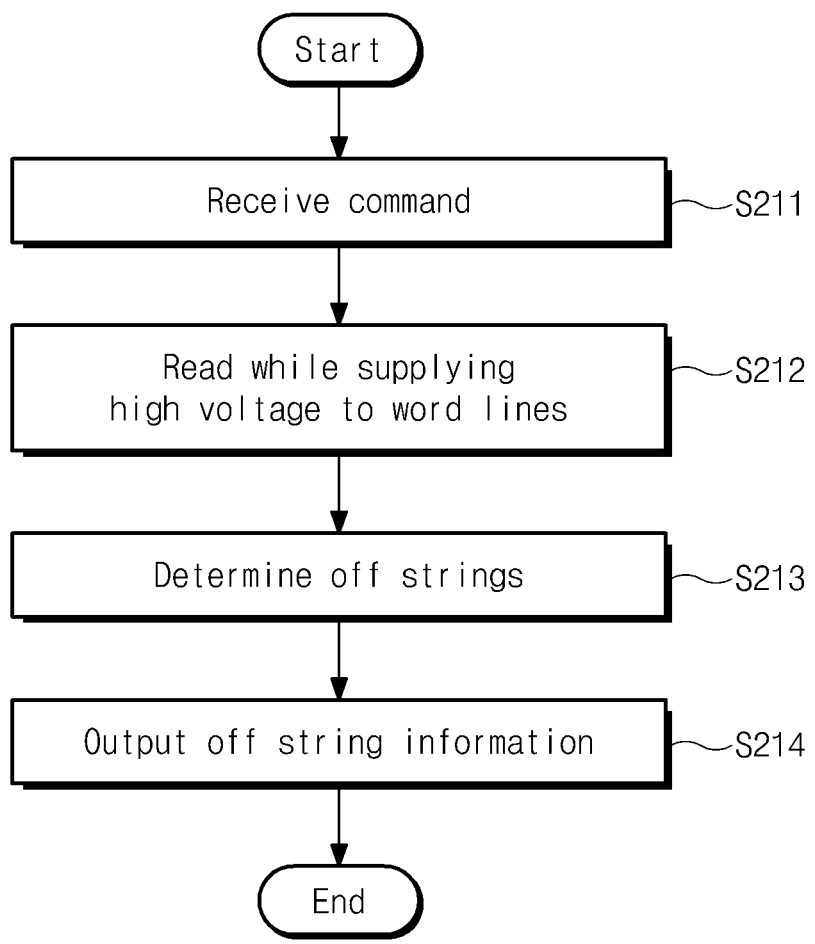
FIG. 16 is a flowchart illustrating a pre-read method according to an exemplary embodiment of the inventive concept.

FIG. 16 is a flowchart illustrating a pre-read method according to an exemplary embodiment of the inventive concept. Referring to FIGS. 7, 15, and 16, in operation S211, a command may be received. For example, a command corresponding to a pre-read operation may be received. A command to request status information of the nonvolatile memory device 200 can be received. An input command can be a command different from typical write, read, and erase commands. An address to designate or indicate a specific memory block and a specific string selection line may be received with the command. The specific memory block and the specific string selection line may be selected according to the input address.

In operation S212, a read operation (a pre-read operation) may be performed by applying the first high voltage VH1 to word lines WL1 to WL6, respectively. Operation S212 of FIG. 16 may be identical to operation S113 of FIG. 8. After operation S212, a pre-read result RR may be stored in latches included in the page buffer unit 230.

In operation S213, off strings may be determined. For example, as described with reference to operation S114 of FIG. 8, off strings may be determined according to the pre-read result RR.

In operation S214, off string information may be output. The off string information may include information associated with off strings.

The off string information may include the number of off strings. The pre-read result RR may be provided to the counting unit 250. A count value CV of the counting unit 250 may be output to an external device via the data input/output unit 240.

The off string information may include a pre-read result RR. The pre-read result RR may be provided outside the nonvolatile memory device 200 via the data input/output unit 240.

The off string information can include both the count value CV and the pre-read result.

In an exemplary embodiment, it may be determined whether any type of off string information is output according to the command input in operation S211.

After operations S211 to S214, there may be output information associated with off strings of cell strings corresponding to the specific string selection line in the specific memory block.

Figure 17:
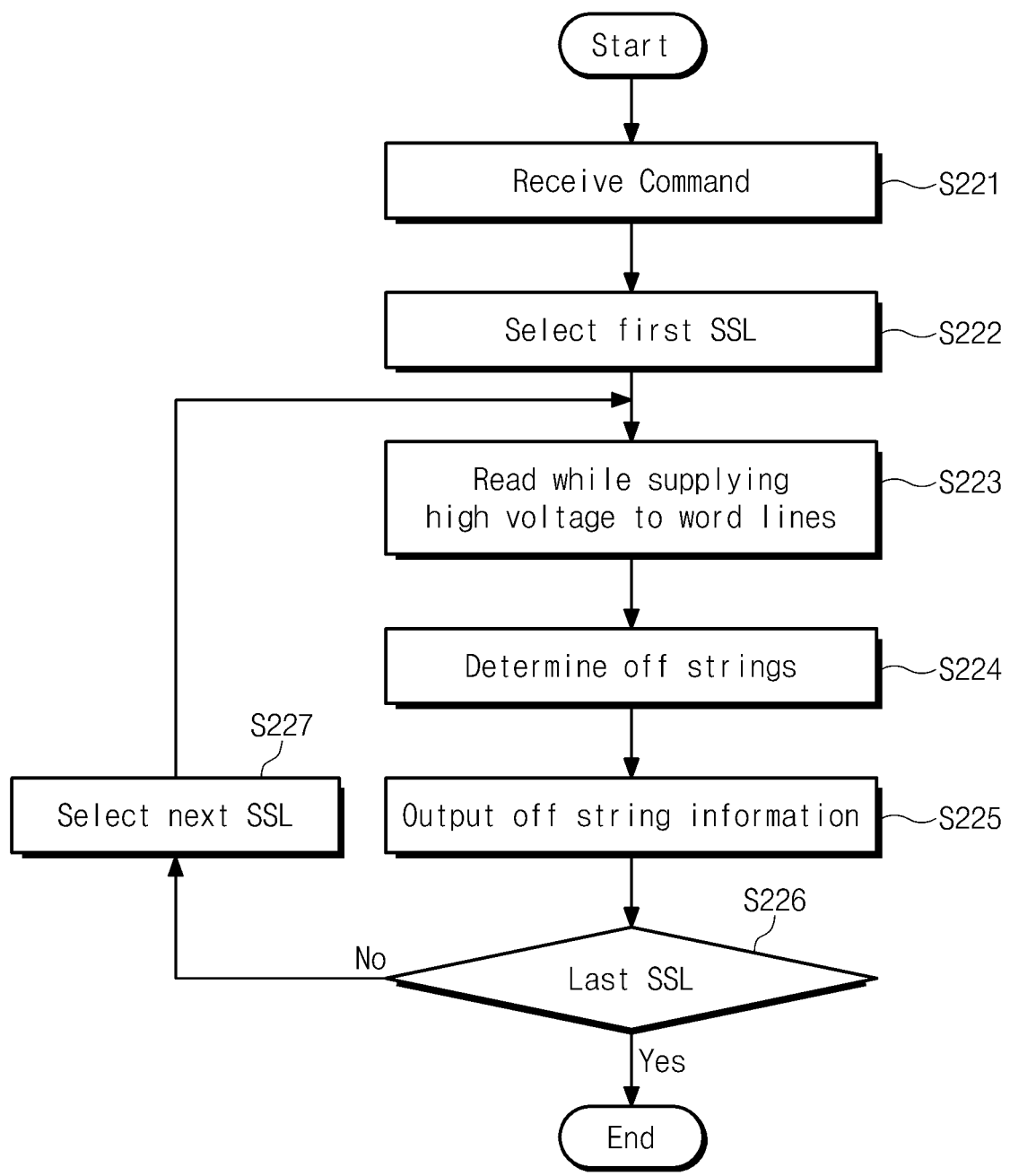
FIG. 17 is a flowchart illustrating a pre-read method according to an exemplary embodiment of the inventive concept.

FIG. 17 is a flowchart illustrating a pre-read method according to an exemplary embodiment of the inventive concept. Referring to FIGS. 7, 15, and 17, in operation S221, a command may be received. For example, a command corresponding to a pre-read operation may be received. A command to request status information of the nonvolatile memory device 200 can be received. An input command can be a command different from typical write, read, and erase commands. An address to designate or indicate a specific memory block and a specific string selection line may be received with the command. The specific memory block and the specific string selection line may be selected according to the input address.

In operation S222, the first string selection line SSL1 may be selected.

In operation S223, a read operation (a pre-read operation) may be performed by applying the first high voltage VH1 to word lines WL1 to WL6, respectively. Operation S223 of FIG. 16 may be identical to operation S113 of FIG. 8.

In operation S224, off strings may be determined. Operation S224 of FIG. 16 may be identical to operation S114 of FIG. 8.

In operation S225, off string information may be output. The off string information may include the number of off strings of a selected string selection line in a selected memory block, a pre-read result, or both the number of off strings and a pre-read result.

In operation S226, whether the selected string selection line is a last string selection line may be judged. If the selected string selection line is not the last string selection line, the method proceeds to operation S227, in which a next string selection line SSL2 is selected. Afterwards, the method proceeds to operation S223. If the selected string selection line is the last string selection line, the method may be ended.

After operations S221 to S227, there may be output information associated with off strings of cell strings of a specific memory block. A type of off string information may be determined according to an input command.

Figure 18:
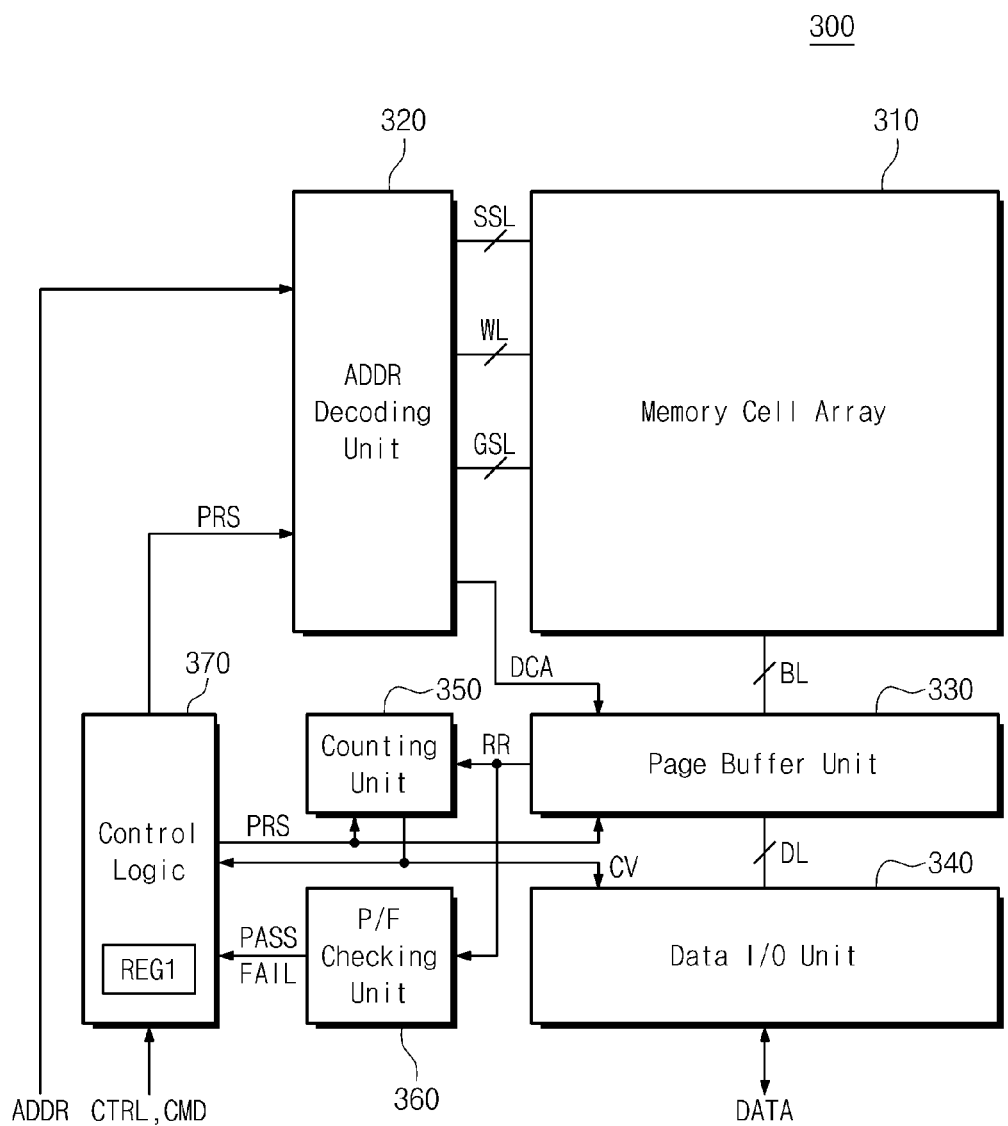
FIG. 18 is a block diagram illustrating a nonvolatile memory device according to an exemplary embodiment of the inventive concept.

FIG. 18 is a block diagram illustrating a nonvolatile memory device 300 according to an exemplary embodiment of the inventive concept. Referring to FIG. 18, the nonvolatile memory device 300 may include a memory cell array 310, an address decoding unit 320, a page buffer unit 330, a data input/output unit 340, a counting unit 350, a pass/fail checking unit 360, and a control logic 370.

The nonvolatile memory device 300 may be identical to that of FIG. 1 except that a count value CV is also provided to the data input/output unit 340.

The nonvolatile memory device 300 may perform an erase operation according to an erase method described with reference to FIGS. 8 to 13. The nonvolatile memory device 300 may perform a pre-read operation according to a pre-read method described with reference to FIGS. 16 and 17.

Figure 19:
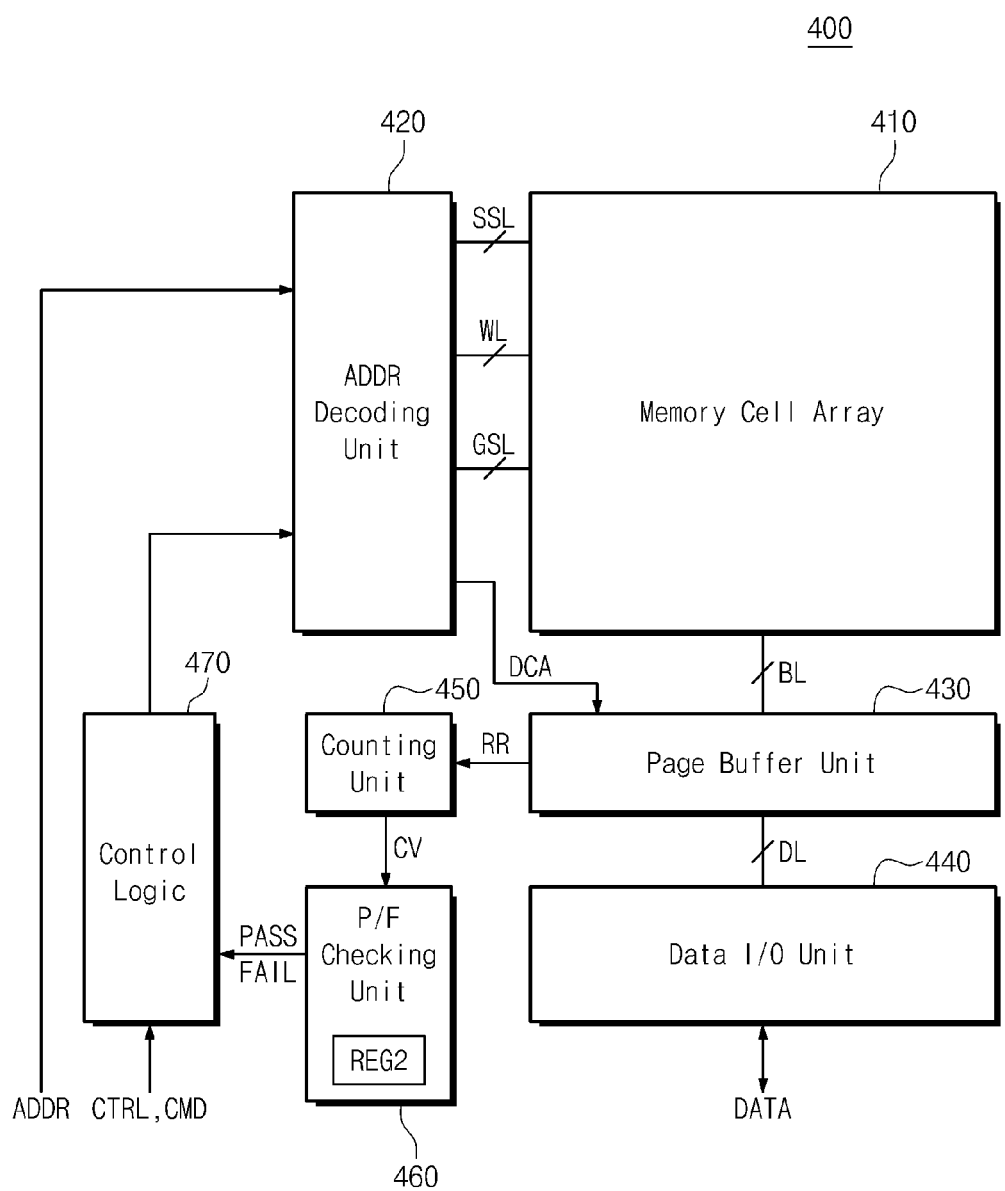
FIG. 19 is a block diagram illustrating a nonvolatile memory device according to an exemplary embodiment of the inventive concept.

FIG. 19 is a block diagram illustrating a nonvolatile memory device 400 according to an exemplary embodiment of the inventive concept. Referring to FIG. 19, the nonvolatile memory device 400 may include a memory cell array 410, an address decoding unit 420, a page buffer unit 430, a data input/output unit 440, a counting unit 450, a pass/fail checking unit 460, and a control logic 470.

The memory cell array 410 may have the same structure as illustrated in FIG. 1.

The address decoding unit 420 may be connected with the memory cell array 410 via string selection lines SSL, word lines WL, and ground selection lines GSL. The address decoding unit 420 may provide a decoded column address DCA to the page buffer unit 430.

The page buffer unit 430 may be connected with the memory cell array 410 via bit lines and with the data input/output unit 440 via data lines DL. The page buffer unit 430 may output a read result (including an erase verification read result).

The counting unit 450 may count an input read result RR to output a count value CV.

The pass/fail checking unit 460 may compare an input count value CV with a value stored in a register REG2 to output a pass signal PASS or a fail signal FAIL according to a comparison result.

The control logic 470 may control an overall operation of the nonvolatile memory device 400.

Figure 20:
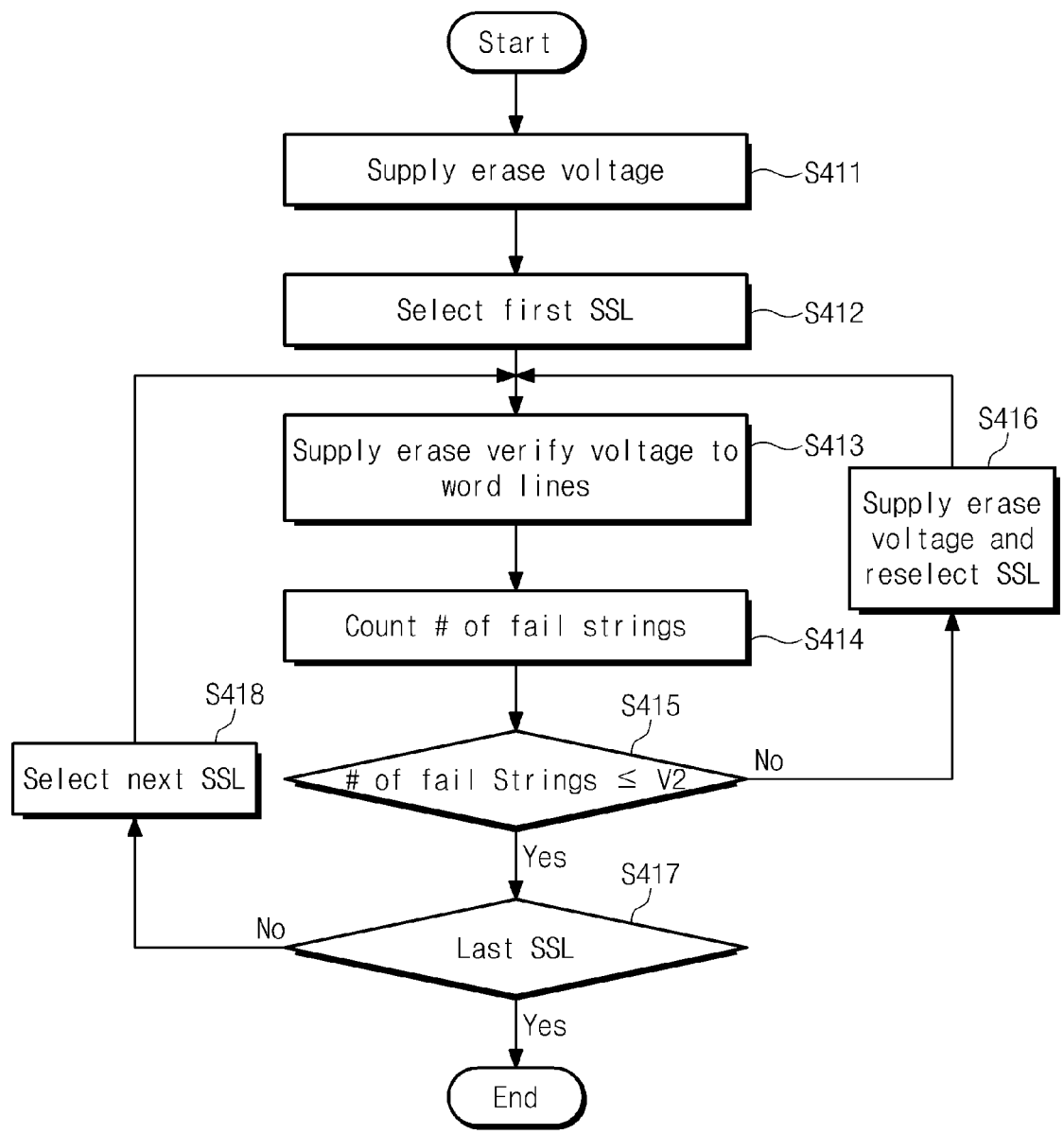
FIG. 20 is a flowchart illustrating an erase method according to an exemplary embodiment of the inventive concept.

FIG. 20 is a flowchart illustrating an erase method according to an exemplary embodiment of the inventive concept. FIG. 21 is a diagram illustrating a voltage condition generated and usable in the erase method of FIG. 20. Referring to FIGS. 7, 19, and 20, in operation S411, an erase voltage may be supplied.

In operation S412, the first string selection line SSL1 may be selected.

Bit lines BL1 and BL2 may be floated, and string selection lines SSL1 and SSL2 may be floated or supplied with the sixth string selection line voltage VSSL6. The second word line voltage Vwe2 may be a ground voltage VSS or a low voltage (including a positive voltage and a negative voltage) having a similar level to the ground voltage VSS. A ground selection line GSL may be floated or supplied with the fourth ground selection line VGSL4. A common source line CSL may be floated. The second erase voltage Vers2 may be supplied to a substrate 111. The second erase voltage Vers2 may be a high voltage. The sixth string selection line voltage VSSL6 and the fourth ground selection line voltage VGSL4 may have a level between the second erase voltage Vers2 and the ground voltage VSS.

When the second erase voltage Vers2 is supplied, voltages of a memory cell array 410 may vary as illustrated in FIG. 10.

In operation S413, an erase verification operation may be made by supplying an erase verification voltage.

The fourth bit line voltage VBL4 may be supplied to the bit lines BL1 and BL2. The fourth bit line voltage VBL4 may be a power supply voltage VCC or a voltage having a similar level to the power supply voltage VCC.

The seventh string selection line voltage VSSL7 may be supplied to the selected string selection line SSL1. The seventh string selection line voltage VSSL7 may be a voltage sufficient to turn on the selected string selection transistors SST1. The seventh string selection line voltage VSSL7 may be a non-selection read voltage Vread or the power supply voltage VCC.

The eighth string selection line voltage VSSL8 may be provided to the unselected string selection line SSL2. The eighth string selection line voltage VSSL8 may be a voltage sufficient to turn on the unselected string selection line transistors SST2. The eighth string selection line voltage VSSL8 may be the ground voltage VSS or a low voltage (including a positive voltage and a negative voltage) having a similar level to the ground voltage VSS.

The second verification voltage VFY2 may be supplied to word lines WL1 to WL6. The second verification voltage VFY2 may be upper limit of threshold voltages of erased memory cells. The second verification voltage VFY2 may be the ground voltage VSS or a negative voltage.

The fifth ground selection line voltage VGSL5 may be applied to a ground selection line GSL. The fifth ground selection line voltage VGSL5 may be a voltage sufficient to turn on ground selection transistors GST. The fifth ground selection line voltage VGSL5 may be a non-selection read voltage Vread or the power supply voltage VCC.

The third common source line voltage VCSL3 may be provided to a common source line CSL. The third common source line voltage VCSL3 may be the ground voltage VSS or a low voltage (including a positive voltage and a negative voltage) having a similar level to the ground voltage VSS.

The third substrate voltage VSUB3 may be supplied to the substrate 111. The third substrate voltage VSUB3 may be the ground voltage VSS or a low voltage (including a positive voltage and a negative voltage) having a similar level to the ground voltage VSS.

When an erase verification voltage is supplied, voltages of the memory cell array 410 may vary as illustrated in FIG. 12.

When memory cells MC1 to MC6 in a specific string are turned on according to the second verification voltage VFY2, a voltage of a bit line connected with the specific string may lower from the fourth bit line voltage VBL4. When at least one memory cell in the specific string is turned off according to the second verification voltage VFY2, a bit line connected with the specific string may maintain the fourth bit line voltage VBL4. Turned-off strings may be erase-failed strings.

When a voltage of a specific bit line is below a reference voltage Vref, a page buffer unit 430 may store the second logic value in a latch (not illustrated) corresponding to the specific bit line. When a voltage of the specific bit line is over the reference voltage Vref, the page buffer unit 430 may store the first logic value in a latch (not illustrated) corresponding to the specific bit line. Bit lines connected with off strings may maintain the fourth bit line voltage VBL4. That is, the page buffer unit 430 may store the first logic value in latches corresponding to off strings. Data stored in the page buffer unit 430 may be an erase verification read result RR, which is provided to a counting unit 450.

In operation S414, the number of fail strings may be counted. The fail strings may indicate erase-failed cell strings. The counting unit 450 may count the first logic value of the erase verification read result RR, that is, the number of erase-failed strings. A count value CV may be provided to a pass/fail checking unit 460.

In operation S415, the number of fail strings may be compared with a second reference value V2. The pass/fail checking unit 460 may compare the count value CV with the second reference value V2 stored in a register REG2. If the count value CV is larger than the second reference value V2, the pass/fail checking unit 460 may output a fail signal FAIL. According to the fail signal FAIL, operation S416 may be executed under the control of control logic 470. In operation S416, an erase voltage may be supplied and a previously selected string selection line may be selected again. Afterwards, the method proceeds to operation S413.

If the count value CV is below the second reference value V2, that is, if the number of fail strings is below the second reference value V2, the pass/fail checking unit 460 may output a pass signal PASS. According to the pass signal PASS, operation S417 may be executed under the control of the control logic 470.

In operation S417, it may be determined whether the selected string selection line SSL1 is a last string selection line. If the selected string selection line SSL1 is not the last string selection line, in operation S418, a next string selection line SSL2 may be selected. Afterwards, the method proceeds to operation S413. If the selected string selection line SSL1 is the last string selection line, the method may be ended.

In an exemplar embodiment, the second reference value V2 may indicate the number of bits capable of being corrected by an error correcting unit (not illustrated), which is configured to correct errors of data read from a nonvolatile memory device 400. The second reference value V2 may have a value less than a correctable error bit number of the error correcting unit (not illustrated) and may be determined according to the correctable error bit number. For example, the second reference value V2 may be determined according to a specific ratio on a correctable error bit number.

As described above, if the number of fail strings is below the second reference value V2, the method may be ended. Off strings may be determined to be failed strings. That is, although off strings exits, the nonvolatile memory device 400 may operate normally.

In an exemplary embodiment, as described with reference to FIGS. 16 and 17, the nonvolatile memory device 400 may be configured to perform a pre-read operation.

Figure 22:
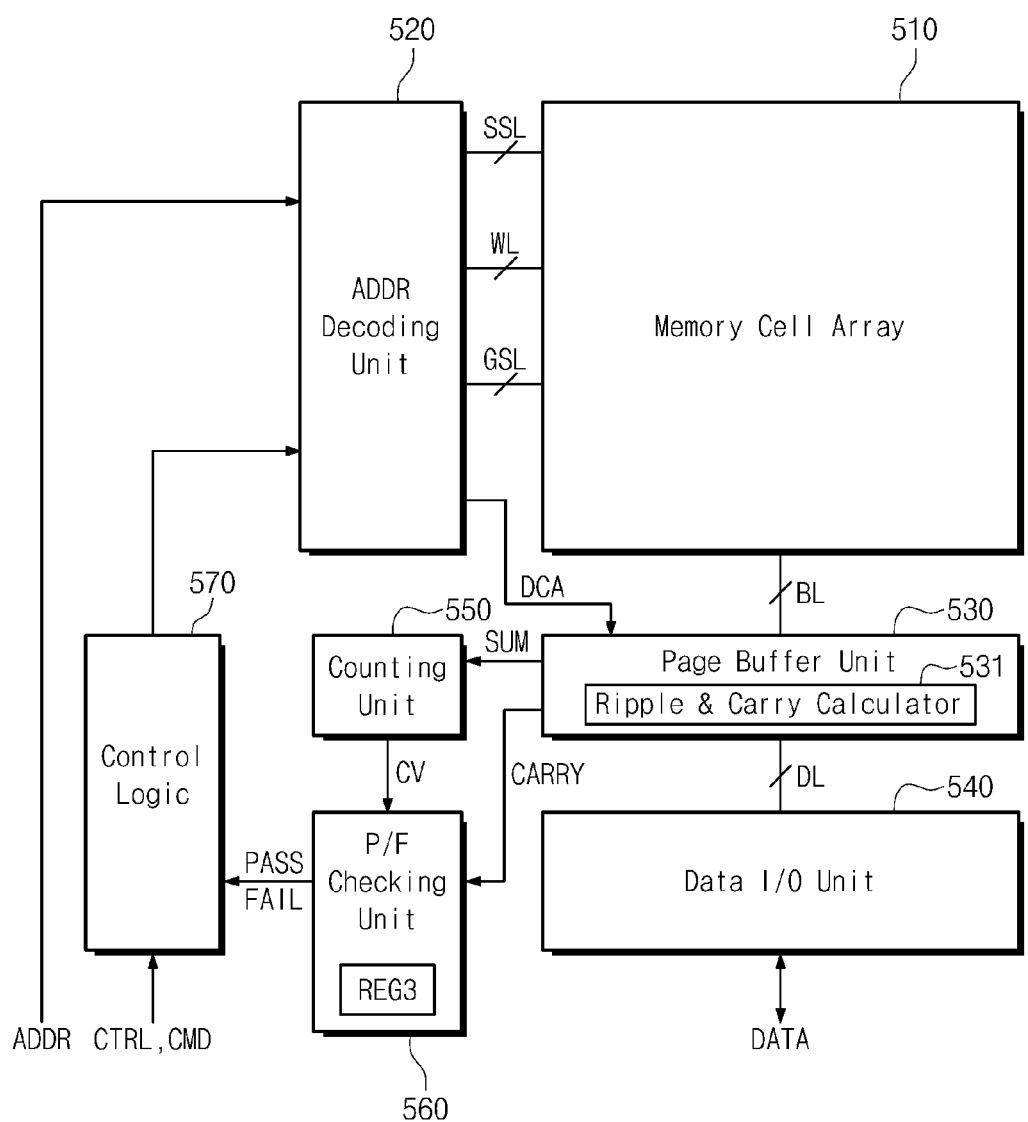
FIG. 22 is a block diagram illustrating a nonvolatile memory device according to an exemplary embodiment of the inventive concept.

FIG. 22 is a block diagram illustrating a nonvolatile memory device 500 according to an exemplary embodiment of the inventive concept. Referring to FIG. 22, the nonvolatile memory device 500 may include a memory cell array 510, an address decoding unit 520, a page buffer unit 530, a data input/output unit 540, a counting unit 550, a pass/fail checking unit 560, and a control logic 570.

The elements 510, 520, 540, 550, and 570 may be identical to those illustrated in FIG. 19.

The page buffer 530 may include a ripple and carry calculator 531. The ripple and carry calculator 531 may output a sum signal SUM and a carry signal CARRY according to an erase verification read result.

The counting unit 550 may be configured to receive the sum signal SUM from the page buffer unit 530. The counting unit 550 may be configured to count an activation number of the sum signal SUM. The counting unit 550 may output a count value CV.

The pass/fail checking unit 560 may receive the carry signal CARRY from the page buffer unit 530 and the count value CV from the counting unit 550. When the carry signal CARRY is activated, the pass/fail checking unit 560 may activate a fail signal FAIL. When the carry signal is at an inactive state, the pass/fail checking unit 560 may compare the count value CV with a reference value stored in a register REG3 to output a pass signal PASS or a fail signal FAIL according to a comparison result.

Figure 23:
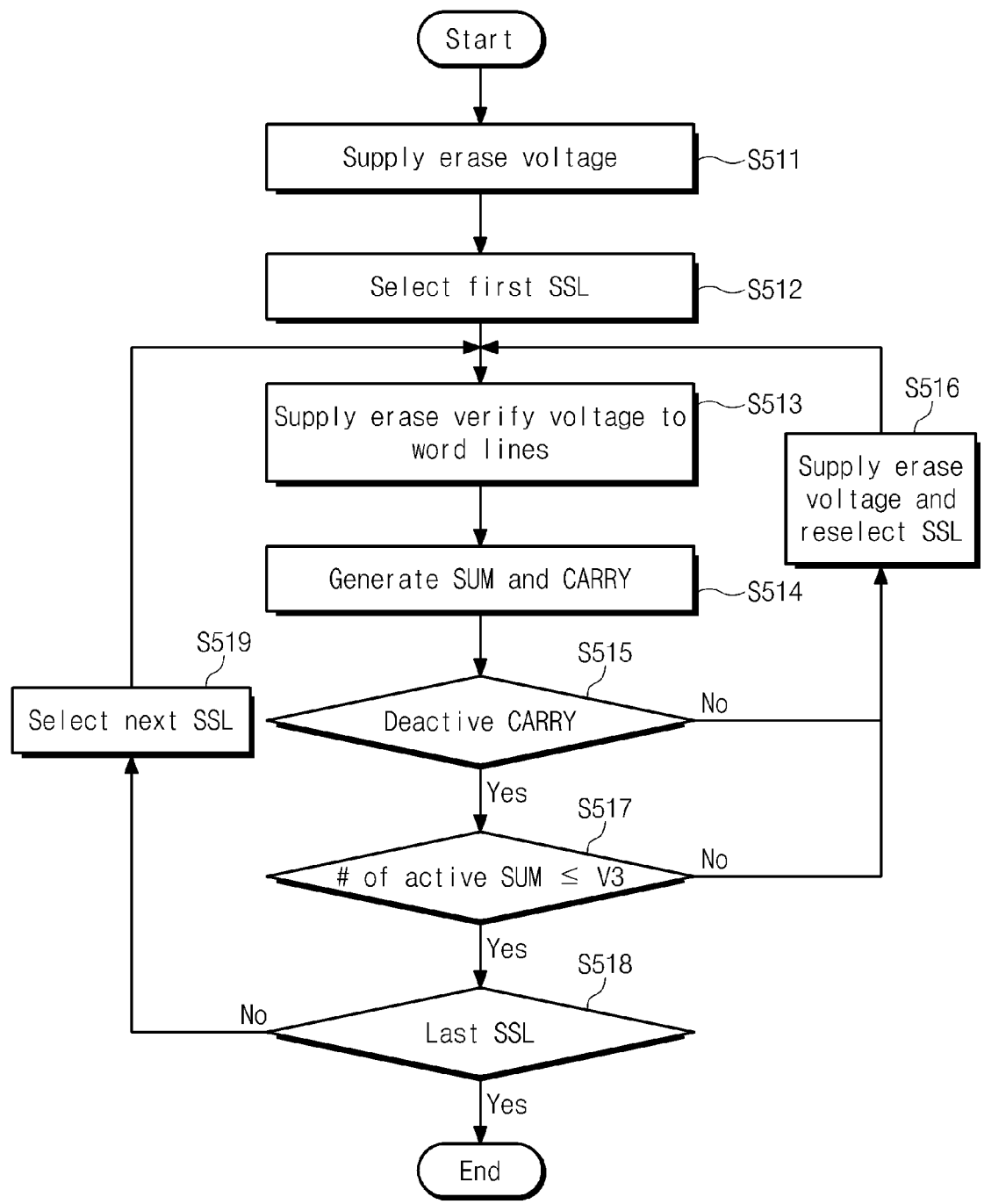
FIG. 23 is a flowchart illustrating an erase method according to an exemplary embodiment of the inventive concept.

FIG. 23 is a flowchart illustrating an erase method according to an exemplary embodiment of the inventive concept. Referring to FIGS. 7, 22, and 23, in operation S511, an erase voltage may be supplied.

In operation S512, the first string selection line SSL1 may be selected. In operation S513, an erase verification operation may be made by supplying an erase verification voltage. Voltages supplied to a memory cell array 510 in operation S512 and S513 may be identical to those illustrated in FIG. 21. If operations S512 and S513 are executed, an erase verification read result may be stored in latches (not illustrated) included in the page buffer unit 530. For example, the second logic value may be stored in latches (not illustrated) corresponding to erase-passed strings, and the first logic value may be stored in latches (not illustrated) corresponding to erase-failed strings.

In operation S514, a sum signal SUM and a carry signal CARRY may be generated. The ripple and carry calculator 531 of the page buffer unit 530 may generate the sum and carry signals SUM and CARRY according to the erase verification read result. This will be more fully described with reference to FIG. 24.

In operation S515, it is determined whether the carry signal CARRY is at an inactive state. If the carry signal CARRY is at an active state, the pass/fail checking unit 560 may generate a fail signal FAIL. According to the fail signal FAIL, operation S516 may be executed under the control of the control logic 570. In operation S516, an erase operation may be performed, and a previously selected string selection line may be selected again. Afterwards, the method proceeds to operation S513.

If the carry signal CARRY is at an inactive state, the method proceeds to operation S517, in which an activation number of the sum signal SUM is compared with a third reference value V3. The counting unit 550 may provide the pass/fail checking unit 560 with a count value CV indicating an activation number of the sum signal SUM. The pass/fail checking unit 560 may generate a fail signal FAIL when the count value CV is larger than the third reference value V3. According to the fail signal FAIL, operation S516 may be executed under the control of the control logic 570. If the count value CV is below the third reference value V3, the fail checking unit 560 may generate a pass signal PASS. According to the pass signal PASS, operation S518 may be executed under the control of the control logic 570.

In operation S518, it may be determined whether the selected string selection line SSL1 is a last string selection line. If the selected string selection line SSL1 is not the last string selection line, in operation S519, a next string selection line SSL2 may be selected. Afterwards, the method proceeds to operation S513. If the selected string selection line SSL1 is the last string selection line, the method may be ended.

Figure 24:
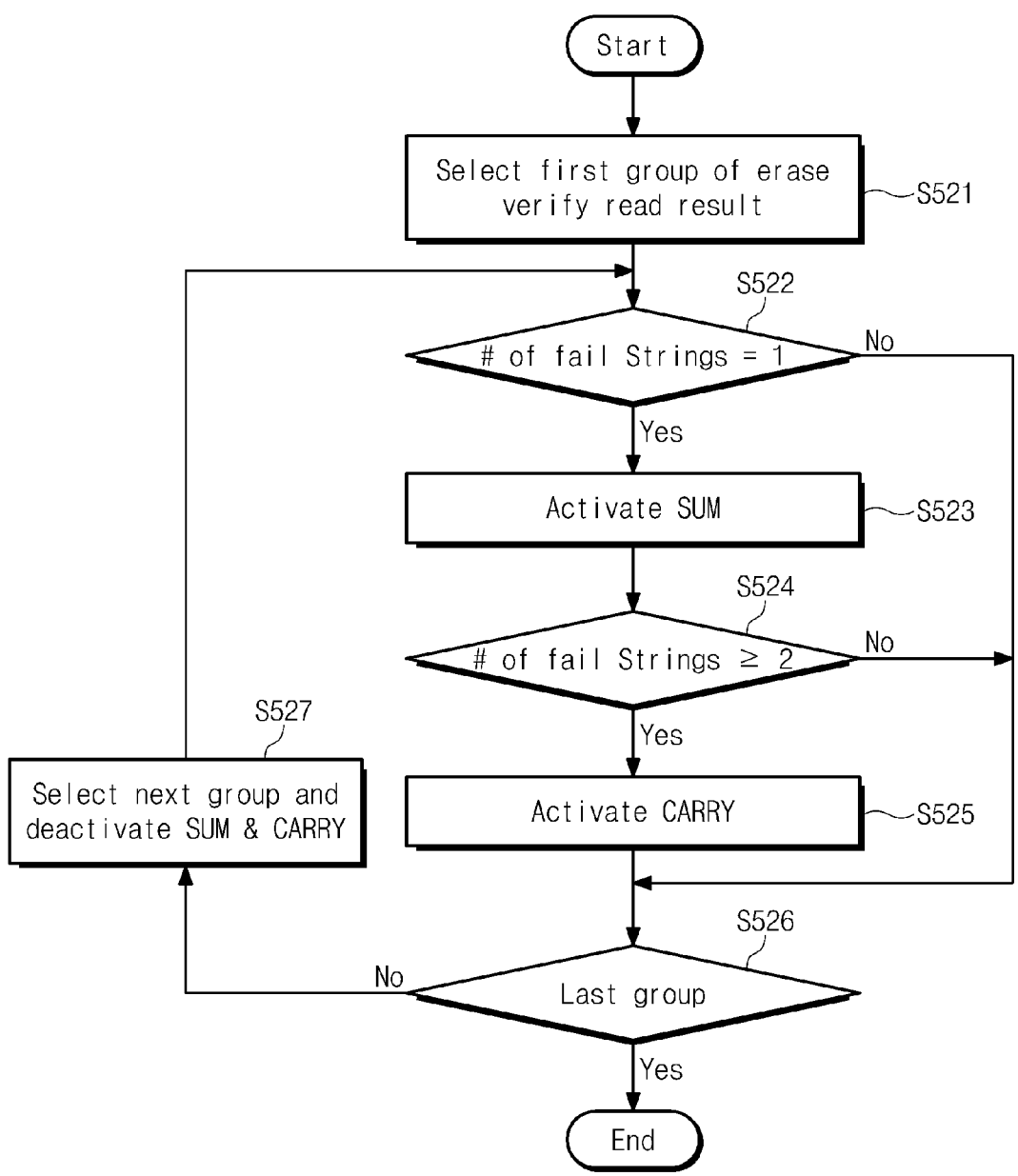
FIG. 24 is a flowchart illustrating a method of generating a sum signal and a carry signal.

FIG. 24 is a flowchart illustrating a method of generating a sum signal and a carry signal. Referring to FIGS. 7, 22, and 24, in operation S521, a first group of an erase verification read result may be selected. For example, the erase verification read result may be divided into a plurality of groups, and the first one of the divided groups may be selected.

In operation S522, it may be determined whether the number of fail strings represented by an erase verification read result of the selected group is one. In an exemplary embodiment, the first logic value of a verification result of the selected group may indicate a fail string. It may be determined whether the number of the first logic values of the verification result of the selected group is 1. If so, the method proceeds to operation S523. If not, the method processed to operation S524. In operation S523, a sum signal SUM is activated. The ripple and carry calculator 531 may activate the sum signal SUM. Afterwards, the method proceeds to operation S526.

In operation S524, it may be determined whether the number of fail strings is over 2. In an exemplary embodiment, it may be determined whether the number of the first logic values of the verification result of the selected group is over 2. If so, the method proceeds to operation S525. If not, the method proceeds to operation S526. In operation S525, a carry signal CARRY may be activated. Afterwards, the method proceeds to operation S526.

If operation S522 to S525 are executed, the page buffer unit 530 may activate the sum signal SUM or the carry signal CARRY or may inactivate the sum signal SUM and the carry signal CARRY. If one fail string is detected, the sum signal SUM may be activated. If two or more fail strings are detected, the carry signal CARRY may be activated.

In operation S526, it may be determined whether the selected group is a last group. If the selected group is not the last group, the sum and carry signals SUM and CARRY may be inactivated, and a next group may be selected in operation in operation S527. Afterwards, the method proceeds to step S521. If the selected group is the last group, generation of the sum and carry signals SUM and CARRY may be ended.

As described with reference to FIG. 24, if the carry signal CARRY is activated, the fail signal FAIL may be activated. That is, if two or more fail strings are detected from an erase verification read result of a selected group, erase fail may be determined.

When the carry signal CARRY is at an inactivate state, an activation number of the sum signal SUM may be compared with the third reference value V3, and erase fail or erase pass may be determined according to a comparison result. That is, erase pass may be determined when each group does not include two or more fail strings and the number of fail strings of a total erase verification read result is below the third reference value V3.

The third reference value V3 may indicate the number of bits capable of being corrected by an error correcting unit (not illustrated), which is configured to correct errors of data read from a nonvolatile memory device 500. The third reference value V3 may have a value less than a correctable error bit number of the error correcting unit (not illustrated) and may be determined according to the correctable error bit number. For example, the third reference value V3 may be determined according to a specific ratio on a correctable error bit number.

Figure 25:
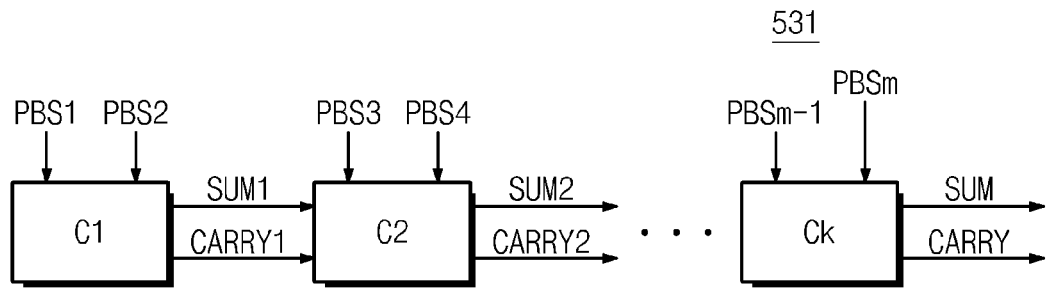
FIG. 25 is a block diagram illustrating a ripple and carry calculator according to an exemplary embodiment of the inventive concept.

FIG. 25 is a block diagram illustrating a ripple and carry calculator 531 of the nonvolatile memory device 500 according to an exemplary embodiment of the inventive concept. In an exemplary embodiment, the page buffer unit 530 may have a structure illustrated in FIG. 14. Page buffer signal lines PBS1 to PBSm may be connected with a ripple and carry calculator 531.

Referring to FIGS. 7, 14, 22, and 25, the ripple and carry calculator 531 may include a plurality of calculators C1 to Ck. The adjacent ones of the page buffer signal lines PBS1 to PBSm may be connected with one calculator. For example, the first and second page buffer signal lines PBS1 and PBS2 may be connected with the first calculator C1, the third and fourth page buffer signal lines PBS3 and PBS4 may be connected with the second calculator C2, and the page buffer signal lines PBSm–1 and PBSm may be connected with the calculator Ck.

As transfer signals PF1 to PFn are activated sequentially, the page buffers PB1 to PBn may output an erase verification read result to the page buffer signal lines PBS1 to PBSm sequentially. That is, an erase verification read result may be divided into a plurality of groups by stages Stage1 to Stagen of the page buffers PB1 to PBn.

The first calculator C1 may sum logic values of the first and second page buffer signal lines PBS1 and PBS2 to output the first sum signal SUM1. For example, the first calculator C1 may output the first sum signal SUM1 by performing an XOR operation with the logic values of the first and second page buffer signal lines PBS1 and PBS2. When the first and second page buffer signal lines PBS1 and PBS2 have the first logic value (e.g., a logic high level), the first calculator C1 may output the first carry signal CARRY1 as the first logic value.

The second calculator C2 may output the second sum signal SUM2 by performing an XOR operation the logic values of the third and fourth page buffer signal lines PBS3 and PBS4. When the third and fourth page buffer signal lines PBS3 and PBS4 have the first logic value or when an XOR value of logic values of the third and fourth page buffer signal lines PBS3 and PBS4 and the first sum signal SUM1 have the first logic value, the second calculator C2 may output the second carry signal CARRY2 as the first logic value. When the first carry signal CARRY1 has the first logic value, the second calculator C2 may output the second carry signal CARRY2 as the first logic value.

The calculator Ck may operate the same as the second calculator C2. The calculator Ck may output a sum signal SUM and a carry signal CARRY based upon output signals of a page buffer unit 530 and output signals of a previous stage. When the sum signal SUM or the carry signal CARRY has the first logic value, the sum signal SUM or the carry signal CARRY may be activated. The sum signal may be provided to a counting unit 550, and the carry signal CARRY may be provided to a pass/fail checking unit 560.

As described above, when the number of fail strings is within a correctable range, erase pass may be determined. Off string may be determined to be fail strings at an erase verification operation. Accordingly, although off strings exist, the nonvolatile memory device 500 may operate normally.

Figure 26:
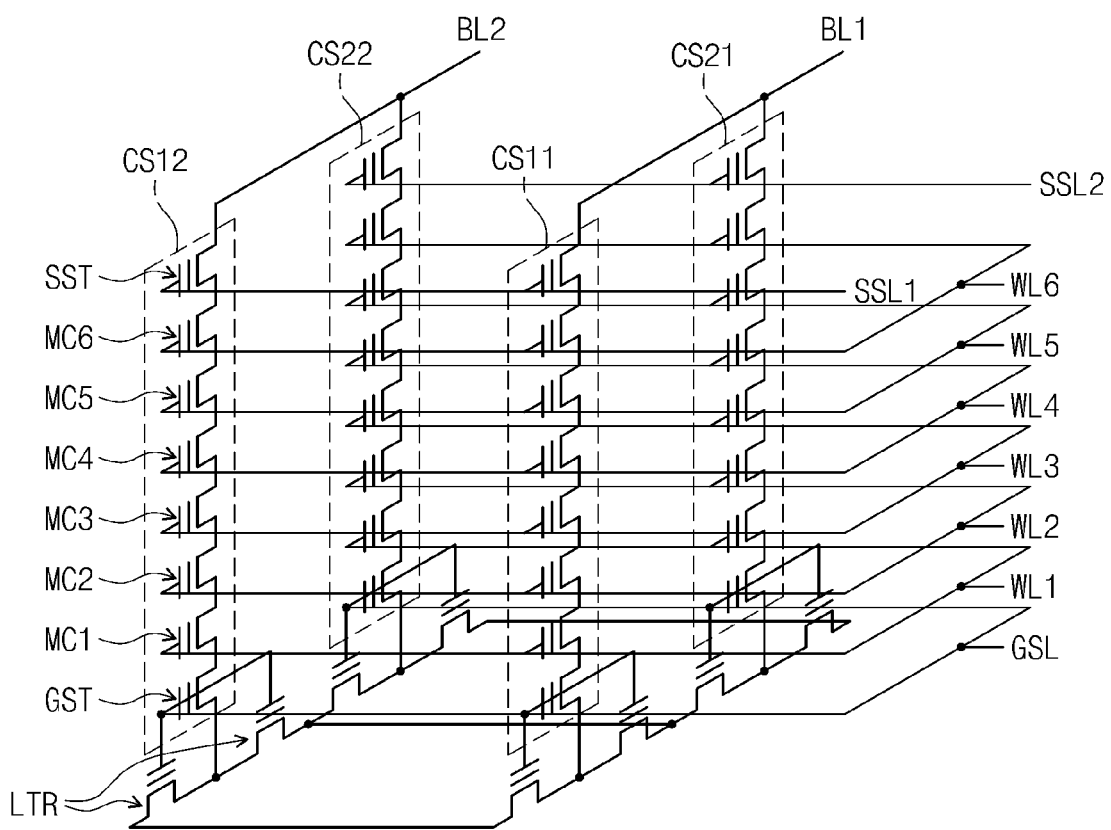
FIG. 26 is a circuit diagram illustrating an equivalent circuit of a portion EC of FIG. 3 according to an exemplary embodiment of the inventive concept.

FIG. 26 is a circuit diagram illustrating an equivalent circuit BLKa2 of a portion EC of FIG. 3 according to an exemplary embodiment of the inventive concept. The equivalent circuit BLKa2 of FIG. 26 may be different from that illustrated in FIG. 7 in that lateral transistors LTR are added in each cell string.

Referring to FIGS. 3 to 6 and 26, lateral transistors LTR in each cell string may be connected between a ground selection transistor GST and a common source line CSL. Gates of the lateral transistors LTR in each cell string may be connected to a ground selection line GSL together with a gate (or, a control gate) of a ground selection transistor GST therein.

Channel films 114 may operate as vertical bodies of the first conductive materials CM1. That is, the first conductive materials CM1 may constitute vertical transistors together with the channel films 114. The first conductive materials CM1 may constitute ground selection transistors GST vertical to a substrate 111 together with the channel films 114.

Information storage films 116 may be provided between the substrate 111 and the first conductive materials CM1. The substrate 111 may act as a horizontal body of the first conductive materials CM1. That is, the first conductive materials CM1 may form the vertical transistors LTR together with the substrate 111.

When a voltage is applied to the first conductive materials CM1, an electric field may be forced between the first conductive materials CM1 and the channel films 114. The electric field may enable channels to be formed at the channel films 114. When a voltage is applied to the first conductive materials CM1, an electric field may be forced between the first conductive materials CM1 and the substrate 111. The electric field may enable channels to be formed at the substrate 111. Channels formed at the substrate 111 may be coupled with common source regions CSR and the channel films 114. When a voltage is applied to the ground selection line GSL, the ground selection transistors GST and the lateral transistors LTR may be turned on. This may enable cell strings CS11, CS12, CS21, and CS22 to be connected with a common source line CSL.

Figure 27:
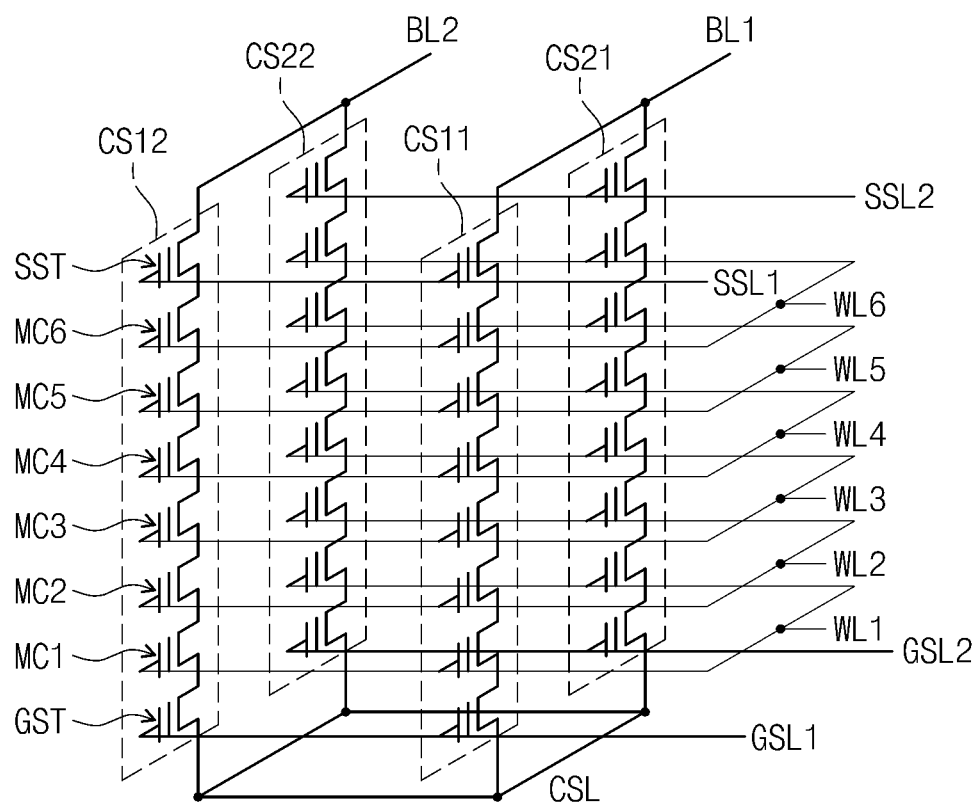
FIG. 27 is a circuit diagram illustrating an equivalent circuit of a portion EC of FIG. 3 according to an exemplary embodiment of the inventive concept.

FIG. 27 is a circuit diagram illustrating an equivalent circuit BLKa3 of a portion EC of FIG. 3 according to an exemplary embodiment of the inventive concept. The equivalent circuit BLKa3 of FIG. 27 may be different from that illustrated in FIG. 7 in that ground selection transistors GST are connected with the first and second ground selection lines GSL1 and GSL2. Referring to FIGS. 3, 6, and 27, the first conductive materials CM1 may constitute the first and second ground selection lines GSL1 and GSL2.

Memory cells may be erased in the same manner as described with reference to FIGS. 8 to 13, 20, 21, 23, and 24. A turn-on voltage may be applied to a selected ground selection line, and a turn-off voltage may be applied to an unselected ground selection line. The selected ground selection line may be biased the same as a selected string selection line, and the unselected ground selection line may be biased the same as an unselected string selection line.

Pre-reading may be made with respect to memory cells MC1 to MC6 in the same manner as described with reference to FIGS. 16 and 17. A turn-on voltage may be applied to a selected ground selection line, and a turn-off voltage may be applied to an unselected ground selection line. The selected ground selection line may be biased the same as a selected string selection line, and the unselected ground selection line may be biased the same as an unselected string selection line.

As described with reference to FIG. 26, lateral transistors LTR can be provided to the equivalent circuit BLKa3.

Figure 28:
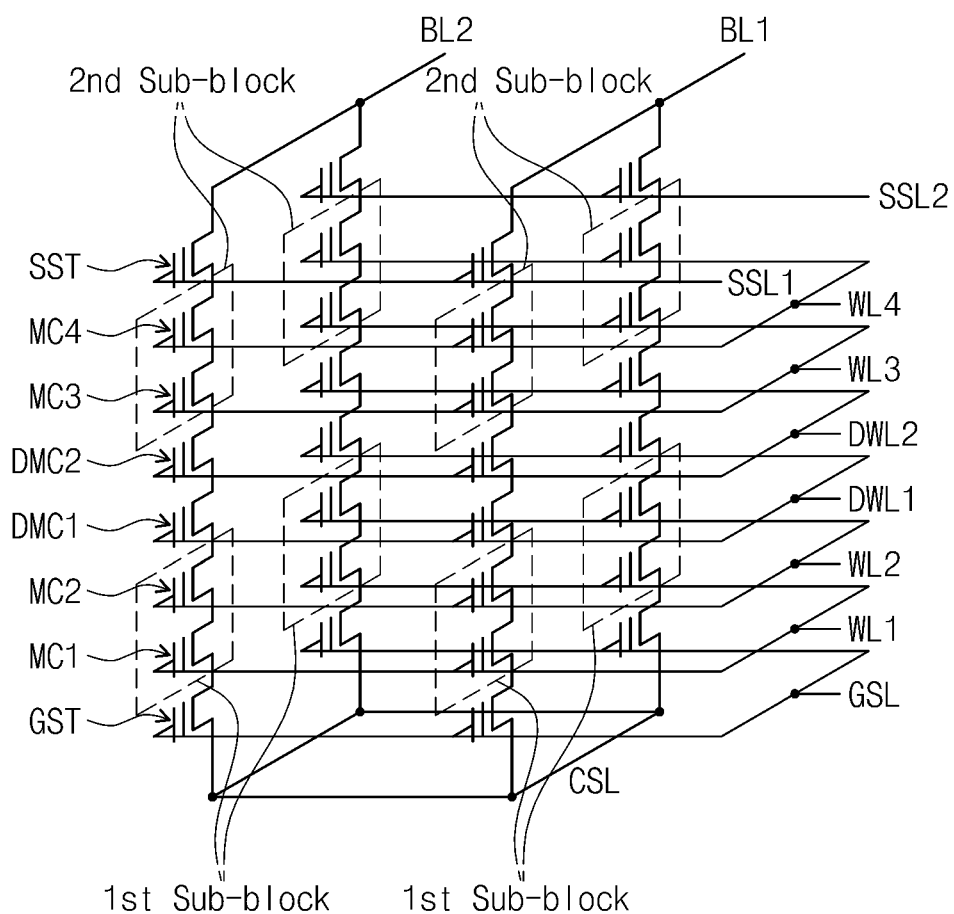
FIG. 28 is a circuit diagram illustrating an equivalent circuit of a portion EC of FIG. 3 according to an exemplary embodiment of the inventive concept.

FIG. 28 is a circuit diagram illustrating an equivalent circuit BLKa4 of a portion EC of FIG. 3 according to an exemplary embodiment of the inventive concept. Referring to FIGS. 3 to 6 and 28, a plurality of sub blocks may be provided. In this embodiment, the second and third conductive materials CM2 and CM3 may constitute the first and second memory cells MC1 and MC2, which are used as the first sub block. The sixth and seventh conductive materials CM6 and CM7 may constitute the third and fourth memory cells MC3 and MC4, which are used as the second sub block. The fourth and fifth conductive materials CM4 and CM5 may constitute the first and second dummy memory cells DMC1 and DMC2 provided between the first and second sub blocks. The first and second sub blocks may be programmed, read, and erased independently from each other.

Memory cells MC1 to MC4 may be erased in the same method as described with reference to FIGS. 8 to 13, 20, 21, 23, and 24. When the memory cells MC1 to MC4 are erased according to a method described with reference to FIGS. 8 to 13, voltages supplied to the memory block BLKa4 are illustrated in FIG. 29. As compared with voltages in FIG. 9, when an erase voltage Vers1 is supplied, the first word line erase voltage Vers1 may be supplied to word lines of a selected sub block, and word lines of an unselected sub block may be floated or supplied with the first word line voltage VWL1. The first word line voltage VWL1 may have a level between an erase voltage Vwe1 and a ground voltage VSS.

Dummy word lines DWL1 and DWL2 may be floated or supplied with the first dummy word line voltage VDWL1. The first dummy word line voltage VDWL1 may have a level between an erase voltage Vwe1 and a ground voltage VSS.

When the first erase voltage Vers1 is supplied, memory cells of a selected sub block may be erased, and memory cells of an unselected sub block and dummy memory cells may not be erased.

When a pre-read operation is carried out, the first high voltage VH1 may be applied to word lines WL1 to WL4. The first high voltage VH1 may be a non-selection read voltage Vread. The second dummy word line voltage VDWL2 may have a level sufficient to turn on dummy memory cells DMC1 and DMC2. The second dummy word line voltage VDWL2 may be identical to or lower in level than the non-selection read voltage Vread.

When an erase verification operation is performed, a verification voltage VFY1 may be applied to word lines of a selected sub block, and the second high voltage VH2 may be supplied to word lines of an unselected sub block. The second high voltage VH2 may be a non-selection read voltage Vread. The third dummy word line voltage VDWL3 may be applied to dummy word lines DWL1 and DWL2. The third dummy word line voltage VDWL3 may have a level sufficient to turn on dummy memory cells DMC1 and DMC2. The third dummy word line voltage VDWL3 may be identical to or lower in level than the non-selection read voltage Vread.

When memory cells are erased according to a method described with reference to FIGS. 20 and 21, voltages supplied to the memory block BLKa4 is illustrated in FIG. 30. As compared with voltages in FIG. 21, when an erase voltage Vers2 is supplied, a word line erase voltage Vwe2 may be applied to word lines of a selected sub block, and word lines of an unselected sub block may be floated or supplied with the second word line voltage VWL2. The second word line voltage VWL2 may have a level between the erase voltage Vwe2 and a ground voltage VSS.

Dummy word lines DWL1 and DWL2 may be floated or supplied with the fourth dummy word line voltage VDWL4. The fourth dummy word line voltage DVWL4 may have a level between the erase voltage Vwe2 and a ground voltage VSS.

When an erase verification operation is performed, a verification voltage VFY2 may be provided to word lines of a selected sub block, and the third word line voltage VWL3 may be applied to word lines of an unselected sub block. The third word line voltage VWL3 may be a voltage sufficient to turn on memory cells. The third word line voltage VWL3 may have an identical or similar level to the non-selection read voltage Vread.

The fifth dummy word line VDWL5 may be applied to dummy word lines DWL1 and DWL2. The fifth dummy word line voltage VDWL5 may be a voltage sufficient to turn on dummy memory cells DMC1 and DMC2. The fifth dummy word line voltage DVWL5 may have an identical or similar level to the non-selection read voltage Vread.

When memory cells MC1 to MC4 are erased according to a method described with reference to FIGS. 20 and 21, voltages supplied to the memory block BLKa4 may be identical to those illustrated in FIG. 29.

When a pre-read operation is made with respect to memory cells MC1 to MC4 according to a method described with reference to FIGS. 16 and 17, voltages supplied to the memory block BLKa4 may be identical to voltages supplies at steps S113 and S114 of FIG. 29.

As described with reference to FIG. 26, lateral transistors LTR can be provided to the equivalent circuit BLKa4.

Figure 31:
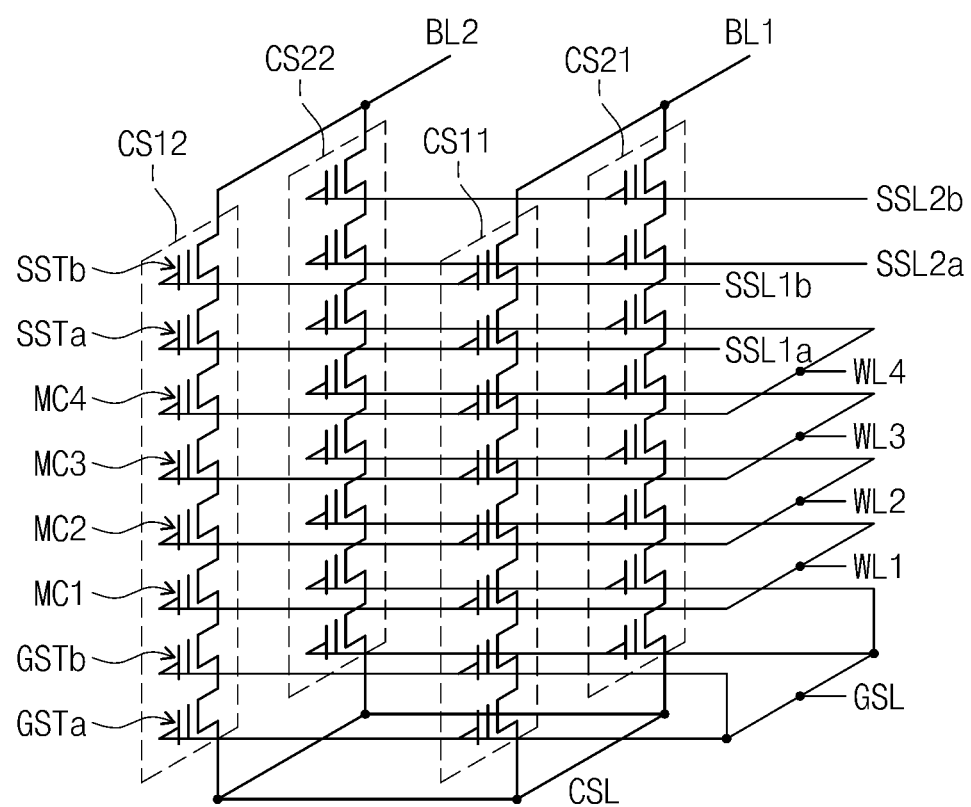
FIG. 31 is a circuit diagram illustrating an equivalent circuit of a portion EC of FIG. 3 according to an exemplary embodiment of the inventive concept.

FIG. 31 is a circuit diagram illustrating an equivalent circuit BLKa5 of a portion EC of FIG. 3 according to an exemplary embodiment of the inventive concept. Referring to FIGS. 3 to 6, and 31, the first and second conductive materials CM1 and CM2 may constitute ground selection transistors GSTa and GSTb each having the first and second heights. The seventh and eighth conductive materials CM7 and CM8 may constitute string selection transistors SSTa and SSTb each having seventh and eighth heights. The third to sixth conductive materials CM3 to CM6 may constitute the first to fourth memory cells MC1 to MC4.

The first and second conductive materials CM1 and CM2 may be connected in common to form a ground selection line GSL. The first conductive material CM1 may be connected in common to form a ground selection line (not illustrated) having the first height. The second conductive material CM2 may be connected in common to form a ground selection line (not shown) having the second height.

The cell strings CS11 and CS12 may be connected with two ground selection lines (not shown) which have the first and second heights, respectively, and are formed by the first and second conductive materials CM1 and CM2. The cell strings CS21 and CS22 may be connected with two ground selection lines (not shown) which have the first and second heights, respectively, and are formed by the first and second conductive materials CM1 and CM2. Conductive materials corresponding to at least three heights can form ground selection transistors.

The cell strings CS11 and CS12 may be connected with two string selection lines SSL1a and SSL1b each having the seventh and eighth heights and formed by the seventh and eighth conductive materials CM7 and CM8. The cell strings CS21 and CS22 may be connected with two string selection lines SSL2a and SSL2b each having the seventh and eighth heights and formed by the seventh and eighth conductive materials CM7 and CM8. Conductive materials each corresponding to at least three heights can form string selection transistors.

The memory cells MC1 to MC4 may be erased in the same method as described with reference to FIGS. 8 to 13, 20, 21, 23, and 24. A pre-read operation may be made with respect to the memory cells MC1 to MC4 in the same method as described in FIGS. 16 and 17.

Like the equivalent circuit BLKa2 described with reference to FIG. 26, lateral transistors LTR may be provided to the equivalent circuit BLKa5 of FIG. 31. Like the equivalent circuit BLKa3 described with reference to FIG. 27, cell strings CS11 and CS12 may be connected with one ground selection line (not illustrated), and cell strings CS21 and CS22 may be connected with another ground selection line (not illustrated). Like the equivalent circuit BLKa4 described with reference to FIG. 28, memory cells MC may constitute a plurality of sub blocks.

Figure 32:
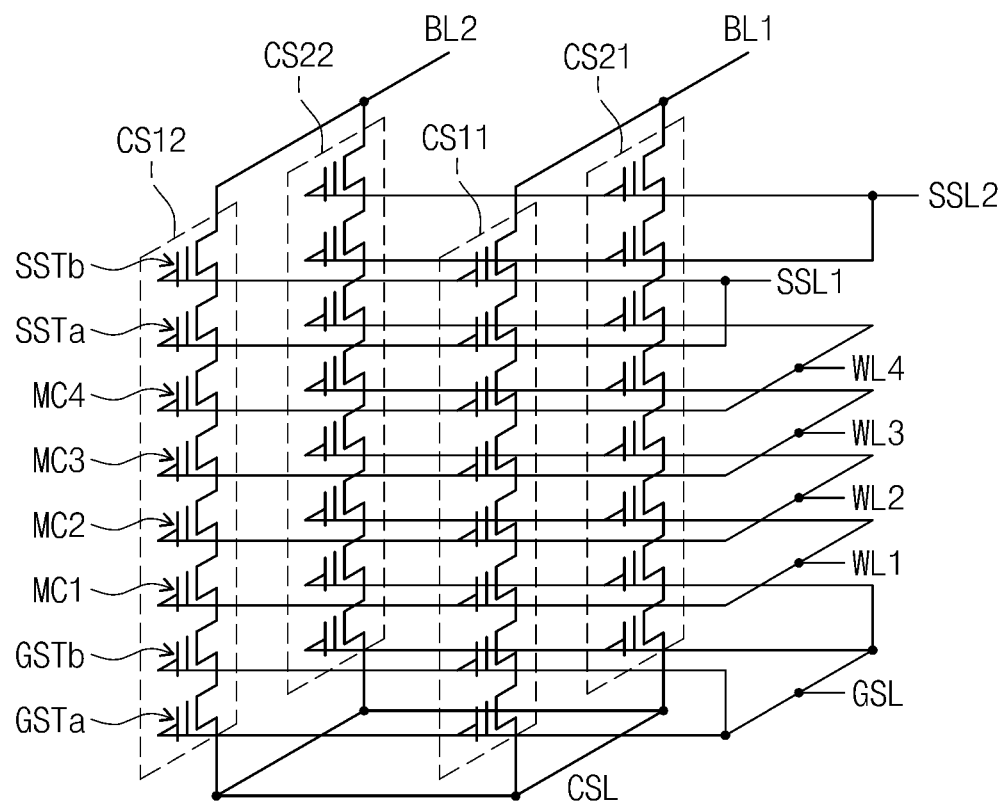
FIG. 32 is a circuit diagram illustrating an equivalent circuit of a portion EC of FIG. 3 according to an exemplary embodiment of the inventive concept.

FIG. 32 is a circuit diagram illustrating an equivalent circuit BLKa6 of a portion EC of FIG. 3 according to an exemplary embodiment of the inventive concept. The equivalent circuit BLKa6 of FIG. 32 may be different from that illustrated in FIG. 31 in that string selection transistors SSTa and SSTb share a string selection line. String selection transistors SSTa and SSTb in cell strings CS11 and CS12 may be connected in common to the first string selection line SSL1, and string selection transistors SSTa and SSTb in cell strings CS21 and CS22 may be connected in common to the second string selection line SSL2.

The memory cells MC1 to MC4 may be erased in the same method as described with reference to FIGS. 8 to 13, 20, 21, 23, and 24. A pre-read operation may be made with respect to the memory cells MC1 to MC4 in the same method as described in FIGS. 16 and 17.

Like the equivalent circuit BLKa2 described with reference to FIG. 26, lateral transistors LTR may be provided to the equivalent circuit BLKa6. Like the equivalent circuit BLKa3 described with reference to FIG. 27, cell strings CS11 and CS12 may be connected with one ground selection line (not illustrated), and cell strings CS21 and CS22 may be connected with another ground selection line (not illustrated). Like the equivalent circuit BLKa4 described with reference to FIG. 28, memory cells MC may constitute a plurality of sub blocks.

Figure 33:
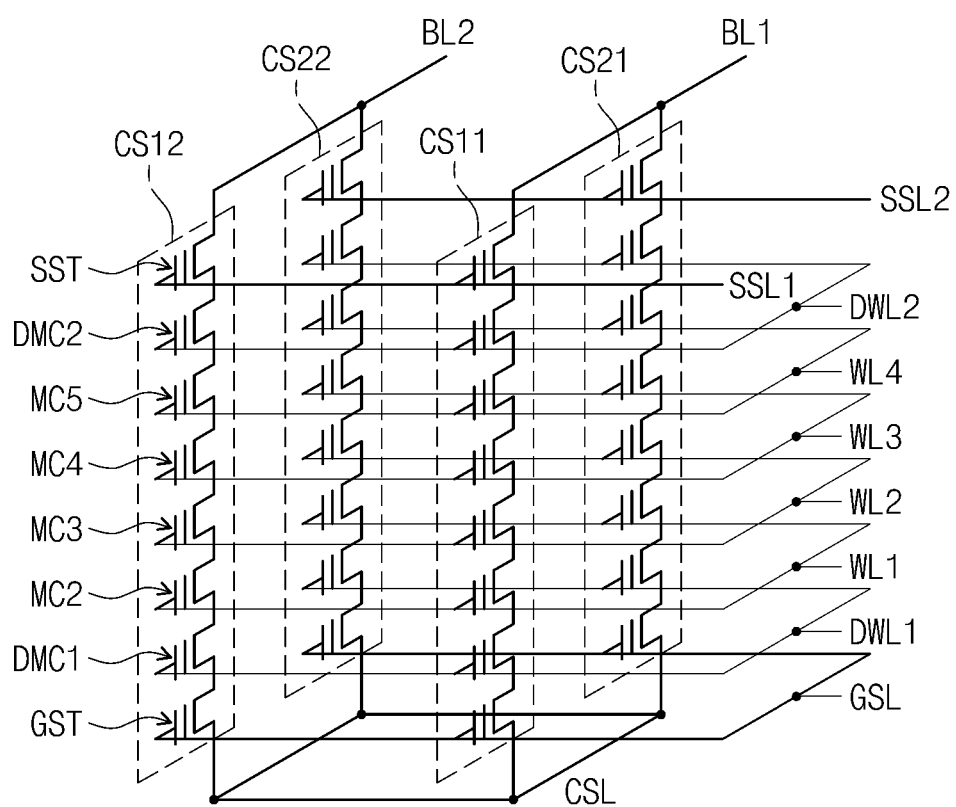
FIG. 33 is a circuit diagram illustrating an equivalent circuit of a portion EC of FIG. 3 according to an exemplary embodiment of the inventive concept.

FIG. 33 is a circuit diagram illustrating an equivalent circuit BLKa7 of a portion EC of FIG. 3 according to an exemplary embodiment of the inventive concept. Referring to FIGS. 3 to 6 and 33, the second conductive materials CM2 may constitute the first dummy memory cells DMC1, and the seventh conductive materials CM7 may constitute the second dummy memory cells DMC2.

In an exemplary embodiment, conductive materials corresponding to two or more heights may constitute dummy memory cells (not illustrated) disposed between memory cells and a ground selection transistor GST. Conductive materials corresponding to two or more heights may constitute dummy memory cells (not illustrated) disposed between memory cells and a string selection transistor SST. Dummy memory cells (not illustrated) can be disposed to be adjacent to any one of the ground and string selection transistors GST and SST.

The memory cells MC1 to MC4 may be erased in the same method as described with reference to FIGS. 8 to 13, 20, 21, 23, and 24. A pre-read operation may be made with respect to the memory cells MC1 to MC4 in the same method as described in FIGS. 16 and 17.

Voltages applied to the dummy word lines DWL1 and DWL2 may be dummy word line voltages VDWL1 to VDWL5 described with reference to FIGS. 29 and 30.

Like the equivalent circuit BLKa2 described with reference to FIG. 26, lateral transistors LTR may be provided to the equivalent circuit BLKa6. Like the equivalent circuit BLKa3 described with reference to FIG. 27, cell strings CS11 and CS12 may be connected with one ground selection line (not illustrated), and cell strings CS21 and CS22 may be connected with another ground selection line (not illustrated). Like the equivalent circuit BLKa4 described with reference to FIG. 28, memory cells MC may constitute a plurality of sub blocks. As described with reference to FIG. 31, conductive materials of two or more heights may constitute string selection transistors SSTa and SSTb. Conductive materials of two or more heights may constitute ground selection transistors GSTa and GSTb. As described with reference to FIG. 32, string selection transistors SSTa and SSTb of the same row may be connected with one string selection line SSL1 or SSL2.

Figure 34:
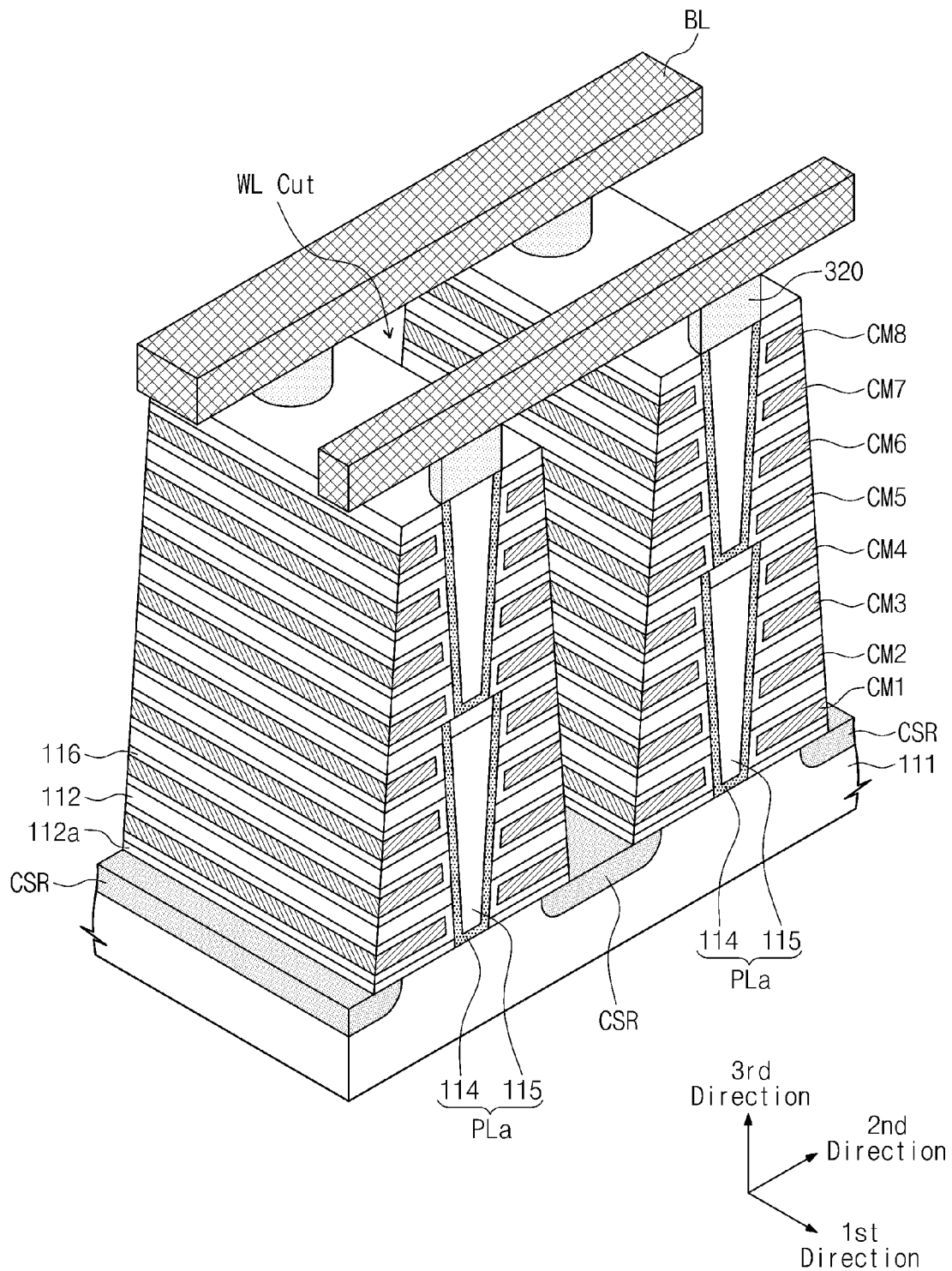
FIG. 34 is a perspective view taken along a line IV-IV' of FIG. 3 according to an exemplary embodiment of the inventive concept.
Figure 35:
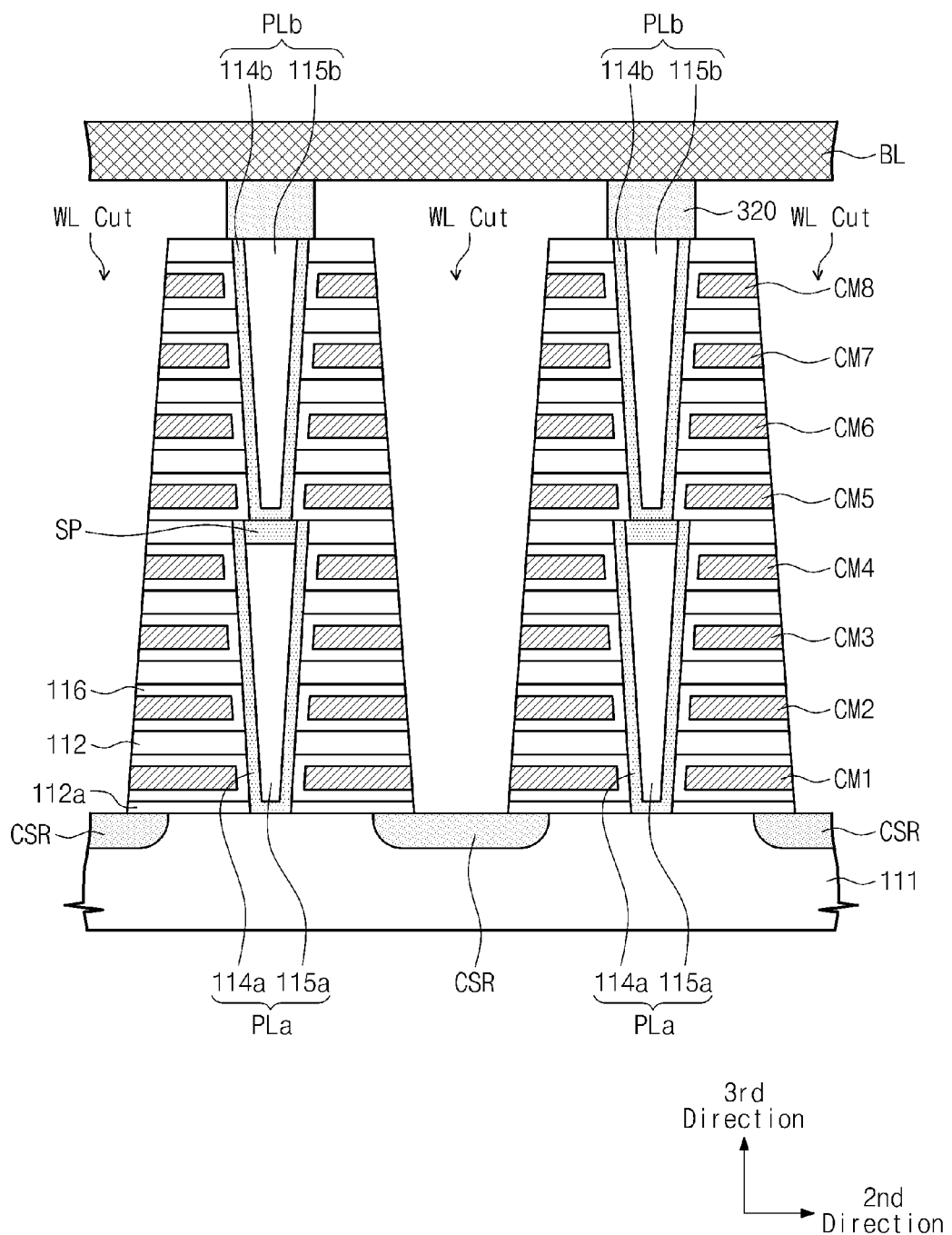
FIG. 35 is a cross-sectional view taken along a line IV-IV' of FIG. 3 according to an exemplary embodiment of the inventive concept.

FIG. 34 is a perspective view taken along a line IV-IV' of FIG. 3 according to an exemplary embodiment of the inventive concept. FIG. 35 is a cross-sectional view taken along a line IV-IV' in FIG. 3 according to an exemplary embodiment of the inventive concept. Referring to FIGS. 3, 34, and 35, lower pillars PLa and upper pillars PLb may be provided to be stacked in a direction perpendicular to a substrate 111.

The lower pillars PLa may penetrate insulation films 112 and 112a along a third direction to contact with the substrate 111. Each of the lower pillars PLa may include a lower channel film 114a and a lower inner material 115a. The lower channel films 114a may include a semiconductor material having the same conductivity type as the substrate 111 or an intrinsic semiconductor. The lower channel films 114a may act as vertical bodies of the first to fourth conductive materials CM1 and CM4, respectively. The lower inner materials 115a may include an insulation material.

The upper pillars PLb may be provided on corresponding ones of the lower pillars PLa. The upper pillars PLb may penetrate the insulation films 112 along the third direction to contact with upper surfaces of the lower pillars PLa. Each of the upper pillars PLb may include an upper channel film 114b and an upper inner material 115b. The upper channel films 114b may include a semiconductor material having the same conductivity type as the lower channel films 114a or an intrinsic semiconductor. The upper channel films 114b may act as vertical bodies of the fifth to eighth conductive materials CM5 and CM8, respectively. The upper inner materials 115b may include an insulation material.

The lower channel films 114a and the upper channel films 114b may be connected to act as a vertical body. For example, semiconductor pads SP may be provided on corresponding ones of the lower pillars PLa. The semiconductor pads SP may include a semiconductor material having the same conductivity type as the lower channel films 114a or an intrinsic semiconductor. The lower channel films 114a and the upper channel films 114b may be interconnected via the semiconductor pads SP.

In this embodiment, among the first to eighth conductive materials CM1 to CM8, conductive materials adjacent to the semiconductor pads SP may constitute dummy word lines and dummy memory cells. For example, the fourth conductive material CM4, the fifth conductive material CM5, or the fourth and fifth conductive materials CM4 and CM5 may constitute dummy word lines and dummy memory cells.

An equivalent circuit of a memory block described with reference to FIGS. 3, 34, and 35 may be identical to one of the above-described equivalent circuits BLKa1 to BLKa7 illustrated in FIGS. 7, 26, 27, 28, 31, 32 and 33, respectively.

In memory blocks described with reference to FIGS. 3, 34, and 35, an erase operation may be erased in the same method as described with reference to FIGS. 8 to 13, 20, 21, 23, and 24. In memory blocks described with reference to FIGS. 3, 34, and 35, a pre-read operation may be made in the same method as described in FIGS. 16 and 17.

Figure 36:
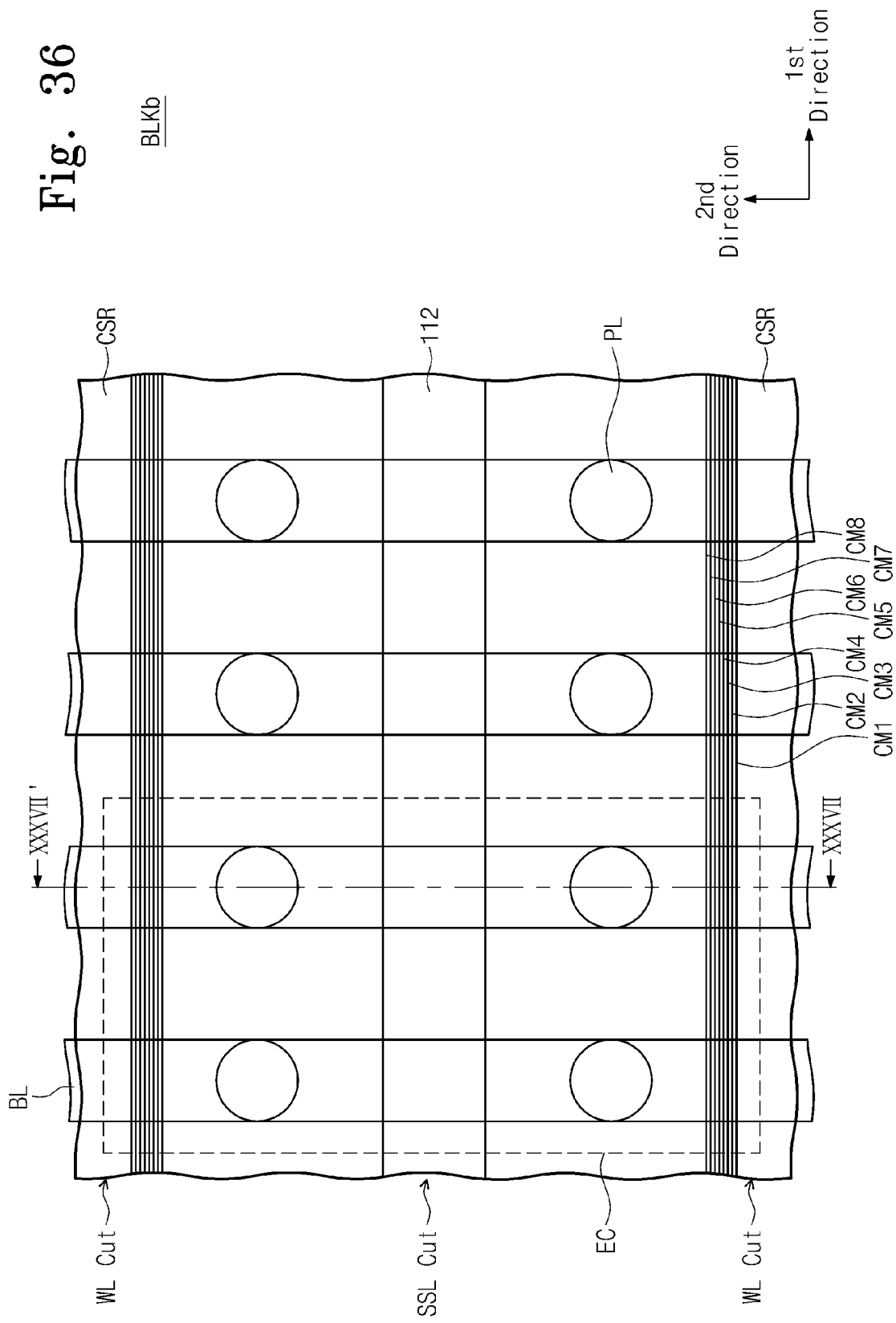
FIG. 36 is a plane view illustrating one of memory blocks of FIG. 2 according to an exemplary embodiment of the inventive concept.
Figure 37:
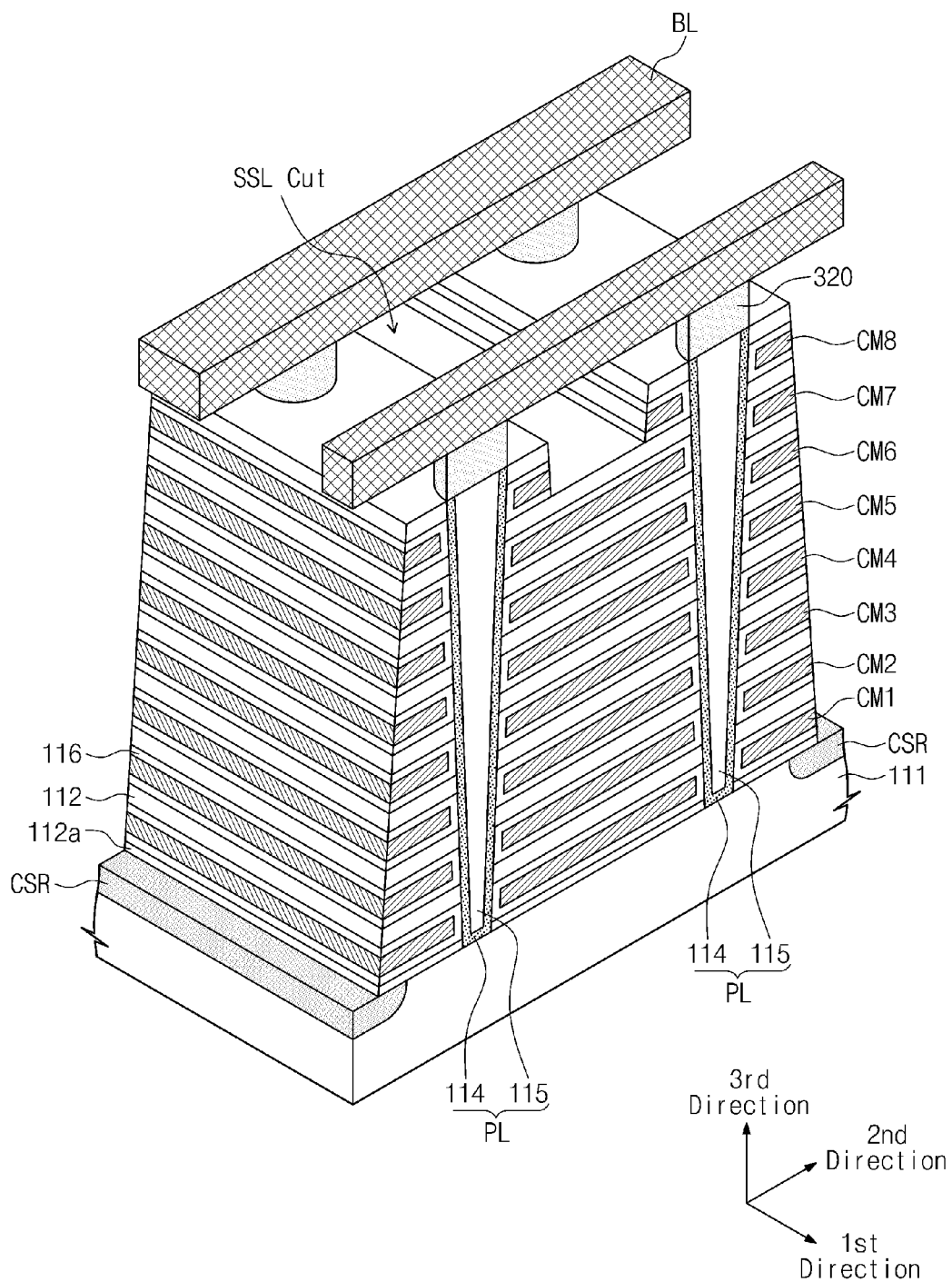
FIG. 37 is a perspective view taken along a line XXXVII-XXXVII' of FIG. 36.
Figure 38:
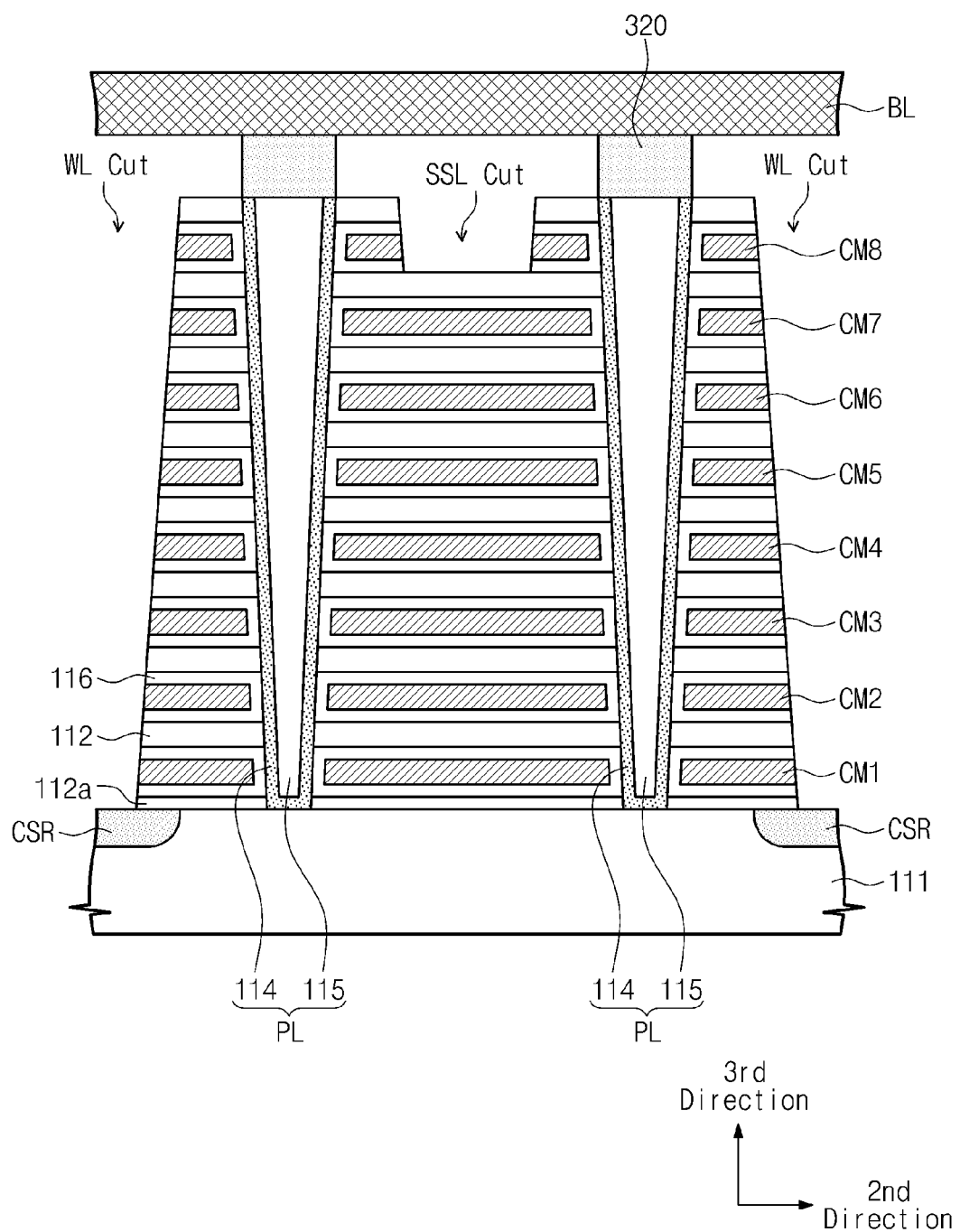
FIG. 38 is a cross-sectional view taken along a line XXXVII-XXXVII' of FIG. 36.

FIG. 36 is a plane view illustrating one memory block BLKb of memory blocks of the memory cell array 110 FIG. 2 according to an exemplary embodiment of the inventive concept. FIG. 37 is a perspective view taken along a line XXXVII-XXXVII' of FIG. 36. FIG. 38 is a cross-sectional view taken along a line XXXVII-XXXVII' of FIG. 36.

As compared with the memory block BLKa described with reference to FIGS. 3 to 6, the memory block BLKb may have a string selection line cut SSL Cut and a word line cut WL Cut provided in a second direction to extend along a first direction. Common source regions CSR may be provided at a substrate 111 exposed by the word line cuts WL Cut.

Pillars PL may be formed in two lines along the first direction between two adjacent common source regions CSR, that is, two adjacent word line cuts WL Cut. The string selection line cut SSL Cut may be formed between two lines of pillars PL. The string selection line cut SSL Cut may separate the eighth conductive lines CM8 constituting string selection transistors SST. When conductive lines of two or more heights constitute string selection transistors SST, the string selection line cut SSL Cut may separate conductive materials of two or more heights.

In this embodiment, pillars PL can be formed of lower pillars and upper pillars as described in FIGS. 34 and 35.

A portion EC of FIG. 36 may correspond to one of above-described equivalent circuits BLKa1 to BLKa7 illustrated in FIGS. 7, 26, 27, 28, 31, 32 and 33, respectively.

In the memory block BLKb, an erase operation may be erased in the same method as described with reference to FIGS. 8 to 13, 20, 21, 23, and 24. In the memory block BLKb, a pre-read operation may be made in the same method as described in FIGS. 16 and 17.

Figure 39:
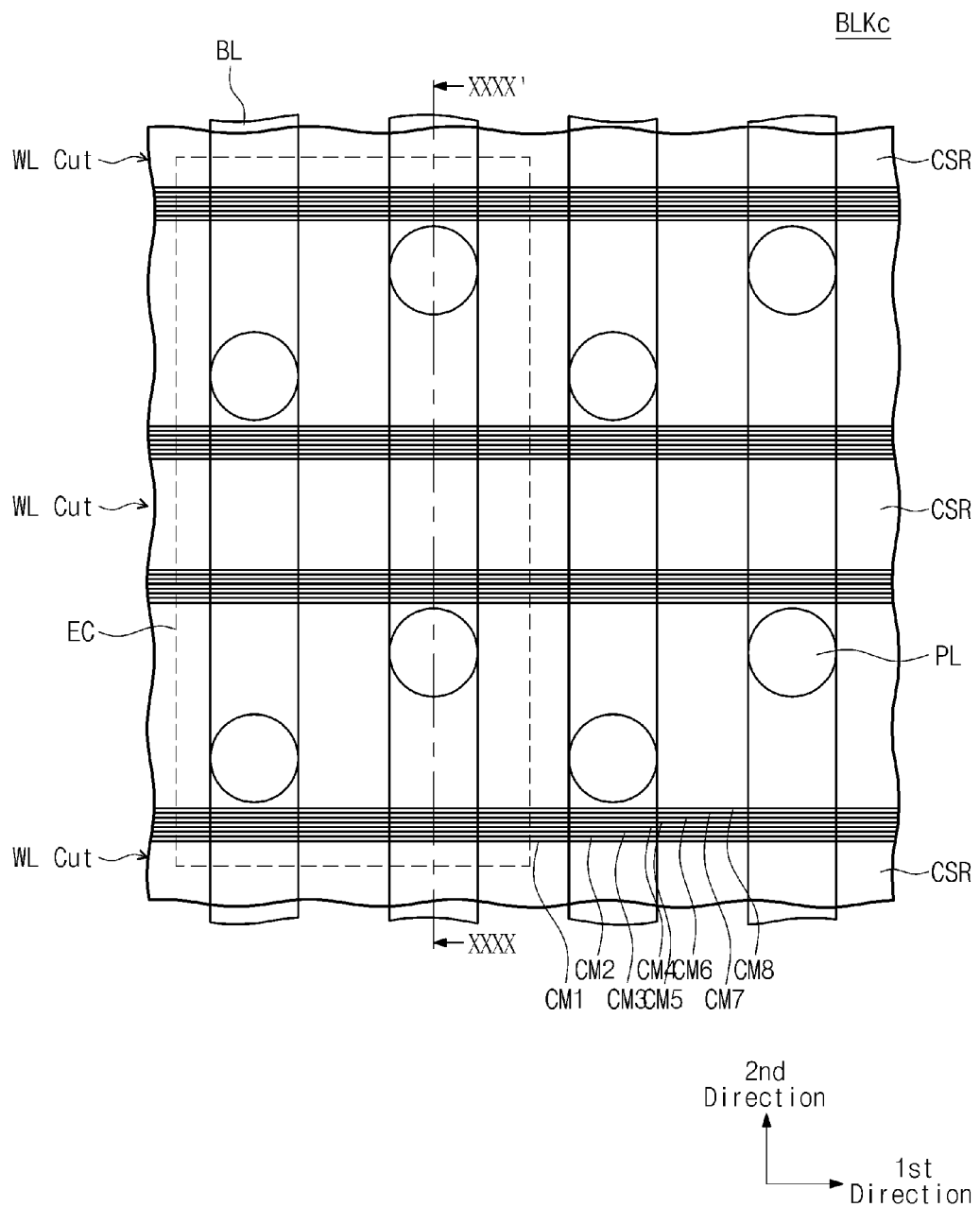
FIG. 39 is a plane view illustrating one of memory blocks of FIG. 2 according to an exemplary embodiment of the inventive concept.
Figure 40:
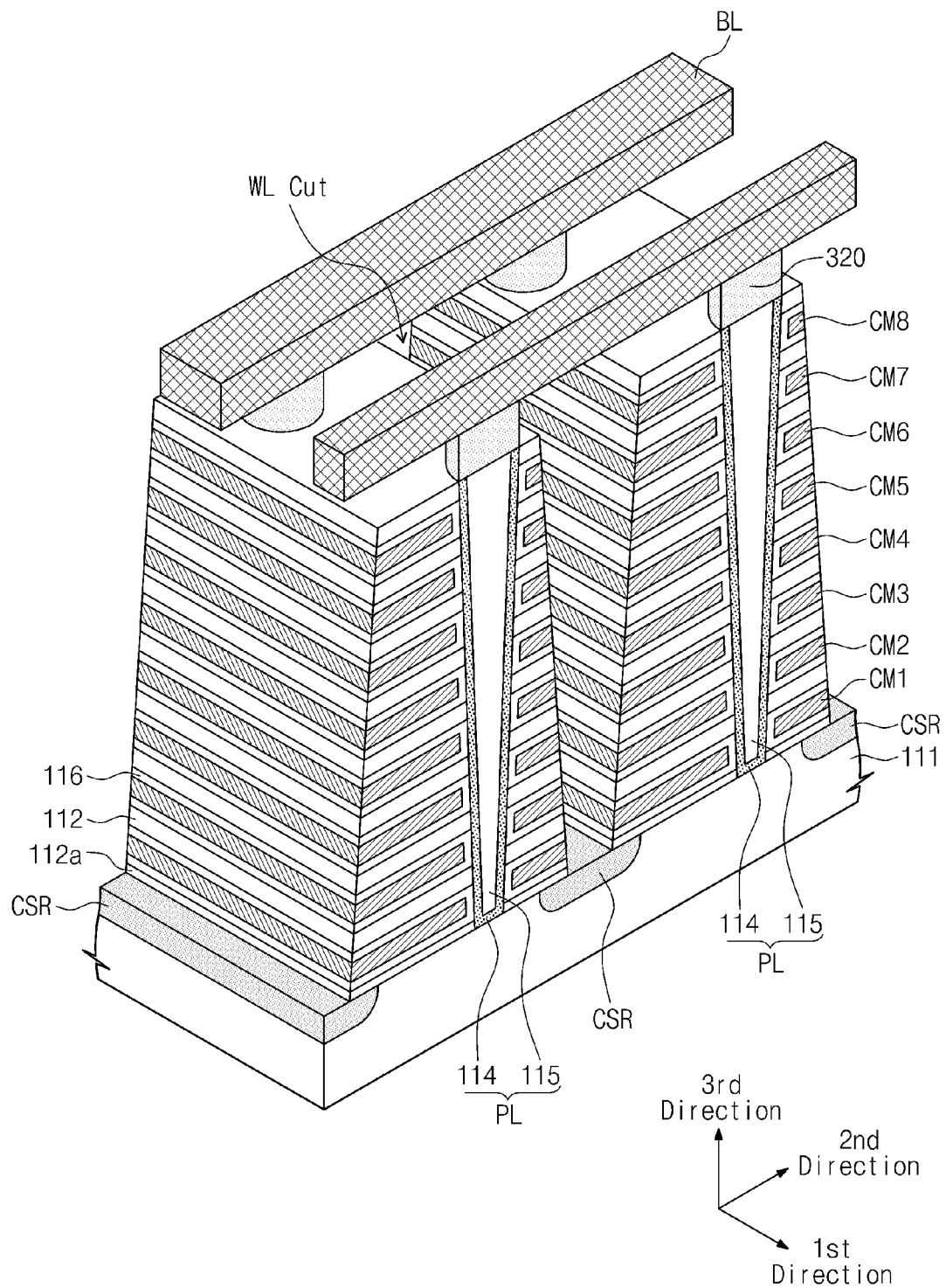
FIG. 40 is a perspective view taken along a line XXXX-XXXX' of FIG. 39.
Figure 41:
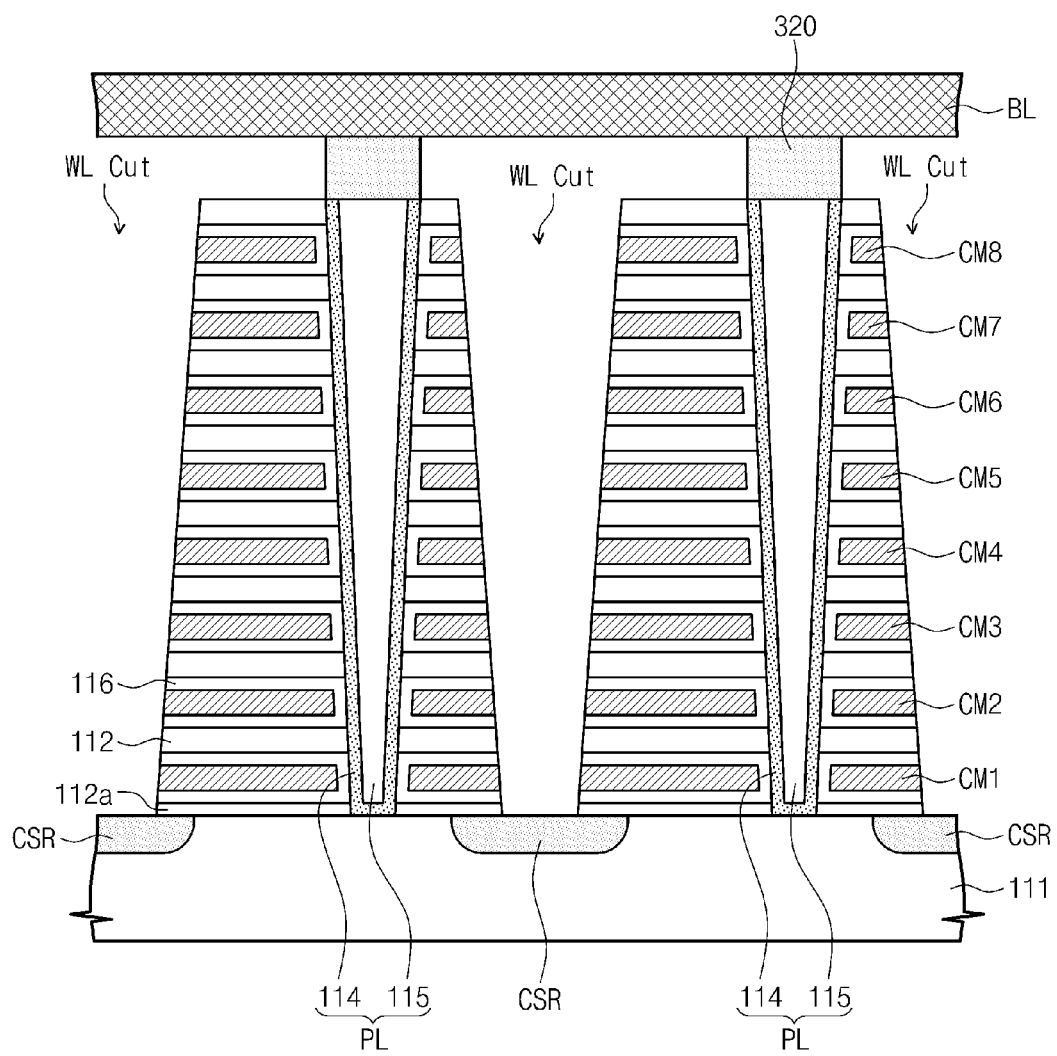
FIG. 41 is a cross-sectional view taken along a line XXXX-XXXX' of FIG. 39.

FIG. 39 is a plane view illustrating one memory block BLKc of memory blocks of FIG. 2 according to an exemplary embodiment of the inventive concept. FIG. 40 is a perspective view taken along a line XXXX-XXXX' of FIG. 39. FIG. 41 is a cross-sectional view taken along a line XXXX-XXXX' of FIG. 39.

As compared with the memory block BLKa described in FIGS. 3 to 6, the memory block BLKc may have pillars provided between adjacent common source regions to be disposed in a zigzag shape along the first direction.

As described in FIGS. 34 and 35, pillars PL may be formed of lower pillars and upper pillars. As described in FIGS. 36 to 38, a string selection line cut SSL Cut can be provided. One line of pillars disposed in a zigzag shape along the first direction can be provided between word line and string selection line cuts WL Cut and SSL Cut which are adjacent to each other.

A portion EC of FIG. 39 may correspond to one of above-described equivalent circuits BLKa1 to BLKa7 illustrated in FIGS. 7, 26, 27, 28, 31, 32 and 33, respectively.

In the memory block BLKc, an erase operation may be erased in the same method as described with reference to FIGS. 8 to 13, 20, 21, 23, and 24. In the memory block BLKc, a pre-read operation may be made in the same method as described in FIGS. 16 and 17.

Figure 42:
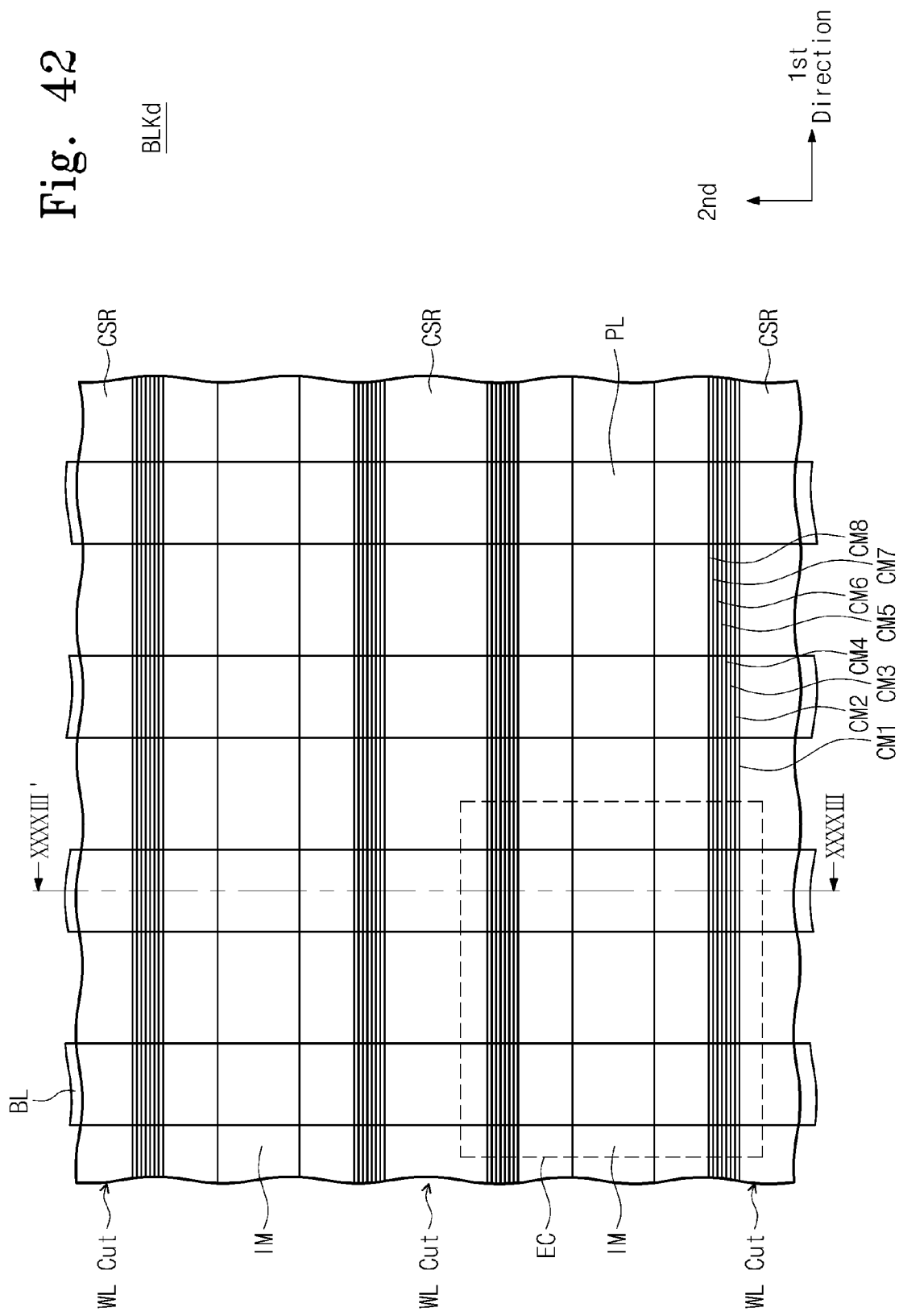
FIG. 42 is a plane view illustrating one of memory blocks of FIG. 2 according to an exemplary embodiment of the inventive concept.
Figure 43:
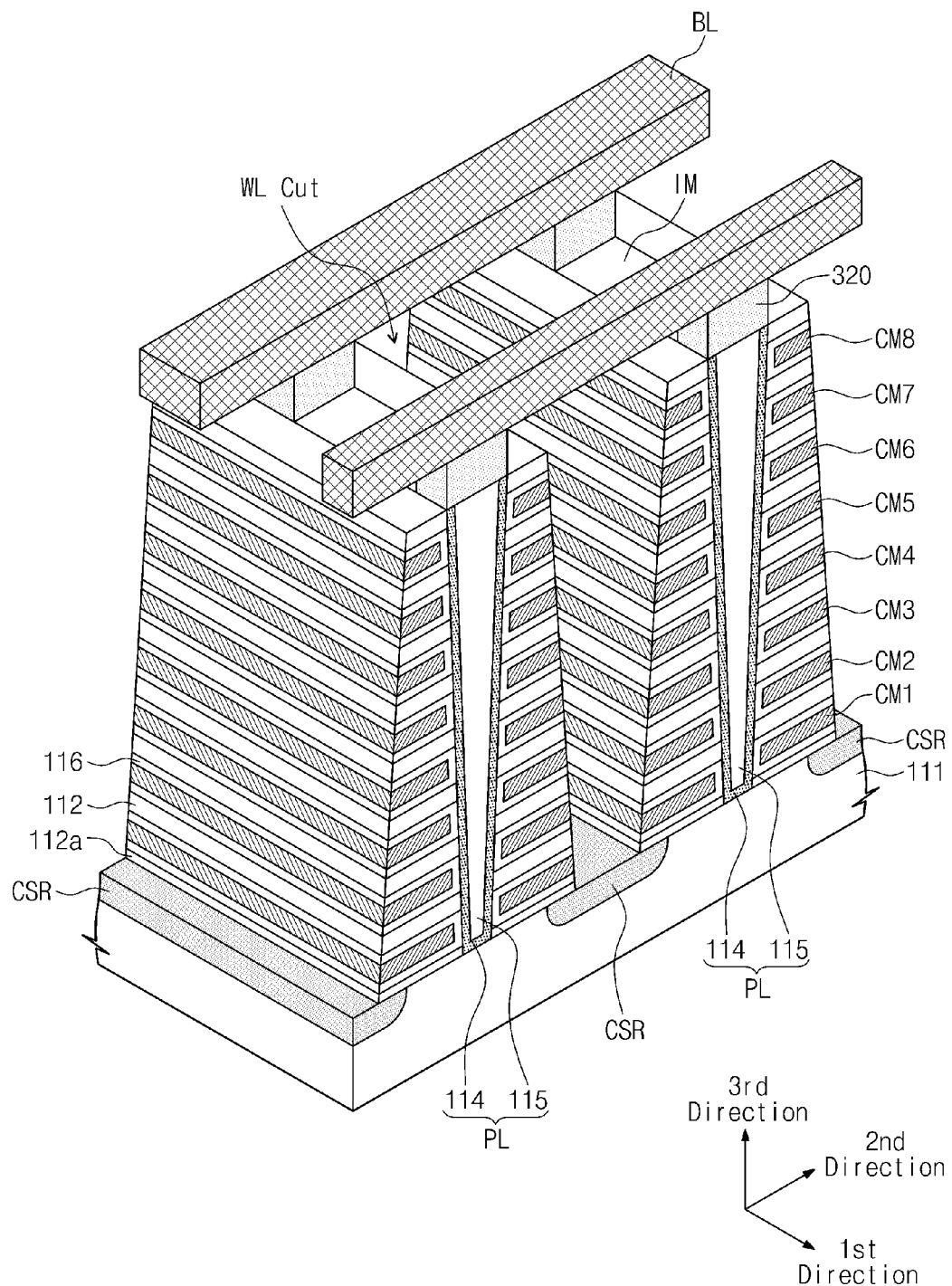
FIG. 43 is a perspective view taken along a line XXXXIII-XXXXIII' of FIG. 42.

FIG. 42 is a plane view illustrating one memory block BLKd of memory blocks of FIG. 2 according to an exemplary embodiment of the inventive concept. FIG. 43 is a perspective view taken along a line XXXXIII-XXXXIII' of FIG. 42. A cross-sectional view taken along a line XXXXIII-XXXXIII' of FIG. 42 may be identical to that illustrated in FIG. 5, and description thereof is thus omitted.

As compared with the memory block BLKa described in FIGS. 3 to 6, the memory block BLKd may have a memory block BLKd to include square pillars PL. Insulation materials IM may be provided between pillars PL. The pillars PL may be disposed in line along the first direction between adjacent common source regions CSR. The insulation materials IM may extend along the third direction so as to contact with a substrate 111.

Each of the pillars PL may include a channel film 114 and an inner material 115. Exemplarily, the channel film 114 may be provided on two sides adjacent to conductive materials CM1 to CM8 among four sides of a corresponding pillar, not surrounding the corresponding pillar.

A channel film on one side of each pillar may constitute a cell string together with conductive materials CM1 to CM8 and information storage films 116. A channel film on the other side of each pillar may constitute another cell string together with conductive materials CM1 to CM8 and information storage films 116. That is, one pillar may be used to form two cell strings.

In an exemplary embodiment, as described in FIGS. 34 and 35, pillars PL may be formed of lower pillars and upper pillars. As described in FIGS. 36 to 38, a string selection line cut SSL Cut can be provided. As described in FIGS. 39 to 41, pillars PL can be disposed in a zigzag shape along the first direction.

A portion EC of FIG. 42 may correspond to one of above-described equivalent circuits BLKa1 to BLKa7 illustrated in FIGS. 7, 26, 27, 28, 31, 32 and 33, respectively.

In the memory block BLKd, an erase operation may be erased in the same method as described with reference to FIGS. 8 to 13, 20, 21, 23, and 24. In the memory block BLKd, a pre-read operation may be made in the same method as described in FIGS. 16 and 17.

Figure 44:
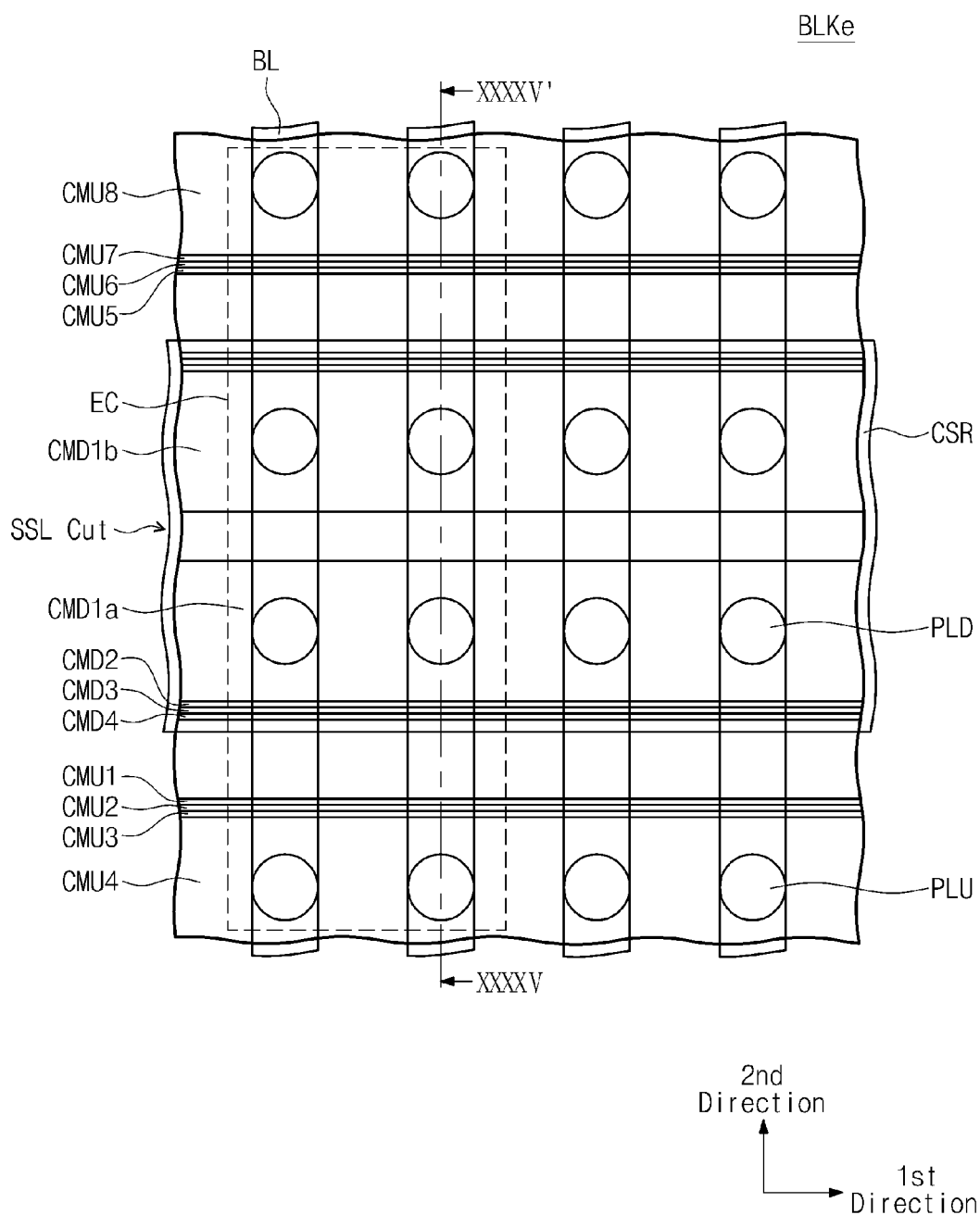
FIG. 44 is a plane view illustrating one of memory blocks of FIG. 2 according to an exemplary embodiment of the inventive concept.
Figure 45:
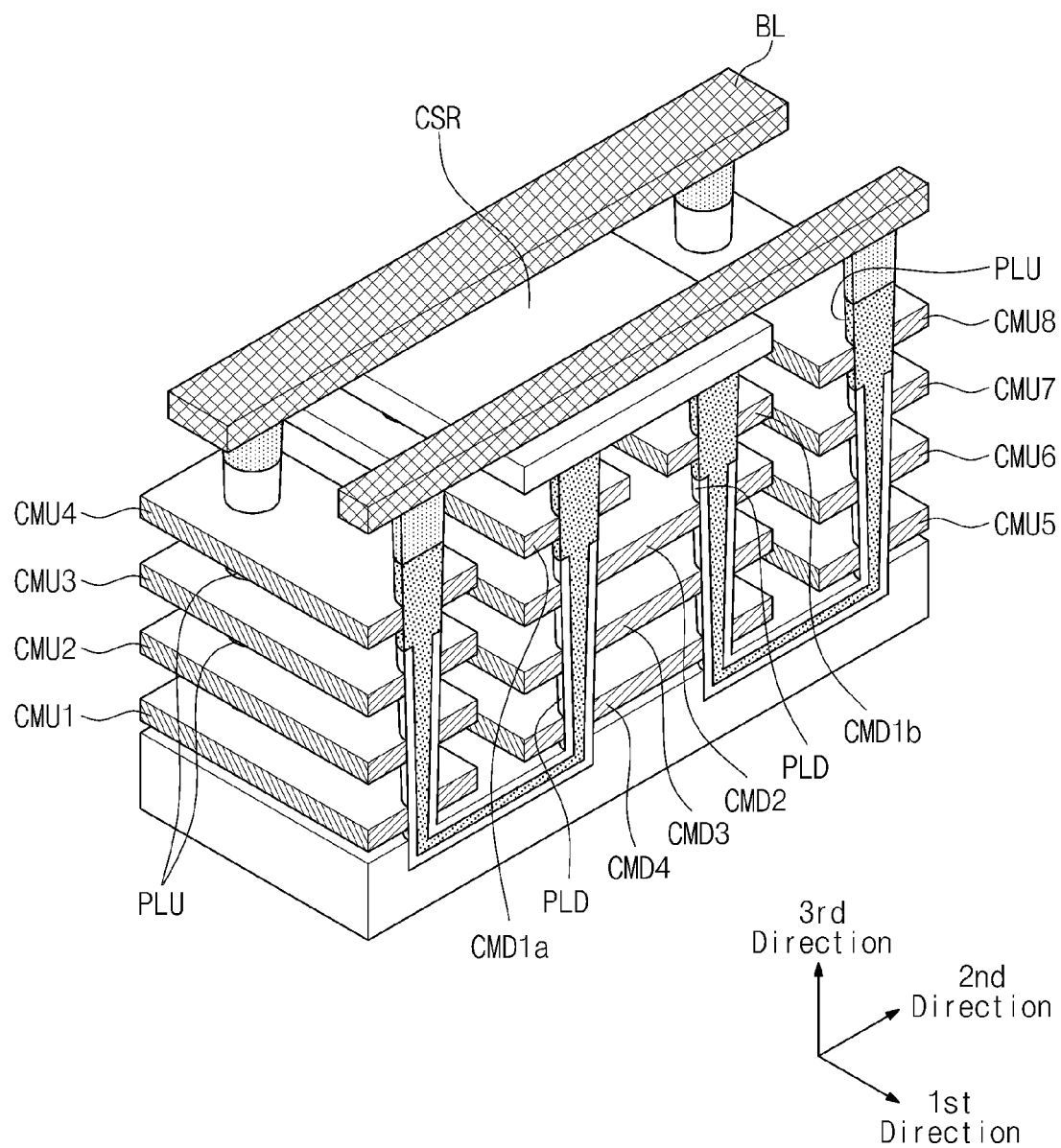
FIG. 45 is a perspective view taken along a line XXXXV-XXXXV' of FIG. 44.
Figure 46:
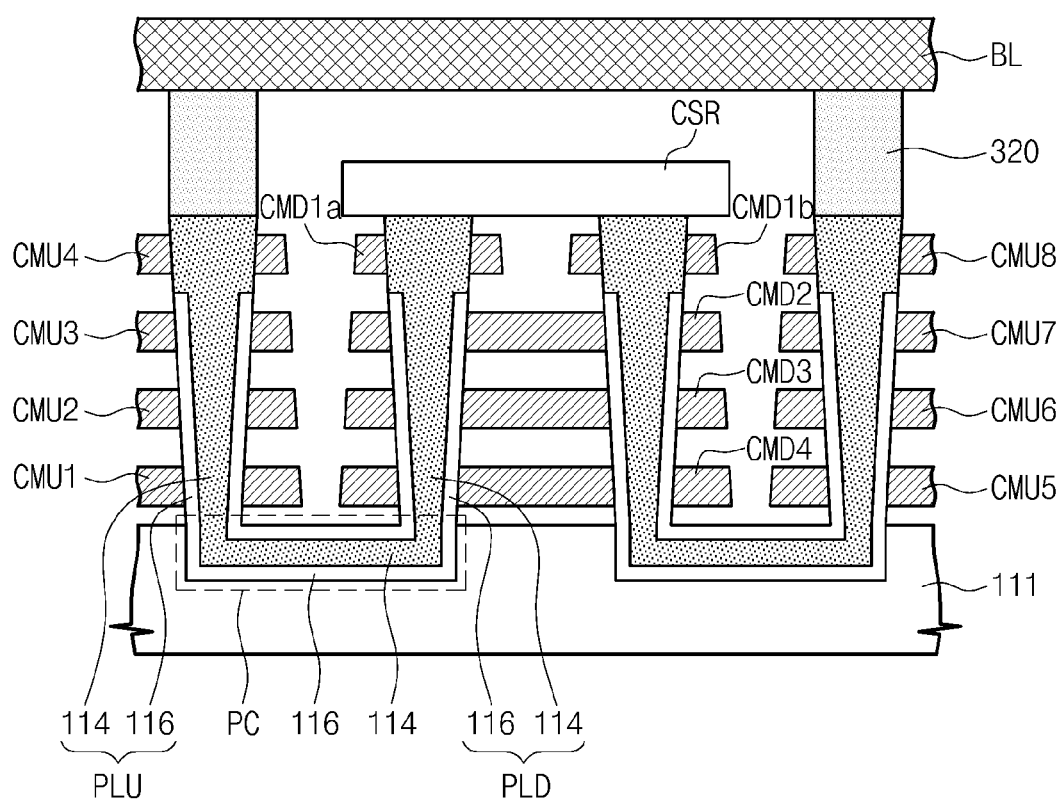
FIG. 46 is a cross-sectional view taken along a line XXXXV-XXXXV' of FIG. 44.

FIG. 44 is a plane view illustrating one memory block BLKe of memory blocks of FIG. 2 according to an exemplary embodiment of the inventive concept. FIG. 45 is a perspective view taken along a line XXXXV-XXXXV' of FIG. 44. FIG. 46 is a cross-sectional view taken along a line XXXXV-XXXXV' of FIG. 44.

Referring to FIGS. 44 to 46, the first to eight upper conductive materials CMU1 to CMU8 extending along the first direction may be provided on a substrate 111. The first to fourth upper conductive materials CMU1 to CMU4 may be stacked in a direction perpendicular to the substrate 111 and spaced apart from one another in a direction perpendicular to the substrate 111. The fifth to eighth upper conductive materials CMU5 to CMU8 may be stacked in a direction perpendicular to the substrate 111 and spaced apart from one another in a direction perpendicular to the substrate 111. A group of the first to fourth upper conductive materials CMU1 to CMU4 may be spaced apart from a group of the fifth to eighth upper conductive materials CMU5 to CMU8 along the second direction.

Lower conductive materials CMD1a, CMD1b, and CMD2 to CMD4 extending along the first direction may be provided between the first to fourth upper conductive materials CMU1 to CMU4 and the fifth to eighth upper conductive materials CMU5 to CMU8. The lower conductive materials CMD2 to CMD4 may be stacked in a direction perpendicular to the substrate 111 and spaced apart from one another in a direction perpendicular to the substrate 111. The lower conductive materials CMD1a and CMD1b may be provided on the lower conductive material CMD2. The lower conductive materials CMD1a and CMD1b may be spaced apart along the second direction.

A plurality of upper pillars PLU may be configured to penetrate the first to fourth upper conductive materials CMU1 to CMU4 or the fifth to eighth upper conductive materials CMU5 to CMU8 in a direction perpendicular to the substrate 111. The upper pillars PLU may contact the substrate 111. In the first upper conductive materials CMU1, upper pillars may be disposed in line along the first direction and spaced apart along the first direction. In the eighth upper conductive materials CMU8, upper pillars may be disposed in line along the first direction and spaced apart along the first direction.

Each of the upper pillars PLU may include an information storage film 116 and a channel film 114. The information storage film 116 may store information by trapping or discharging charges. The information storage film 116 may include a tunneling insulation film, a charge trap film, and a blocking insulation film.

The channel films 114 may act as vertical bodies of the upper pillars PLU. The channel films 114 may include an intrinsic semiconductor, respectively. The channel films 114 may include semiconductor having the same conductivity type (e.g., p-type) as the substrate 111.

A plurality of lower pillars PLD may be formed. The plurality of lower pillars PLD may penetrate the lower conductive materials CMD2 to CMD4 and the lower conductive material CMD1a or CMD1b in a direction perpendicular to the substrate 111 so as to contact the substrate 111. In the lower conductive materials CMD1a, lower pillars may be disposed in line along the first direction and spaced apart along the first direction. In the lower conductive materials CMD1b, lower pillars may be disposed in line along the first direction and spaced apart along the first direction.

Each of the lower pillars PLD may include an information storage film 116 and a channel film 114. The information storage film 116 may store information by trapping or discharging charges. The information storage film 116 may include a tunneling insulation film, a charge trap film, and a blocking insulation film.

The channel films 114 may act as vertical bodies of the lower pillars PLD. The channel films 114 may include an intrinsic semiconductor, respectively. The channel films 114 may include semiconductor having the same conductivity type (e.g., p-type) as the substrate 111.

A plurality of pipeline contacts PC may be provided at the substrate 111. The pipeline contacts PC may extend in a bit line direction so as to connect lower surfaces of upper pillars PLU formed at the first upper conductive material CMU1 with lower surfaces of lower pillars PLD formed at the lower conductive material CMD1a. The pipeline contacts PC may extend in a bit line direction so as to connect lower surfaces of upper pillars PLU formed at the eighth upper conductive material CMU8 with lower surfaces of lower pillars PLD formed at the lower conductive material CMD1b.

In this embodiment, each of the pipeline contacts PC may include a channel film 114 and an information storage film 116. The channel films 114 of the pipeline contacts PC may interconnect the channel films 114 of the upper pillars PLU and channel films of the lower pillars PLD. The information storage films 116 of the pipeline contacts PC may interconnect the information storage films 116 of the upper pillars PLU and the information storage films 116 of the lower pillars PLD.

A common source region CSR extending along the first direction may be provided on the lower pillars PLD. The common source region CSR may extend along the first direction so as to be connected with the plurality of lower pillars PLD. The common source region CSR may form a common source line CSL. The common source region CSR may include a metallic material. The common source region CSR may have a conductivity type different from the substrate 111.

Drains 320 may be provided on the upper pillars PLU. The drains 320 may include a semiconductor material having a conductivity type (e.g., n-type) different from the substrate 111. Bit lines BL may be formed on the drains 320. The bit lines BL may be spaced apart along the first direction. The bit lines BL may extend along the second direction so as to be connected with the drains 320.

In this embodiment, the bit lines BL and the drains 320 can be connected via contact plugs, and the common source region CSR and the lower pillars PLD can be connected via contact plugs.

One cell string may be formed of a lower pillar and an upper pillar connected to each other via one pipeline contact.

In an exemplary embodiment, as described in FIGS. 39 to 41, the upper pillars PLU and the lower pillars PLD can be disposed in a zigzag shape along the first direction.

A portion EC of FIG. 44 may correspond to one of above-described equivalent circuits BLKa1 to BLKa7 illustrated in FIGS. 7, 26, 27, 28, 31, 32 and 33, respectively.

In the memory block BLKe, an erase operation may be erased in the same method as described with reference to FIGS. 8 to 13, 20, 21, 23, and 24. In the memory block BLKe, a pre-read operation may be made in the same method as described in FIGS. 16 and 17.

Figure 48:
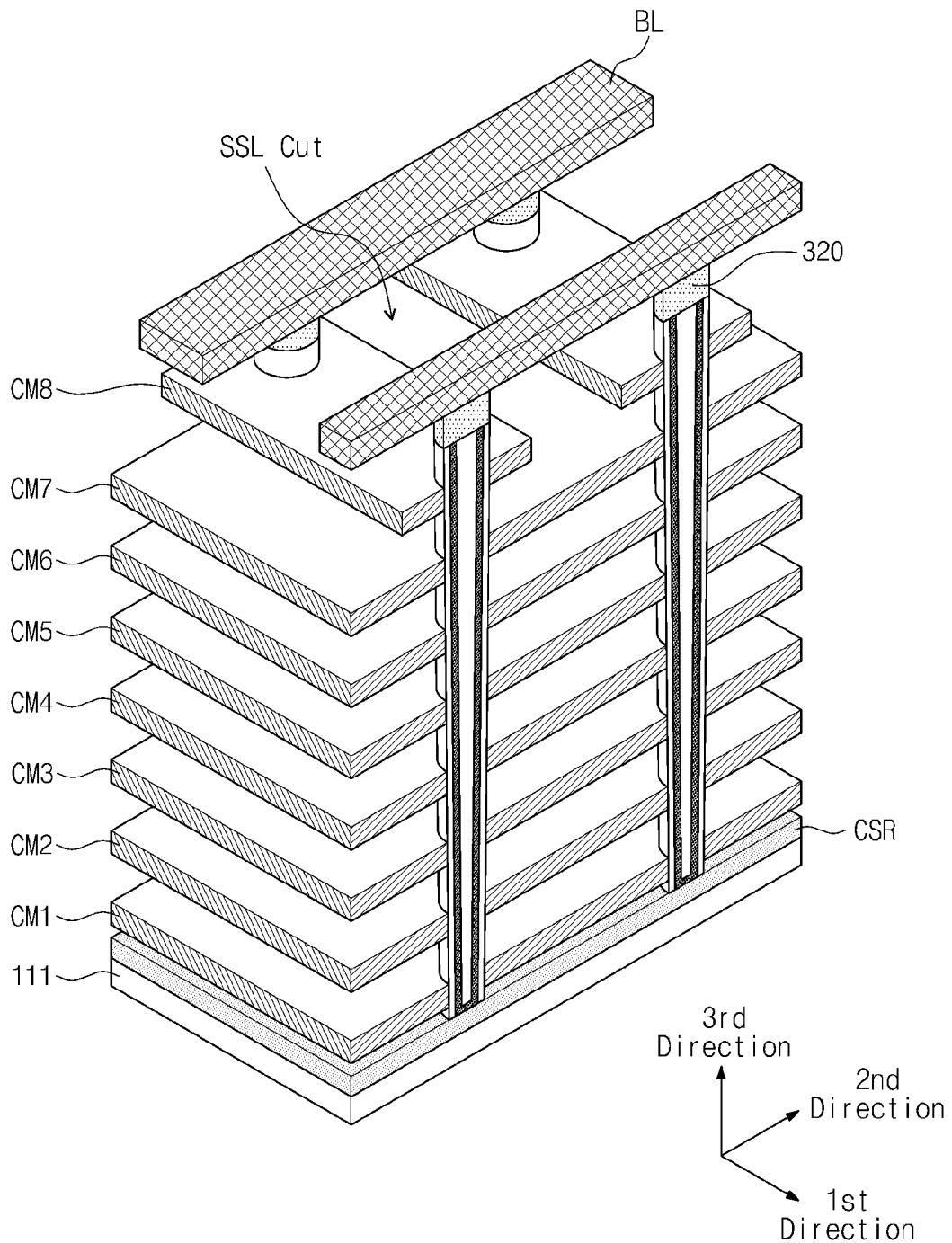
FIG. 48 is a perspective view taken along a line XXXXVIII-XXXXVIII' of FIG. 47.
Figure 49:
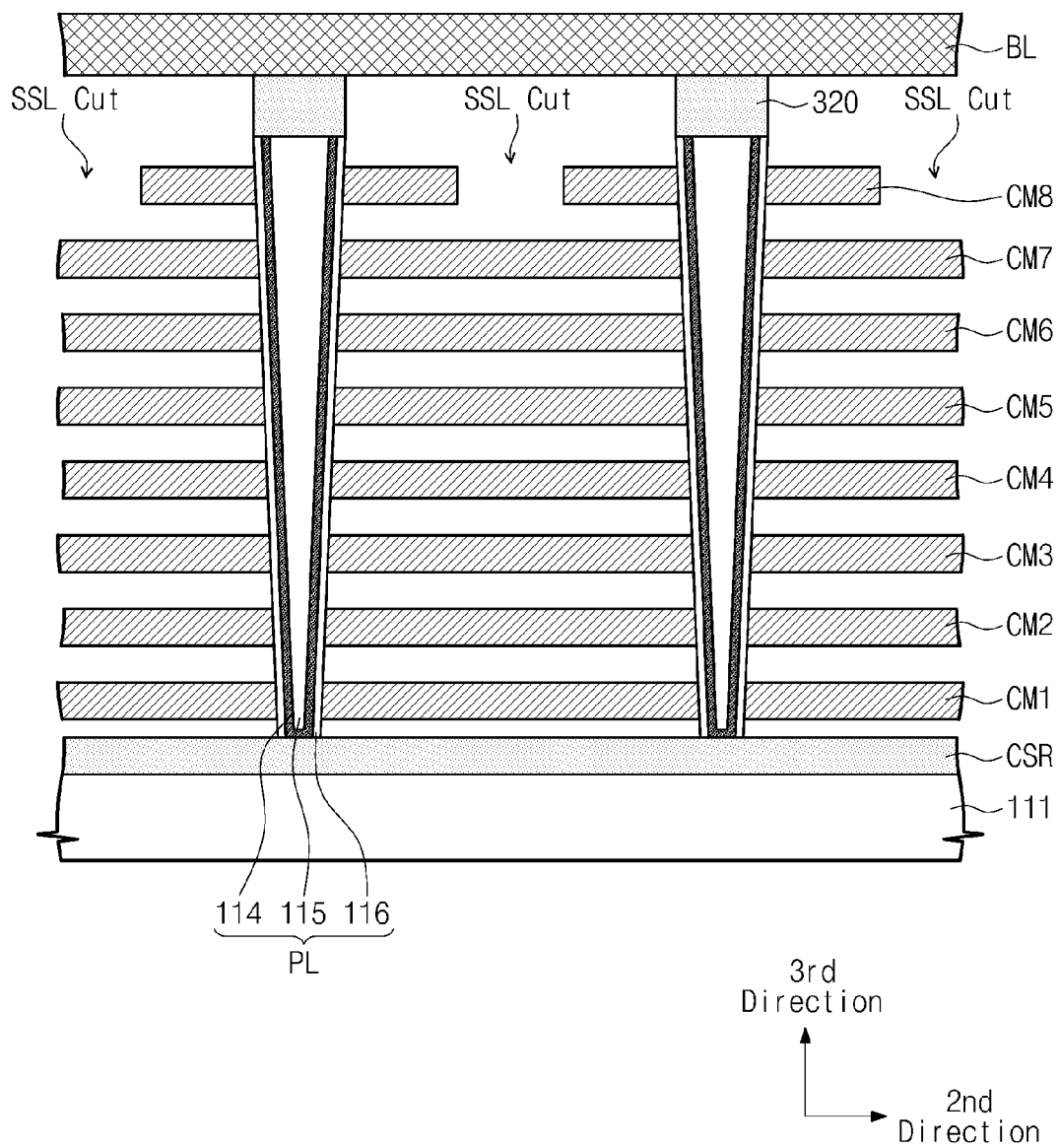
FIG. 49 is a cross-sectional view taken along a line XXXXVIII-XXXXVIII' of FIG. 47.

FIG. 47 is a plane view illustrating one memory block BLKf of memory blocks of FIG. 2 according to still another exemplary embodiment of the inventive concept. FIG. 48 is a perspective view taken along a line XXXXVIII-XXXXVIII' of FIG. 47. FIG. 49 is a cross-sectional view taken along a line XXXXVIII-XXXXVIII' of FIG. 47.

Referring to FIGS. 47 to 49, a common source region CSR may be formed at a substrate 111. The common source region CSR may be formed of one doping region, for example. The common source region CSR may constitute a common source line CSL.

The first to eighth conductive materials CM1 to CM8 may be formed on the common source region CSR. The first to eighth conductive materials CM1 to CM8 may be stacked in a direction perpendicular to the substrate 111 and spaced apart in a direction perpendicular to the substrate 111. Among the first to eighth conductive materials CM1 to CM8, conductive materials constituting string selection transistors SST may be separated by string selection line cuts SSL Cut. The string selection line cuts SSL Cut may extend along the first direction and spaced apart along the second direction. Remaining conductive materials (not used for the string selection transistors) may be formed on the common source region CSR to have a plate shape extending along the first and second directions.

For example, the first to seventh conductive lines CM1 to CM7 may have a plate shape, and the eighth conductive materials CM8 may be separated by the string selection line cuts SSL Cut. The eighth conductive materials CM8 may extend along the first direction and spaced apart along the second direction.

A plurality of pillars PL may be provided to penetrate the first to eighth conductive materials CM1 to CM8 in a direction perpendicular to the substrate 111 and to contact with the substrate 111. In one of the eighth conductive materials CM8, pillars PL may be provided in line along the first direction.

Each of the pillars PL may include an information storage film 116, a channel film 114, and an inner material 115.

The information storage films 116 may store information by trapping or discharging charges. The information storage films 116 may include a tunneling insulation film, a charge trap film, and a blocking insulation film. The channel films 114 may act as vertical bodies of the pillars PL. The channel films 114 may include intrinsic semiconductor. The channel films 114 may include a semiconductor material having the same type (e.g., p-type) as the substrate 111. The inner materials 115 may include an insulation material or air gap.

In an exemplary embodiment, as described in FIGS. 34 and 35, pillars PL may be formed of upper pillars and lower pillars. As described in FIGS. 39 to 41, pillars PL may be disposed in a zigzag shape along the first direction.

Figure 50:
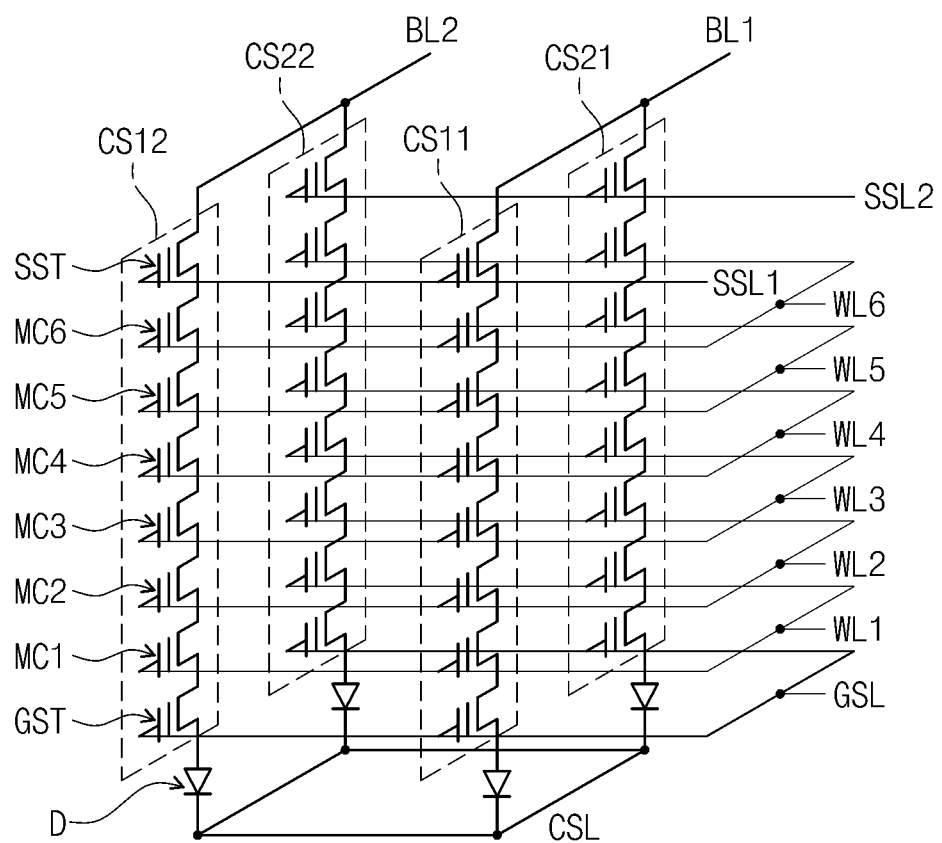
FIG. 50 is a circuit diagram illustrating an equivalent circuit of a portion EC of FIG. 47 according to an exemplary embodiment of the inventive concept.

FIG. 50 is a circuit diagram illustrating an equivalent circuit BLKf1 of a portion EC of FIG. 47 according to an exemplary embodiment of the inventive concept. Referring to FIGS. 47 to 50, a common source region CSR may be formed between pillars PL and a substrate 111.

Channels films 114 may be p-type, and the common source region CSR may be n-type. A portion corresponding to ground selection transistors GST among the channel films 114 may be p-type, and the common source region CSR may be n-type. That is, the channel film 114 and the common source region CSR may form a PN junction. Accordingly, diodes D may be formed between cell strings CS11, CS12, CS21, and CS22 formed of pillars PL and a common source line formed of the common source region CSR. The equivalent circuit BLKf1 of FIG. 50 may be identical to that illustrated in FIG. 7 except that the diodes D are provided therein.

The equivalent circuit BLKf1 may be applied like the above-described equivalent circuits BLKa2 to BLKa7 illustrated in FIGS. 26, 27, 28, 31, 32 and 33, respectively.

In the memory block BLKf1, an erase operation may be erased in the same method as described with reference to FIGS. 8 to 13, 20, 21, 23, and 24. In the memory block BLKfI, a pre-read operation may be made in the same method as described in FIGS. 16 and 17.

Figure 51:
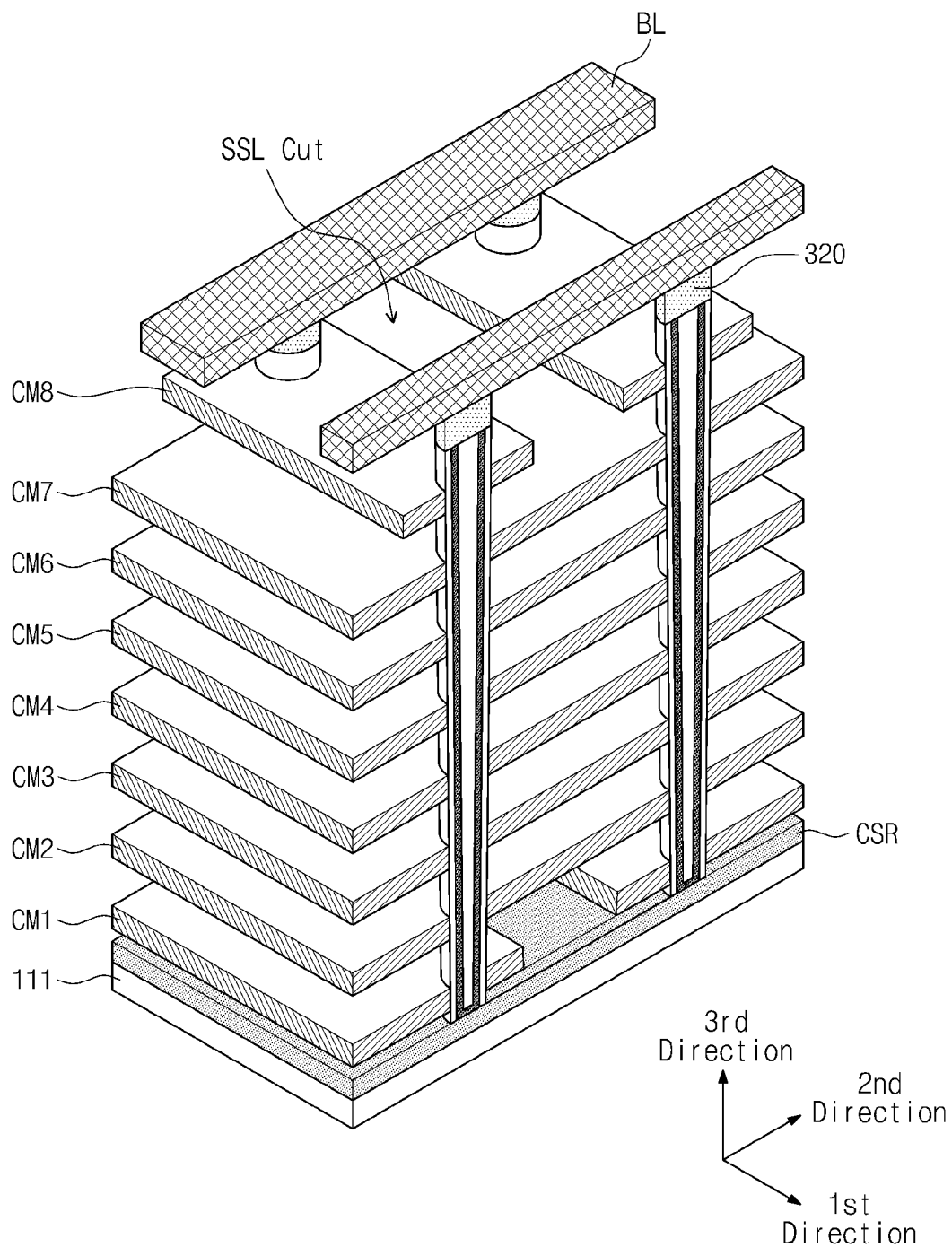
FIG. 51 is a perspective view taken along a line XXXXVIII-XXXXVIII of FIG. 47.
Figure 52:
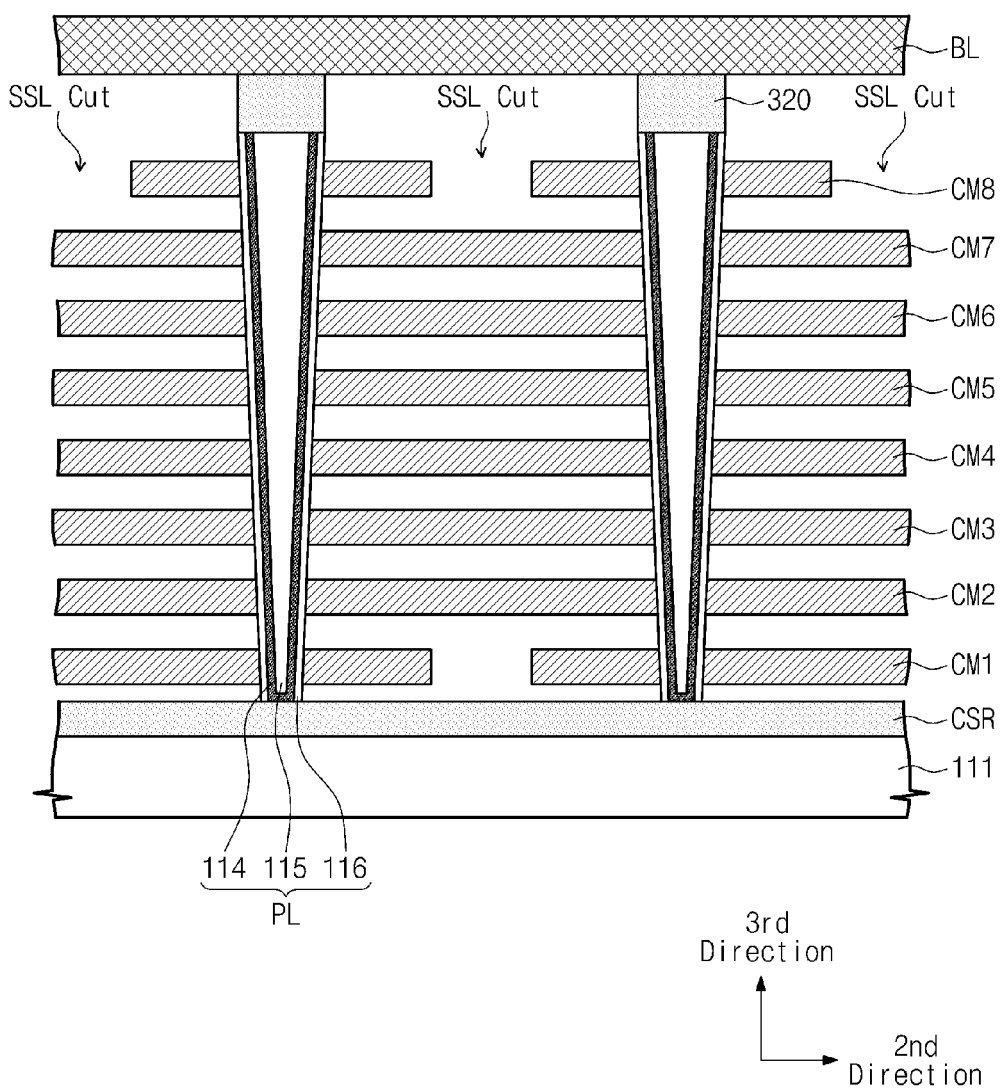
FIG. 52 is a cross-sectional view taken along a line XXXXVIII-XXXXVIII' of FIG. 47.

FIG. 51 is a perspective view taken along a line XXXX-VIII-XXXXVIII' of FIG. 47. FIG. 52 is a cross-sectional view taken along a line XXXXVIII-XXXXVIII' of FIG. 47.

Referring to FIGS. 47, 51, and 52, among the first to eighth conductive materials CM1 to CM8, conductive materials constituting ground selection transistors GST may extend along the first direction and spaced apart along the second direction. The conductive materials constituting ground selection transistors GST may have the same structure as conductive materials constituting string selection transistors SST. For example, the first conductive materials CM1 may have the same structure as the eighth conductive materials CM8.

In an exemplary embodiment, as described in FIGS. 34 and 35, pillars PL may be formed of upper pillars and lower pillars. As described in FIGS. 39 to 41, pillars PL may be disposed in a zigzag shape along the first direction.

Figure 53:
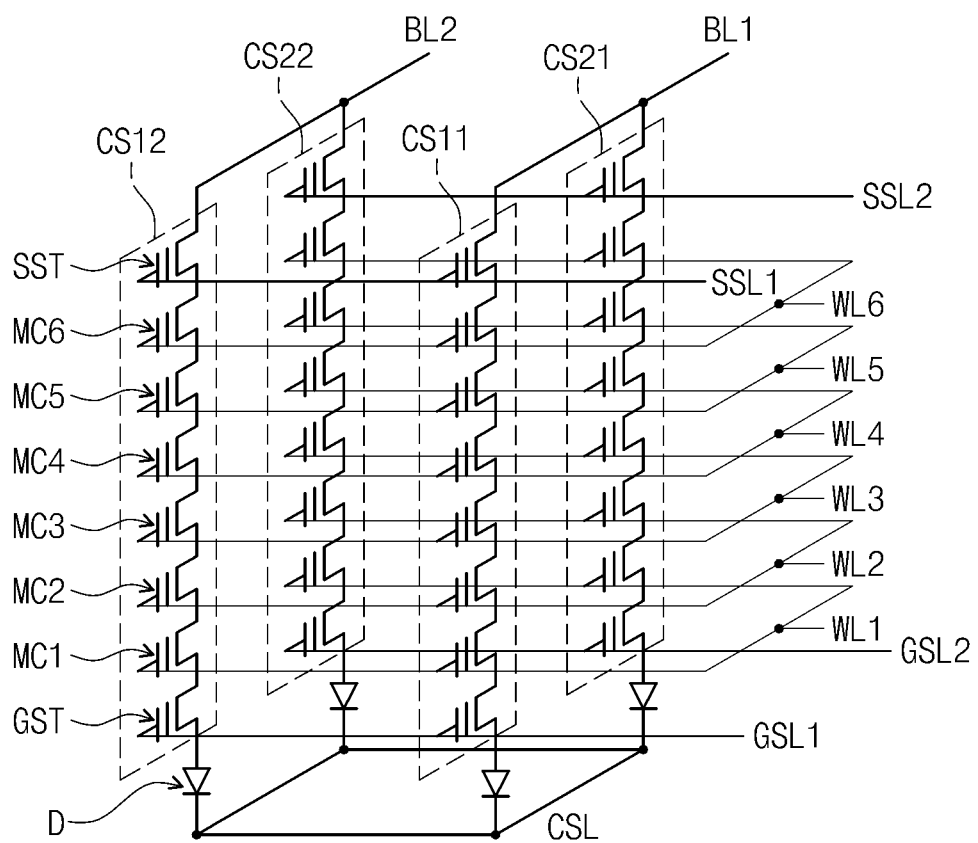
FIG. 53 is a circuit diagram illustrating an equivalent circuit of a portion EC of FIG. 47 according to an exemplary embodiment of the inventive concept.

FIG. 53 is a circuit diagram illustrating an equivalent circuit BLKf2 of a portion EC of FIG. 47 according to an exemplary embodiment of the inventive concept.

Referring to FIGS. 47 and 50 to 53, diodes D may be formed between cell strings CS11, CS12, CS21, and CS22 and a common source line CSL. Ground selection transistors GST may be connected with a plurality of ground selection lines GSL1 and GSL2. For example, ground selection transistors of the cell strings CS11 and CS12 may be connected with a first ground selection line GSL1, and ground selection transistors of the cell strings CS21 and CS22 may be connected with a second ground selection line GSL2.

The equivalent circuit BLKf2 may be applied like the above-described equivalent circuits BLKa2 to BLKa7 illustrated in FIGS. 26, 27, 28, 31, 32 and 33, respectively.

In the memory block BLKf2, an erase operation may be erased in the same method as described with reference to FIGS. 8 to 13, 20, 21, 23, and 24. In the memory block BLKf2, a pre-read operation may be made in the same method as described in FIGS. 16 and 17.

Figure 54:
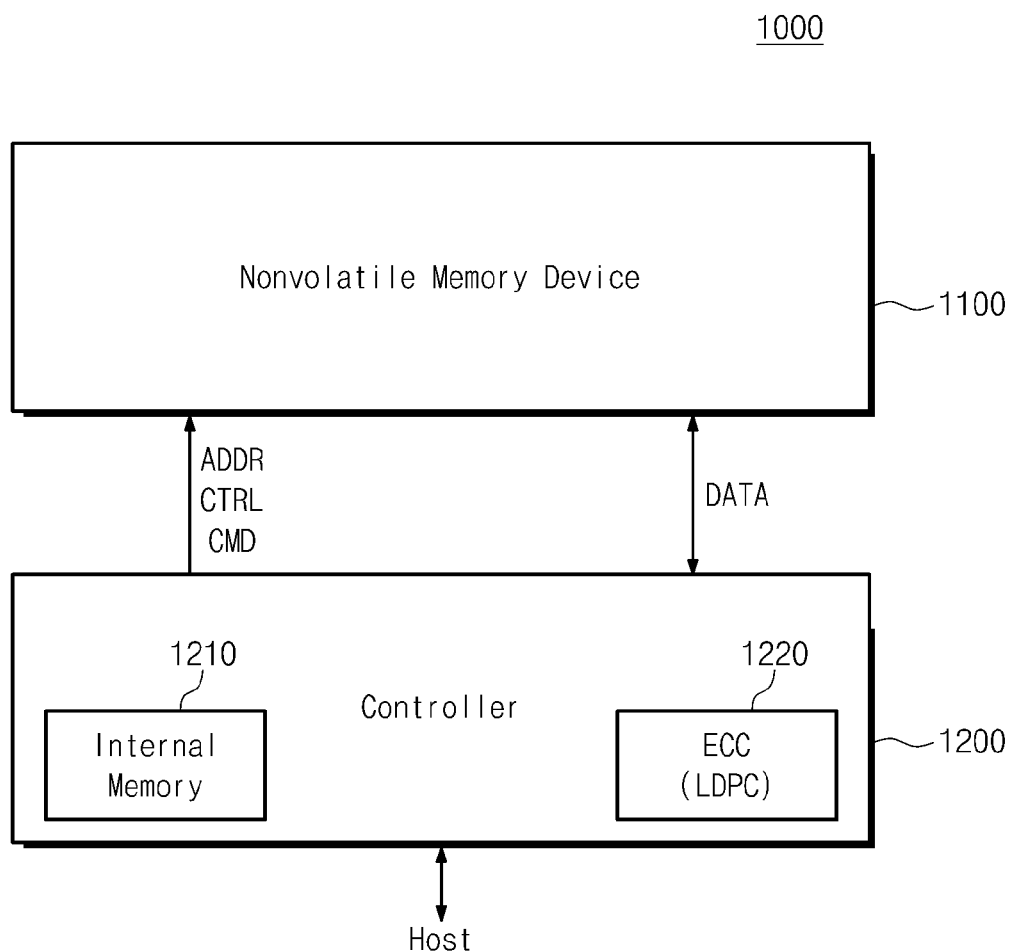
FIG. 54 is a block diagram illustrating a memory system according to an exemplary embodiment of the inventive concept.

FIG. 54 is a block diagram illustrating a memory system 1000 according to an exemplary embodiment of the inventive concept. Here, the memory system 1000 is illustrated as an electronic apparatus having at least one nonvolatile memory device. Referring to FIG. 54, the memory system 1000 may include a nonvolatile memory device 1100 and a controller 1200.

The nonvolatile memory device 1100 may be substantially identical to that of one of nonvolatile memory devices 100 to 500 illustrated in FIGS. 1, 15, 18, 19, and 22, respectively, according to exemplary embodiments of the inventive concept. That is, the nonvolatile memory device 1100 may include a plurality of cell strings CS11, CS12, CS21, and CS22 provided on a substrate 111, and each of the cell strings CS11, CS12, CS21, and CS22 may include a plurality of cell transistors CT stacked in a direction perpendicular to the substrate 111. The nonvolatile memory device 1100 may make an erase operation according to the above-described erase method. The nonvolatile memory device 1100 may perform a pre-read operation according to the above-described pre-read method.

The controller 1200 may be connected with a host (or an external host device) and the nonvolatile memory device 1100. In response to a request from the host, the controller 1200 may be configured to access the nonvolatile memory device 1100. For example, the controller 1200 may be configured to control read, write, erase, pre-read, and background operations of the nonvolatile memory device 1100. The controller 1200 may be configured to provide an interface between the nonvolatile memory device 1100 and the host. The controller 1200 may be configured to drive firmware to control the nonvolatile memory device 1100.

The controller 1200 may be configured to provide the nonvolatile memory device 1100 with a control signal CTRL, a command CMD, and an address ADDR. In response to the control signal CTRL, the command CMD, and the address ADDR provided from the controller 1200, the nonvolatile memory device may perform read, write, pre-read, and erase operations.

The controller 1200 may include an internal memory 1210 and an error correcting unit 1220. The internal memory 1210 may be a working memory of the controller 1200. The error correcting unit 1220 may encode data to be written in the nonvolatile memory device 1100. The error correcting unit 1220 may correct errors by decoding data read from the nonvolatile memory device 1100. The error correcting unit 1220 may correct errors using a Low Density Parity Check (LDPC) code. The error correcting unit 1220 can make error correction using a BCH (Bose Chaudhuri Hocquenghem) or RS (Reed Solomon) code. The first to third values V1 to V3 of the nonvolatile memory device 1100 may be determined according to the number of bits capable of be corrected by the error correcting unit 1220.

In an exemplary embodiment, the controller 1200 may further include constituent elements such as a processing unit, a host interface, and a memory interface. The processing unit may control an overall operation of the controller 1200.

The host interface may include a protocol to execute data exchange between the host and the controller 1200. The host interface may communicate with an external device (e.g., the host) via at least one of various protocols such as an USB (Universal Serial Bus) protocol, an MMC (multimedia card) protocol, a PCI (peripheral component interconnection) protocol, a PCI-E (PCI-express) protocol, an ATA (Advanced Technology Attachment) protocol, a Serial-ATA protocol, a Parallel-ATA protocol, a SCSI (small computer small interface) protocol, an ESDI (enhanced small disk interface) protocol, and an IDE (Integrated Drive Electronics) protocol. The memory interface may interface with the nonvolatile memory device 1100. The memory interface may include a NAND interface or a NOR interface.

The memory system 1000 may be used as computer, portable computer, Ultra Mobile PC (UMPC), workstation, netbook, PDA, web tablet, wireless phone, mobile phone, smart phone, contactless smart card, e-book, PMP (portable multimedia player), digital camera, digital audio recorder/player, digital picture/video recorder/player, portable game machine, navigation system, black box, 3-dimensional television, a device capable of transmitting and receiving information at a wireless circumstance, one of various electronic devices constituting home network, one of various electronic devices constituting computer network, one of various electronic devices constituting telematics network, RFID, or one of various electronic devices constituting a computing system.

The nonvolatile memory device 1100 or the memory system 1000 may be packed by various types of packages such as PoP (Package on Package), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

Figure 55:
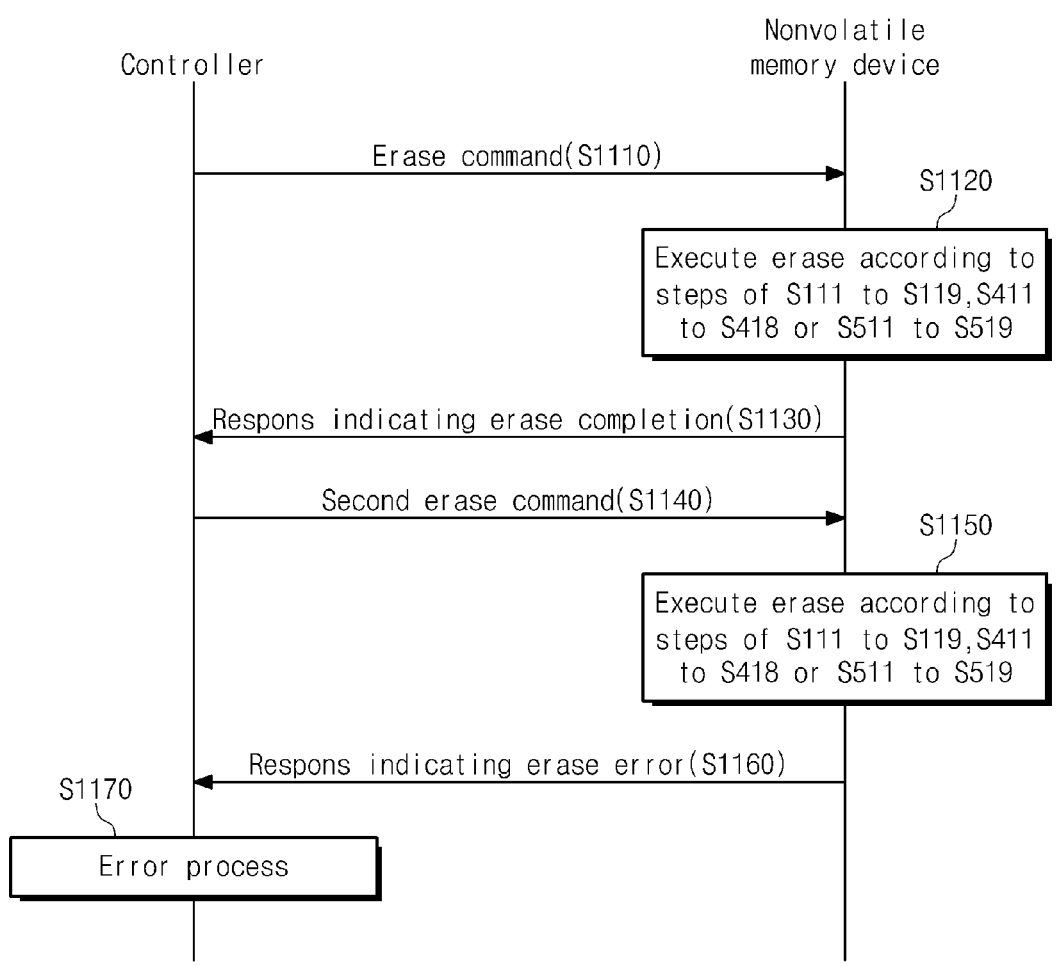
FIG. 55 is a flowchart illustrating an operating method of a memory system according to an exemplary embodiment of the inventive concept.

FIG. 55 is a flowchart illustrating an operating method of the memory system 1000 according to an exemplary embodiment of the inventive concept. Referring to FIGS. 54 and 55, in operation S1110, the controller 1200 may send an erase command to the nonvolatile memory device 1100. An address of an area to be erased may be sent with the erase command.

In operation S1120, the nonvolatile memory device 1100 may perform an erase operation according to one of erase methods according to an exemplary embodiment of the inventive concept. For example, as described with reference to FIGS. 8 and 13B, an erase operation of the nonvolatile memory device 1100 may be executed by performing a pre-read operation and setting one or more off strings to "erase pass." Alternatively, as described with reference to FIGS. 20 and 23, an erase operation of the nonvolatile memory device 1100 may be executed by comparing the number of fail strings with a reference value.

If an erase operation is ended, in operation S1130, the nonvolatile memory device 1100 may provide the controller 1200 with a response indicating that an erase operation is completed.

In operation S1140, the controller 1200 may send an erase command to the nonvolatile memory device 1100.

In operation S1150, the nonvolatile memory device 1100 may perform an erase operation according to one of erase methods described in FIGS. 8, 13B, and 20. Generation of errors at an erase operation may be determined when the number of off strings detected via a pre-read operation is over the first reference value V1 and/or when an erase operation is ended under the condition that the number of fail strings is over the second reference value V2 or the third reference value V3.

In the event that an error is generated at the erase operation, in operation S1160, the nonvolatile memory device 1100 may provide the controller 1200 with a response signal to indicate an erase error.

If a response signal to indicate an erase error is received, the controller 1200 may perform an error process operation. For example, the controller 1200 may determine a memory block including an erase error to be a bad block.

As described above, although one or more off strings exist in the nonvolatile memory device 1100, the controller 1200 may control the nonvolatile memory device 1100 so as to operate normally.

Figure 56:
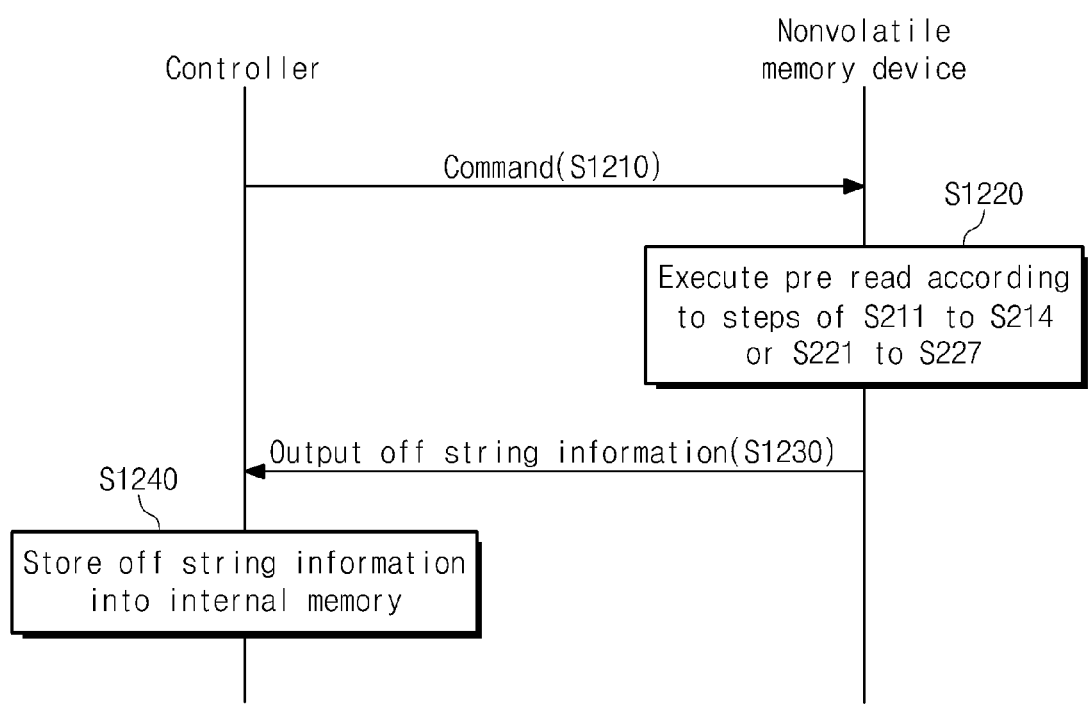
FIG. 56 is a flowchart illustrating an operating method of a memory system according to an exemplary embodiment of the inventive concept.

FIG. 56 is a flowchart illustrating an operating method of the memory system 1000 according to an exemplary embodiment of the inventive concept. In FIGS. 54 and 56, in operation S1210, the controller 1200 may send a command to the nonvolatile memory device 1100. The command may be a command different from a read, write, or erase command.

In operation S1220, the nonvolatile memory device 1100 may perform a pre-read operation according to one of pre-read methods according to an exemplary embodiment of the inventive concept. By the pre-read operation, the nonvolatile memory device 1100 may detect off string information. The off string information may include the number of off strings, a pre-read result, or both the number of off strings and a pre-read result. A type of off string information may be determined according to a command transferred in operation S1210.

In operation S1230, the nonvolatile memory device 1100 may output the off string information to the controller 1200.

In operation S1240, the controller 1200 may store the input off string information in the internal memory 1210. The controller 1200 may control the nonvolatile memory device 1100 using the off string information stored in the internal memory 1210.

In an exemplary embodiment, the off string information may be temporarily stored in the internal memory 1210. The off string information may be stored in the internal memory 1210 with a mapping table used to map logical addresses from a host onto physical addresses of the nonvolatile memory device 1100.

Figure 57:
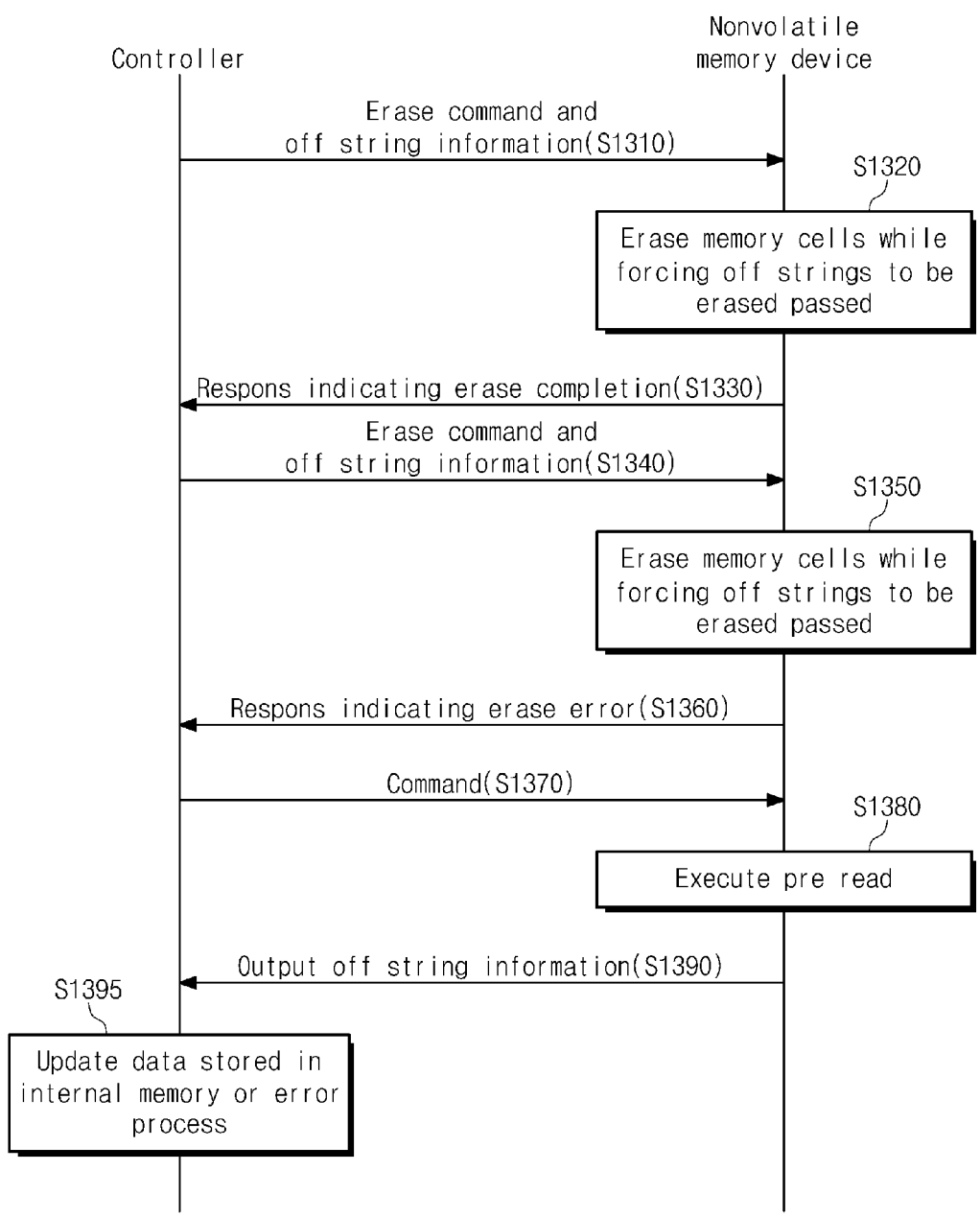
FIG. 57 is a flowchart illustrating an operating method of a memory system according to an exemplary embodiment of the inventive concept.

FIG. 57 is a flowchart illustrating an operating method of the memory system 1000 of FIG. 54. Referring to FIGS. 54 and 57, in operation S1310, the controller 1200 may send an erase command and off string information to the nonvolatile memory device 1100. An address indicating an area to be erased may be sent at the same time.

In operation S1320, one or more off strings may be determined to be erase passed, and memory cells may be erased. For example, the nonvolatile memory device 1100 may determine off strings to be "erase passed," as described with reference to operation S115 of FIG. 8, and memory cells may be erased. In an exemplary embodiment, operation S1320 may be executed under the condition that a pre-read operation of operations S113 and S114 is removed from an erase method of FIG. 8.

If an erase operation is completed, the nonvolatile memory device 1100 may provide the controller 1200 with a response signal to indicate erase completion.

In operation S1340, the controller 1200 may provide the nonvolatile memory device 1100 with an erase command and off string information. An address indicating an area to be erased may be sent at the same time.

In operation S1350, the nonvolatile memory device 1100 may determine off strings to be erase passed, and memory cells may be erased.

If an error is generated at an erase operation, a response indicating an erase error may be sent to the controller 1200 in operation S1360.

If a response signal to indicate an erase error is received, the controller 1200 may provide a command to the nonvolatile memory device 1100 in operation S1370. An address indicating an area where an erase error is generated may be sent at the same time.

In operation S1380, the nonvolatile memory device 110 may perform a pre-read operation in response to the input command. The nonvolatile memory device 1100 may detect off string information via the pre-read operation.

In operation S1390, the nonvolatile memory device 1100 may send the off string information to the controller 1200.

In operation S1395, the controller 1200 may update data stored in an internal memory or perform an error process, using the input off string information.

In an exemplary embodiment, off strings can be additionally generated due to deterioration of memory cells. In this case, an error may be generated at an erase operation. If off string information is updated via the pre-read operation executed when an erase error is generated, the nonvolatile memory device 1100 may operate normally regardless of additional generation of off strings.

In an exemplary embodiment, in the event that the number of off strings exceeds a correctable error bit number or an erase error is generated due to causes other than the off strings, the controller 1200 may perform an error process. For example, the controller 1200 may determine an erroneous memory block to be a bad block.

Figure 58:
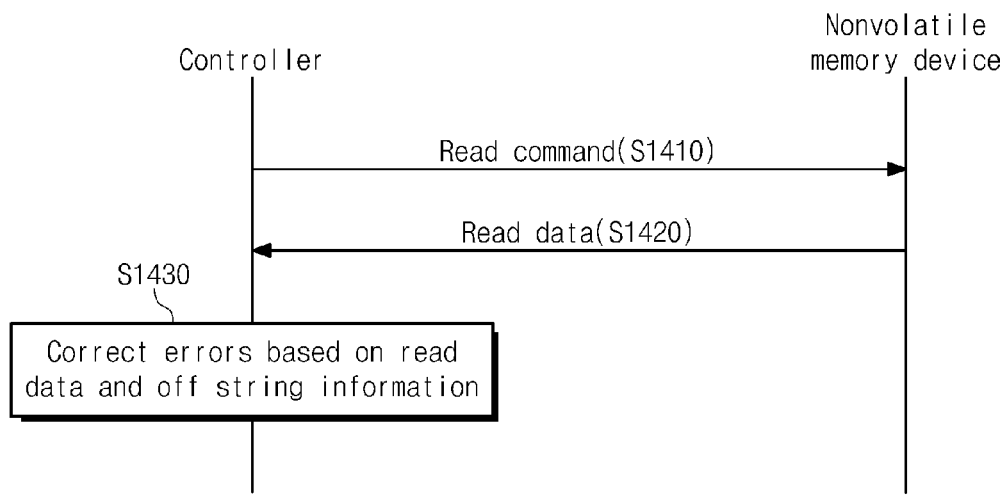
FIG. 58 is a flowchart illustrating an operating method of a memory system according to an exemplary embodiment of the inventive concept.

FIG. 58 is a flowchart illustrating an operating method of the memory system 1000 of FIG. 54. Referring to FIGS. 54 and 58, the controller 1200 may send a read command to the nonvolatile memory device 1100 in operation S1410. An address of an area to be read may be sent at the same time.

In operation S1420, the nonvolatile memory device 1100 may send read data to the controller 1200.

In operation S1430, the controller 1200 may correct an error of the read data using off string information. For example, the controller 1200 may detect a location of data corresponding to an off string among the read data using the off string information. Data corresponding to the off string may be error-possible data. It is possible to better the error correction efficiency or the error correction capacity of an error correcting unit 1220 of the controller 1200 by taking a location of error-possible data. In particular, in the event that the error correcting unit 1220 uses an LDPC, the error correction efficiency or the error correction capacity may be bettered.

Figure 59:
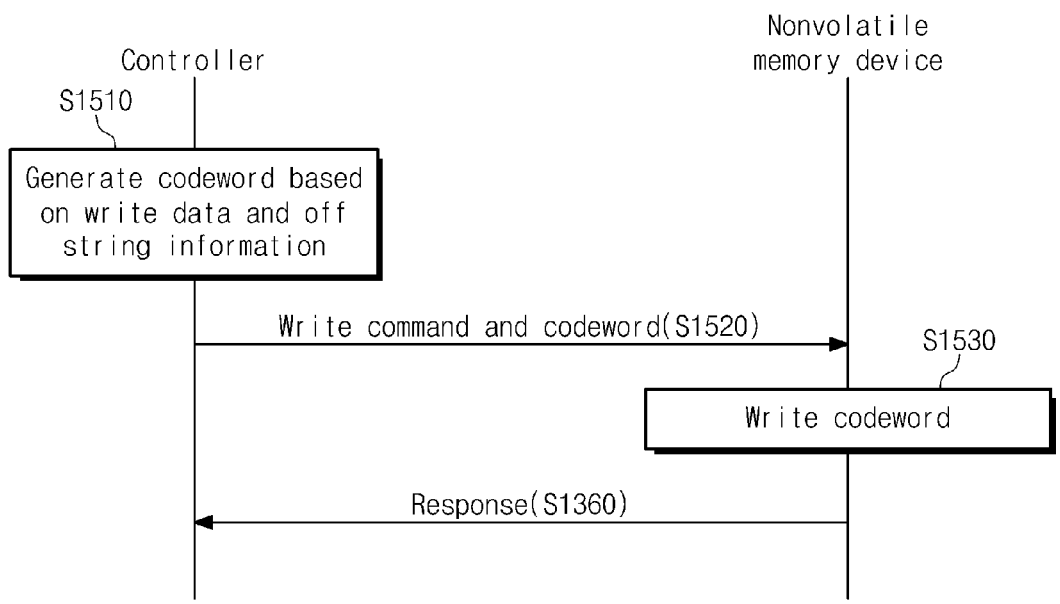
FIG. 59 is a flowchart illustrating an operating method of a memory system according to an exemplary embodiment of the inventive concept.

FIG. 59 is a flowchart illustrating an operating method of the memory system 1000 of FIG. 54. Referring to FIGS. 54 and 59, the controller 1200 may generate a code word using write data and off string information in operation S1510. In an exemplary embodiment, data corresponding to an off string may cause an error at a read operation. The controller 1200 may generate a code word such that error correction is made easily when data is read. The controller 1200 may map data corresponding to the off string onto data corresponding to a high threshold voltage.

In operation S1520, the controller 1200 may send the code word to the nonvolatile memory device 1100 with a write command.

In operation S1530, the nonvolatile memory device 1530 may write the input code word.

In operation S1540, the nonvolatile memory device 1100 may provide the controller 1200 with a response indicating write completion.

If a code word is generated according to locations of off strings, the error correction efficiency or the error correction capacity may be bettered when the code word is read.

Figure 60:
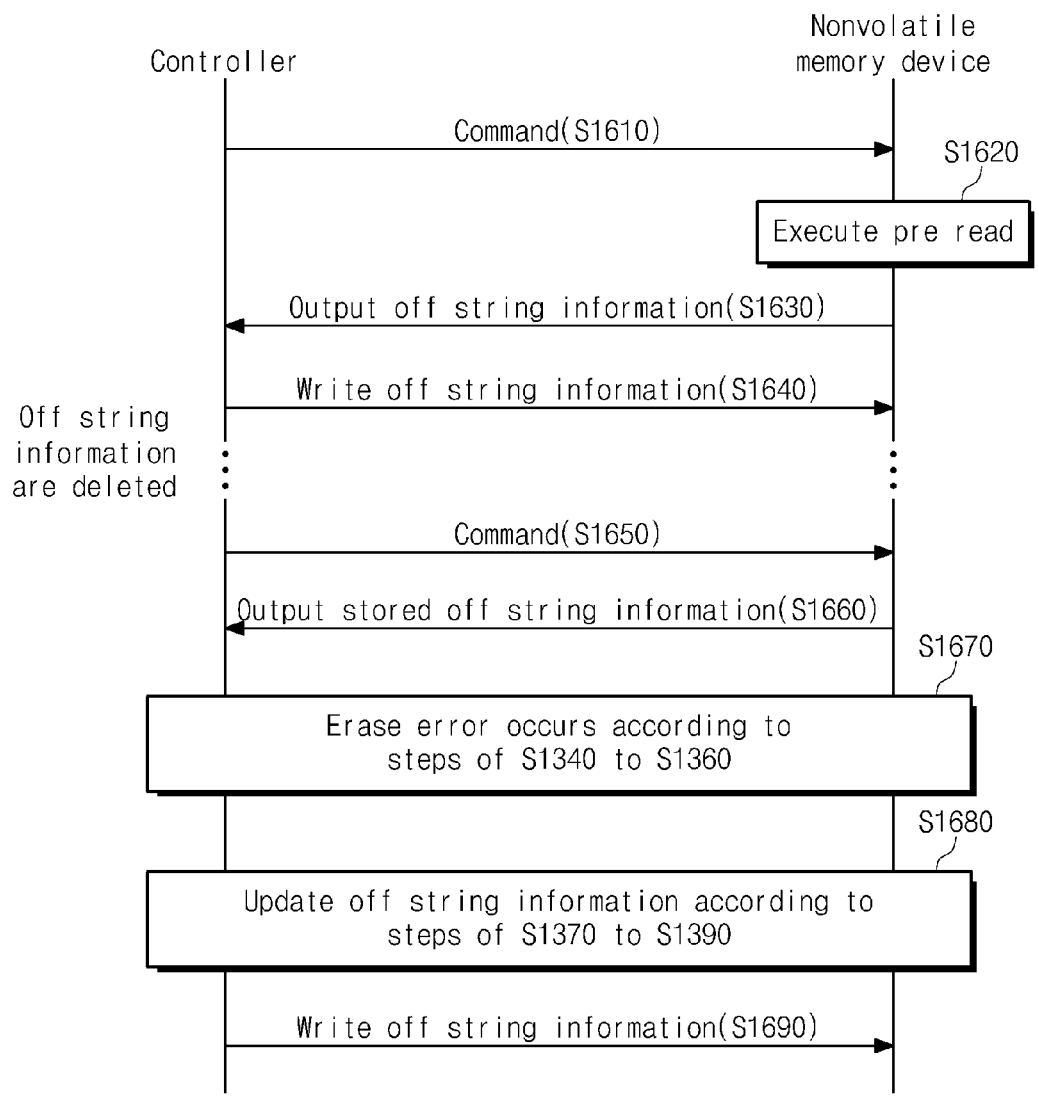
FIG. 60 is a flowchart illustrating an operating method of a memory system according to an exemplary embodiment of the inventive concept.

FIG. 60 is a flowchart illustrating an operating method of the memory system 1000 of FIG. 54. Referring to FIGS. 54 and 60, the controller 1200 may send a command to the nonvolatile memory device 1100 in operation 1610. An address indicating a specific area may be sent at the same time. When off string information is requested, the controller 1200 may send a command.

In operation S1620, the nonvolatile memory device 110 may perform a pre-read operation. Off string information may be detected via the pre-read operation.

In operation S1630, the nonvolatile memory device 1100 may provide the off string information to the controller 1200.

In operation S1640, the controller 1200 may write the input off string information in the nonvolatile memory device 1100. For example, memory blocks BLK1 to BLKz (refer to FIG. 2) of the nonvolatile memory device 1100 may be divided into a data area and a buffer area. User data may be stored in the data area. The buffer area may be used to store information associated with the data area or information associated with data written in the data area. The controller 1200 may control the nonvolatile memory device 1100 such that off string information is stored in the buffer area of the nonvolatile memory device 1100.

The controller 1200 may perform an additional operation using the off string information. For example, the controller 1200 may make reading, writing, or erasing using the off string information.

Afterwards, off string information stored in an internal memory 1210 of the controller 1200 may be deleted. When off string information is not requested, the controller 1200 may delete the off string information.

In operation S1650, the controller 1200 may send a command to the nonvolatile memory device 1100. For example, the controller 1200 may send a command when off string information of a specific area is required. The controller 1200 may send a command requesting off string information of a specific area to make reading, writing, or erasing on the specific area.

In operation S1660, the nonvolatile memory device 1100 may output off string information stored in the buffer area. The controller 1200 may perform operations such as reading, writing, erasing, etc. using the off string information.

In operation S1670, an erase error can be generated as described with reference to operations S1340 to S1360 of FIG. 57.

If an erase error is generated, off string information may be updated in operation S1680 as described with reference to steps S1370 to S1395 of FIG. 57.

If the off string information is updated, the controller 1200 may write the updated off string information in the buffer area of the nonvolatile memory device 1100.

Figure 61:
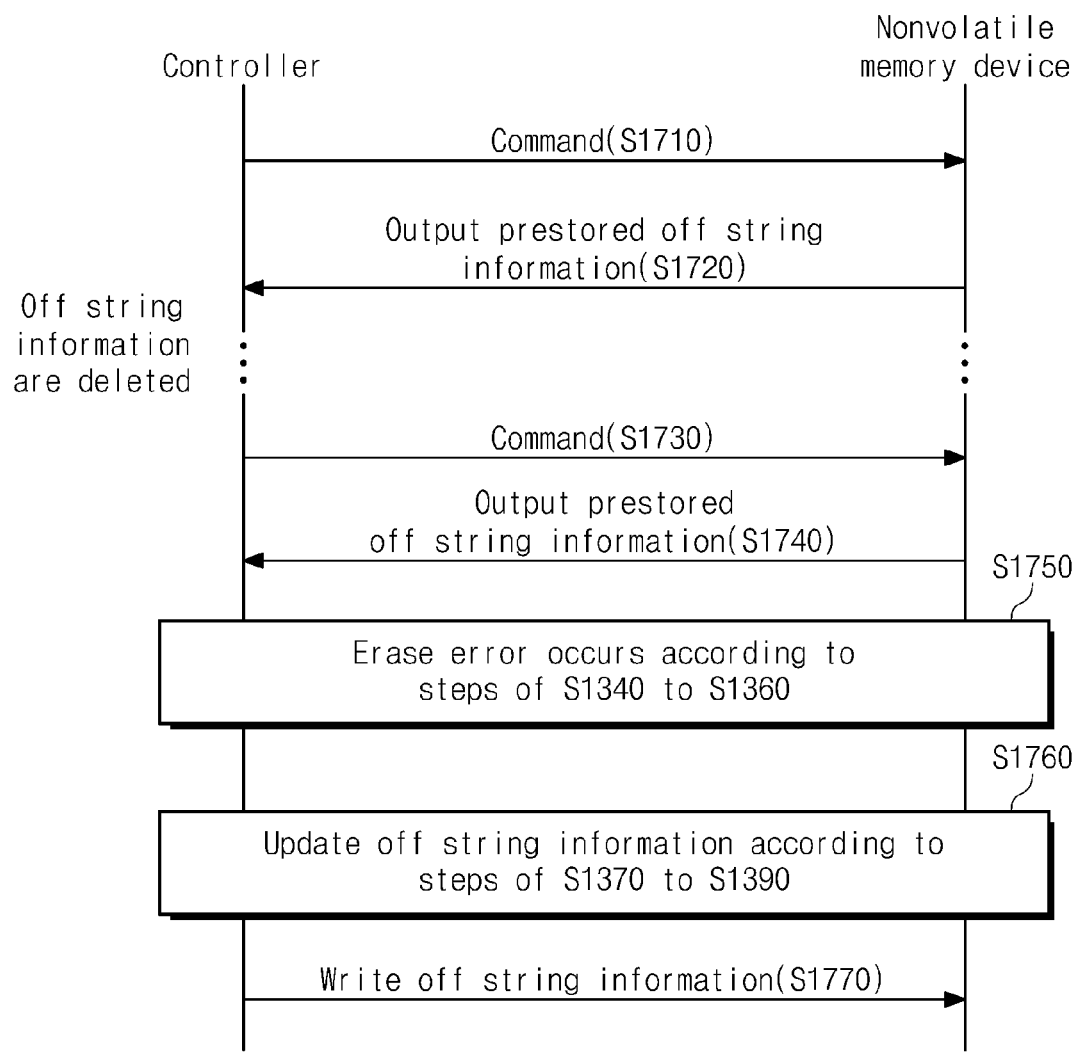
FIG. 61 is a flowchart illustrating an operating method of a memory system according to an exemplary embodiment of the inventive concept.

FIG. 61 is a flowchart illustrating an operating method of the memory system 1000 of FIG. 54. Referring to FIGS. 54 and 61, the controller 1200 may send a command to the nonvolatile memory device 1100 in operation S1710. An address indicating a specific area may be sent at the same time. When off string information is requested, the controller 1200 may send a command.

In operation S1720, the nonvolatile memory device 1100 may send previously stored off string information to the controller 1200. In an exemplary embodiment, the off string information may be detected at a test level of the nonvolatile memory device 1100 and may be stored in the nonvolatile memory device. The off string information may be stored in a buffer area of memory blocks BLK1 to BLKz of the nonvolatile memory device 1200.

The controller 1200 may perform an additional operation using the off string information. For example, the controller 1200 may make reading, writing, or erasing using the off string information.

Afterwards, off string information stored in an internal memory 1210 of the controller 1200 may be deleted. When off string information is not requested, the controller 1200 may delete the off string information.

In operations S1730 to S1770, if an erase error is generated, off string information may be updated, and the updated off string information may be written in the nonvolatile memory device 1100. Operation S1770 may be executed in the same way as operations S1650 to S1690 of FIG. 60.

The above embodiments are described under the condition that off string information generated from a nonvolatile memory device is output to a controller and off string information transferred from the controller is written in the nonvolatile memory device. However, off string information generated from the nonvolatile memory device may be directly written in the nonvolatile memory device under the control of the controller.

Figure 62:
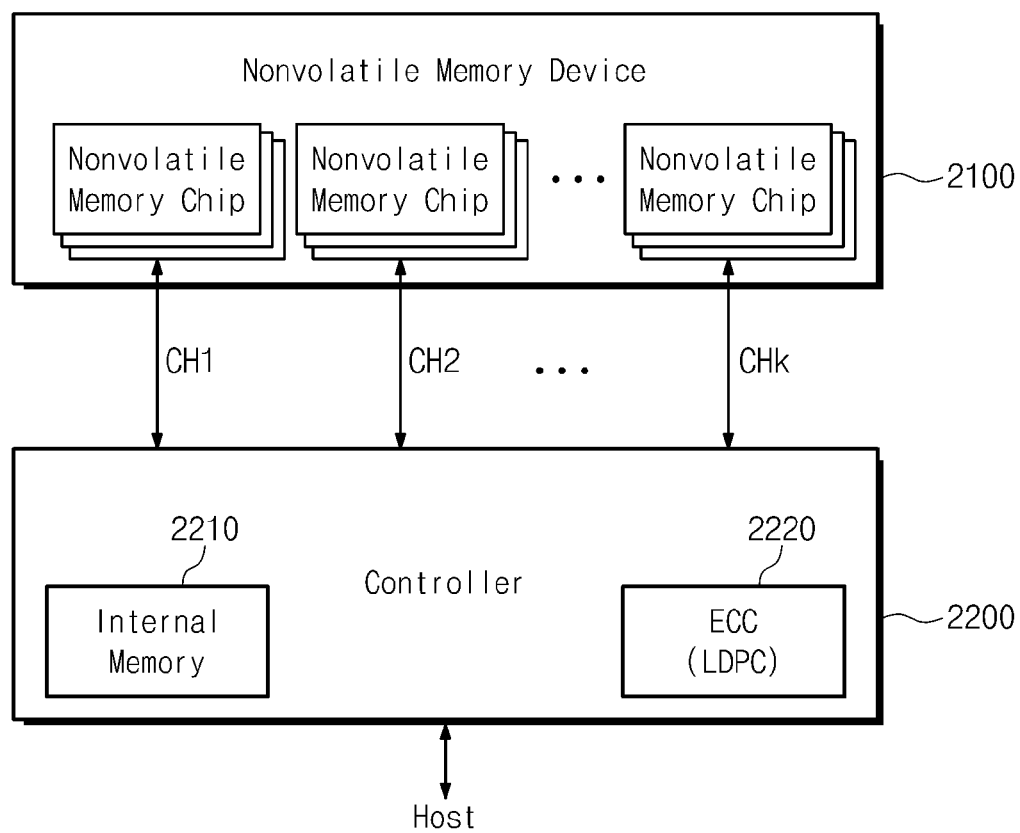
FIG. 62 is a block diagram illustrating a memory system according to an exemplary embodiment of the inventive concept.

FIG. 62 is a block diagram illustrating a memory system 2000 according to an exemplary embodiment of the present general inventive concept. Here, the memory system 2000 is illustrated as an electronic apparatus having at least one nonvolatile memory device. Referring to FIG. 62, the memory system 2000 may include a nonvolatile memory device 2100 and a controller 2200. The nonvolatile memory device 2100 may include a plurality of nonvolatile memory chips, which form a plurality of groups. Nonvolatile memory chips in each group may be configured to communicate with the controller 2200 via one common channel. In an exemplary embodiment, the plurality of nonvolatile memory chips may communicate with the controller 2200 via a plurality of channels CH1 to CHk.

Each of the nonvolatile memory chips may be substantially identical to that of one of nonvolatile memory devices 100 to 500 according to exemplary embodiments of the inventive concept. That is, the nonvolatile memory device 2100 may include a plurality of cell strings CS11, CS12, CS21, and CS22 provided on a substrate 111 thereof, and each of the cell strings CS11, CS12, CS21, and CS22 may include a plurality of cell transistors CT stacked in a direction perpendicular to the substrate 111. The nonvolatile memory device 2100 may perform an erase operation according to the above-described erase method. The nonvolatile memory device 2100 may perform a pre-read operation according to the above-described pre-read method.

As described with reference to FIGS. 54 to 61, the controller 2200 may perform various operations in response to off string information from the nonvolatile memory device 2100.

In FIG. 62, there is exemplarily described the case that one channel is connected with a plurality of nonvolatile memory chips. However, the memory system 2000 can be modified such that one channel is connected with one nonvolatile memory chip.

Figure 63:
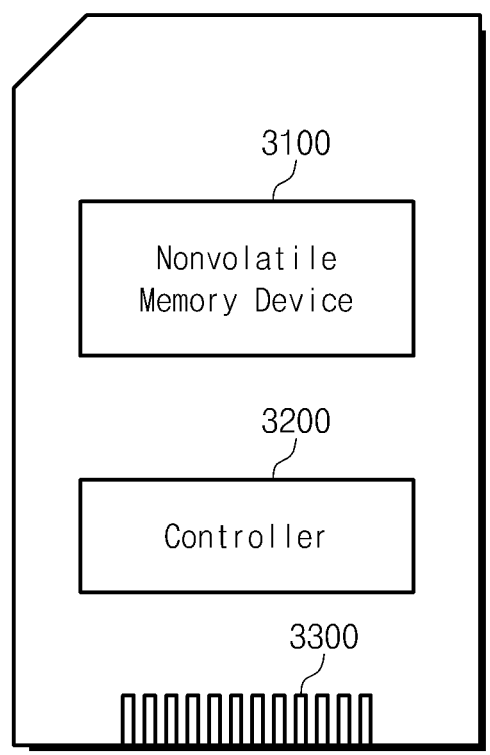
FIG. 63 is a diagram illustrating a memory card as an electronic apparatus having one of a nonvolatile memory device and a memory system according to an exemplary embodiment of the inventive concept.

FIG. 63 is a diagram illustrating a memory card 3000 according to an exemplary embodiment of the inventive concept. Here, the memory card 3000 is illustrated as an electronic apparatus having at least one nonvolatile memory device. Referring to FIG. 63, the memory card 3000 may include a nonvolatile memory device 3100, a controller 3200, and a connector 3300.

The nonvolatile memory device 3100 may be substantially identical to that of one of nonvolatile memory devices 100 to 500 illustrated in FIGS. 1, 15, 18, 19, and 22, respectively, according to an exemplary embodiment of the inventive concept. That is, the nonvolatile memory device 3100 may include a plurality of cell strings CS11, CS12, CS21, and CS22 provided on a substrate 111 thereof, and each of the cell strings CS11, CS12, CS21, and CS22 may include a plurality of cell transistors CT stacked in a direction perpendicular to the substrate 111. The nonvolatile memory device 3100 may make an erase operation according to the above-described erase method. The nonvolatile memory device 3100 may perform a pre-read operation according to the above-described pre-read method.

As described with reference to FIGS. 54 to 61, the controller 3200 may perform various operations using off string information provided from the nonvolatile memory device 3100.

The connector 3300 may electrically connect the memory card 3000 to a host to transmit or receive a signal corresponding to data, command, power, etc.

The memory card 3000 may be formed of memory cards such as a PC (PCMCIA) card, a CF card, an SM (or, SMC) card, a memory stick, a multimedia card (MMC, RS-MMC, MMCmicro), a security card (SD, miniSD, microSD, SDHC), a universal flash storage (UFS) device, and the like.

Figure 64:
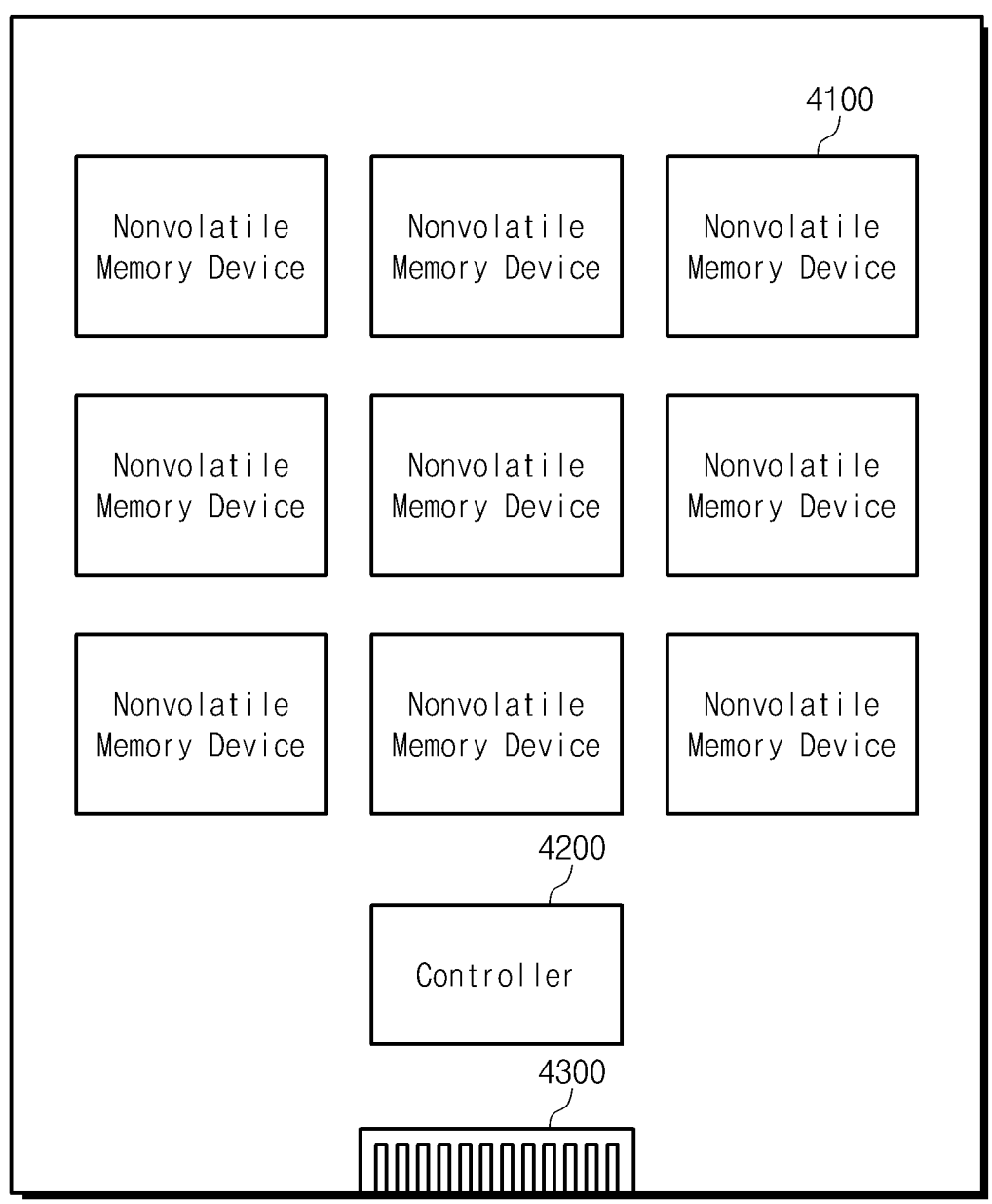
FIG. 64 is a diagram illustrating a solid state drive as an electronic apparatus having one of a nonvolatile memory device and a memory system according to an exemplary embodiment of the inventive concept.

FIG. 64 is a diagram illustrating a solid state drive 4000 according to an exemplary embodiment of the inventive concept. Here, the solid state drive (SSD) 4000 is illustrated as an electronic apparatus having at least one nonvolatile memory device. Referring to FIG. 64, the solid state drive 4000 may include a plurality of nonvolatile memory devices 4100, a controller 4200, and a connector 4300.

Each of the nonvolatile memory devices 4100 may be substantially identical to that of one of nonvolatile memory devices 100 to 500 illustrated in FIGS. 1, 15, 18, 19, and 22, respectively, according to exemplary embodiments of the inventive concept. That is, each of the nonvolatile memory devices 4100 may include a plurality of cell strings CS11, CS12, CS21, and CS22 provided on a substrate 111, and each of the cell strings CS11, CS12, CS21, and CS22 may include a plurality of cell transistors CT stacked in a direction perpendicular to the substrate 111. Each of the nonvolatile memory devices 4100 may make an erase operation according to the above-described erase method. Each of the nonvolatile memory devices 4100 may perform a pre-read operation according to the above-described pre-read method.

As described with reference to FIGS. 54 to 61, the controller 400 may perform various operations using off string information provided from the nonvolatile memory devices 4100.

The connector 4300 may electrically connect the solid state driver 4000 to a host to transmit or receive a signal corresponding to data, command, power, etc.

Figure 65:
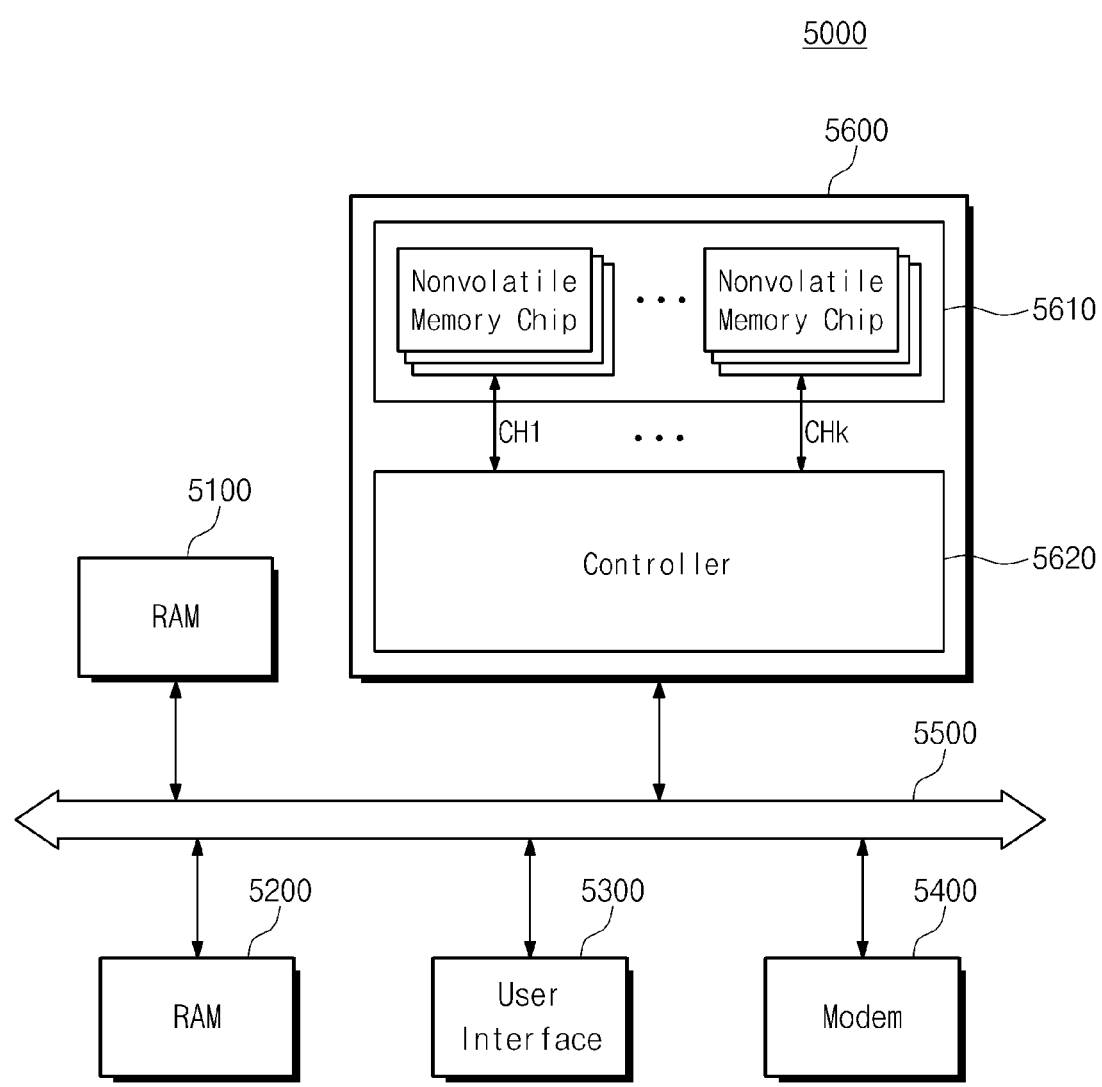
FIG. 65 is a block diagram illustrating a computing system as an electronic apparatus having one of a nonvolatile memory device and a memory system according to an exemplary embodiment of the inventive concept.

FIG. 65 is a block diagram illustrating a computing system 5000 according to an exemplary embodiment of the inventive concept. Here, the computing system 5000 is illustrated as an electronic apparatus having at least one nonvolatile memory device. Referring to FIG. 65, the computing system 5000 may include a central processing unit 5100, a RAM 5200, a user interface 5300, a modem 5400, and a memory system 5600.

The memory system 5600 may be electrically connected to the elements 5100 to 5400 via a system bus 5500. Data provided via the user interface 5300 or processed by the central processing unit 5100 may be stored in the memory system 5600.

The memory system 5600 may include a nonvolatile memory device 5610 and a controller 5620. The memory system 5600 may be formed of one of memory systems 1000 and 2000, a memory card 3000, and a solid state drive 4000 according to an exemplary embodiment of the inventive concept.

Figure 66:
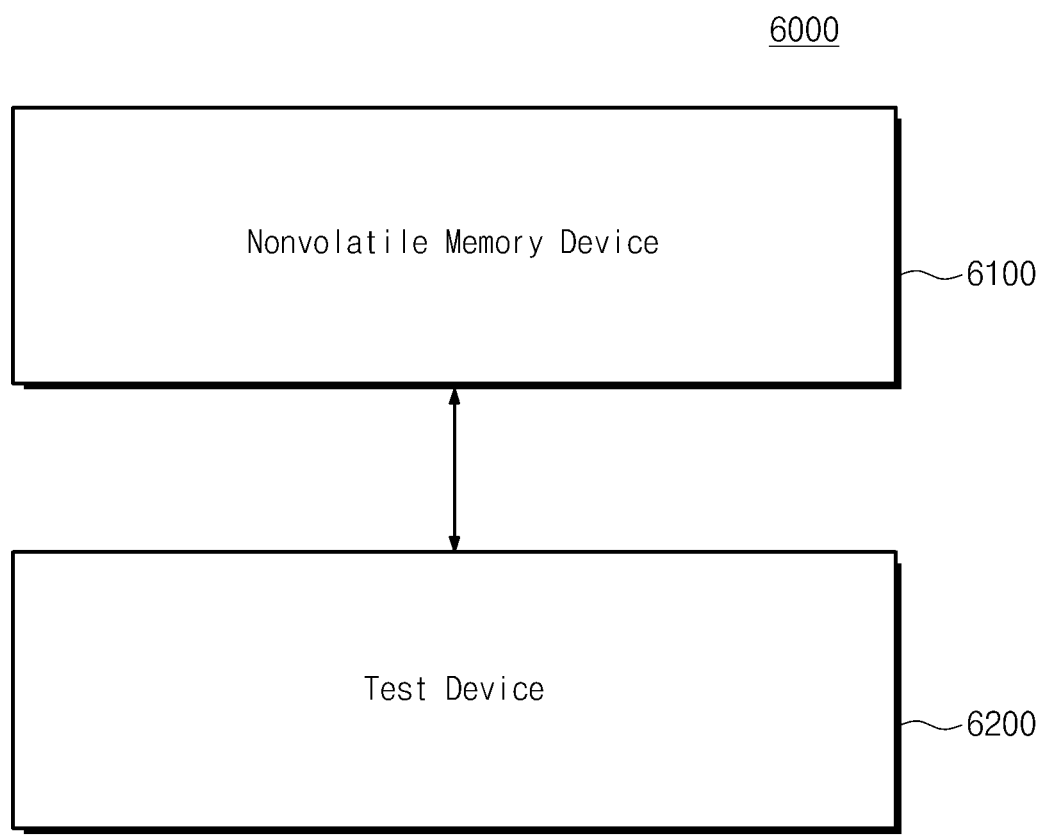
FIG. 66 is a block diagram illustrating a test system as an electronic apparatus having one of a nonvolatile memory device and a memory system according to an exemplary embodiment of the inventive concept.

FIG. 66 is a block diagram illustrating a test system 6000 according to an exemplary embodiment of the inventive concept. Here, the testing system 6000 is illustrated as an electronic apparatus having at least one nonvolatile memory device. Referring to FIG. 66, the test system 6000 may include a nonvolatile memory device 6100 and a test device 6200.

The nonvolatile memory device 6100 may be substantially identical to that of one of nonvolatile memory devices 100 to 500 illustrated in FIGS. 1, 15, 18, 19, and 22, respectively, according to an exemplary embodiment of the inventive concept. That is, the nonvolatile memory device 6100 may include a plurality of cell strings CS11, CS12, CS21, and CS22 provided on a substrate 111 thereof, and each of the cell strings CS11, CS12, CS21, and CS22 may include a plurality of cell transistors CT stacked in a direction perpendicular to the substrate 111. The nonvolatile memory device 6100 may make an erase operation according to the above-described erase method. The nonvolatile memory device 6100 may perform a pre-read operation according to the above-described pre-read method.

Figure 67:
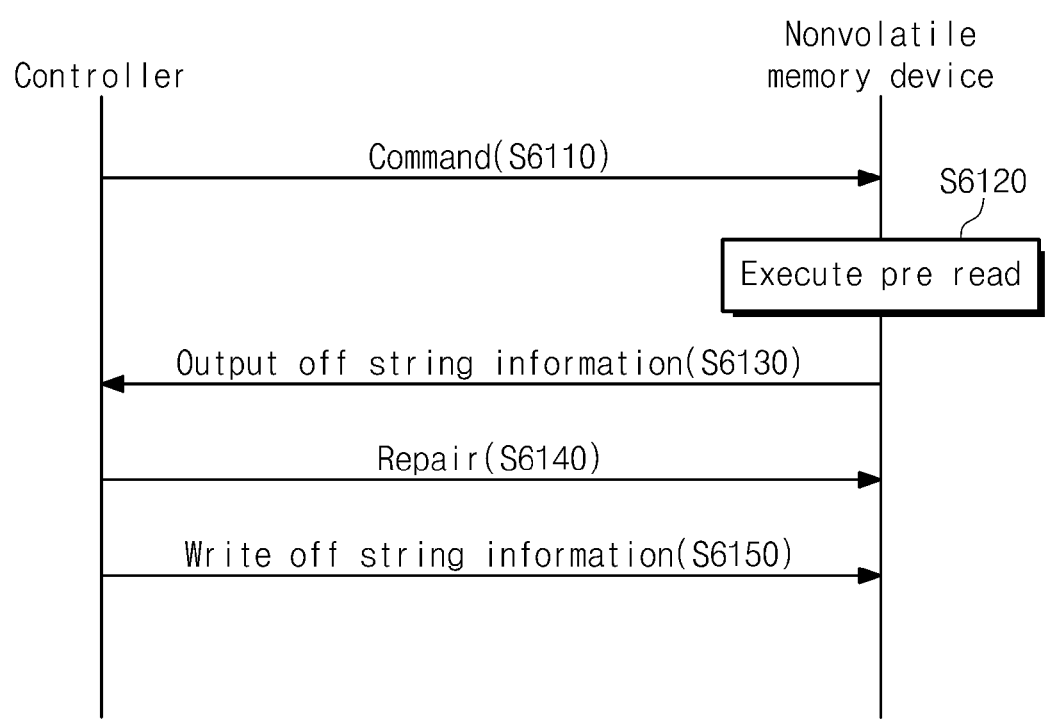
FIG. 67 is a flowchart illustrating a test method of a test system according to an exemplary embodiment of the inventive concept.

FIG. 67 is a flowchart illustrating a test method of the test system 6000 according to an exemplary embodiment of the inventive concept. Referring to FIGS. 66 and 67, the test device 6200 may send a command to the nonvolatile memory device 6100 in operation S6100.

In operation S6210, the nonvolatile memory device 6100 may perform a pre-read operation in response to a command. Off string information may be detected via the pre-read operation.

In operation S6130, the nonvolatile memory device 6100 may output the off string information to the test device 6200.

In operation S6140, the test device 6200 may perform a repair operation. For example, the test device 6200 may perform the repair operation based upon the off string information or other test data. For example, when the number of off strings in a specific memory block is over a predetermined reference value, the test device 6200 may repair the specific memory block. The repairing may include controlling fuses (laser fuses or electric fuses) of the nonvolatile memory device 6100, the controlling being made by the test device 6200.

In operation S6150, the test device 6200 may write the off string information in the nonvolatile memory device 6100. For example, the test device 6200 may write the off string information in buffer memory blocks of memory blocks BLK1 to BLKz (refer to FIG. 2) of the nonvolatile memory device 6100.

Data written in the nonvolatile memory device 6100 may be used to control the nonvolatile memory device 6100.

The above-described memory system or devices as an electronic apparatus may have a function unit to perform a function of the system or device. The function unit may be a video image unit to process data corresponding to an image to be displayed, an audio unit to process data corresponding to sound, an signal processing unit to process data to be transmitted or stored, etc.

The present general inventive concept can also be embodied as computer-readable codes on a computer-readable medium. The computer-readable medium can include a computer-readable recording medium and a computer-readable transmission medium. The computer-readable recording medium is any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices. The computer-readable recording medium can also be distributed over network coupled computer systems so that the computer-readable code is stored and executed in a distributed fashion. The computer-readable transmission medium can transmit carrier waves or signals (e.g., wired or wireless data transmission through the Internet). Also, functional programs, codes, and code segments to accomplish the present general inventive concept can be easily construed by programmers skilled in the art to which the present general inventive concept pertains.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. An erase method of a nonvolatile memory device, the erase method comprising:
   supplying an erase voltage to a plurality of memory cells;
   performing a read operation with a read voltage to word lines of the plurality of memory cells; and
   performing an erase verification operation with an erase verification voltage to at least one of the word lines of the plurality of memory cells, the erase verification voltage lower than the read voltage, wherein
   the plurality of memory cells comprises at least one dummy cell and one or more regular memory cells, and
   the at least one dummy cell is supplied with a voltage different from an operating voltage, which is supplied to the regular memory cells, in the reading operation and the erase verification operation.

2. The erase method of claim 1, wherein the read voltage comprises one or more levels of voltages to be applied to the respective word lines.

3. The erase method of claim 1, wherein the read voltage comprises a single level of a voltage to be applied to the word lines.

4. The erase method of claim 1, wherein:
   the erase verification voltage is variable with respect to a corresponding one of the word lines of the plurality of memory cells; and
   the variable erase verification voltage is lower than the read voltage.

5. The erase method of claim 1, wherein the read voltage is higher than a voltage of a threshold voltage of a program state of the plurality of memory cells.

6. An erase method of a nonvolatile memory device, the erase method comprising:
   supplying an erase voltage to a plurality of strings each having a plurality of memory cells;
   performing a read operation with a read voltage to word lines of the plurality of memory cells;
   determining one or more strings as an off strung string according to the performed read operation;
   processing an erase verification pass on the off string; and performing an erase verification operation with an erase verification voltage to word lines of the plurality of strings.

7. The erase method of claim 6, further comprising:
supplying a modified erase voltage to the plurality of strings according to the performed erase verification operation.

8. The erase method of claim 7, wherein:
the plurality of memory cells are determined as an off string and a non off string according to the read operation; and
the erase verification operation includes preventing a bit-line pre-charging operation from being performed on the off string.

9. The erase method of claim 6, further comprising:
supplying different voltages to bit lines of the off string and the non off string as pre-charging voltage; and
supplying the erase verification voltage to the respective word lines of the plurality of memory cells in the erase verification operation.

10. The erase method of claim 6, wherein:
the plurality of memory cells comprises at least one dummy cell and one or more regular memory cells; and
the at least one dummy cell is supplied with a voltage different from an operating voltage which is supplied to the regular memory cells, in the reading operation and the erase verification operation.

11. A memory system comprising:
a nonvolatile memory device comprising a memory cell array having a substrate and a plurality of strings each having a plurality of memory cells, the plurality of strings formed on the substrate in a direction perpendicular to the substrate; and
a controller to generate a command to perform an erase operation on the nonvolatile memory device, such that the nonvolatile memory device:
erases the plurality of strings;
performs a read operation with a read voltage to word lines of the plurality of memory cells;
determines one or more strings as an off string according to the performed read operation;
processes an erase verification pass on the off string; and
performs an erase verification operation with an erase verification voltage to word lines of the plurality of strings, the erase verification voltage lower than the read voltage.

12. The memory system of claim 11, wherein the strings are spaced apart from each other by a gap in which a channel film unit is formed to connect the memory cells of the string, and the channel film unit has a defect to cause the off string.

13. The memory system of claim 12, wherein the nonvolatile memory device comprises a channel film unit connected to the adjacent strings, and the off string is formed with the channel film unit which has no electrical contact with the substrate.

14. The memory system of claim 12, wherein the nonvolatile memory device comprises a drain and a channel film unit connected to the string, and the off string is formed with the channel film unit which has no electrical contact with the substrate.

15. The memory system of claim 11, wherein the nonvolatile memory device prevents the erase verification operation from performing on the off string of the first determination.

* * * * *